United States Patent
Nakasaki et al.

(10) Patent No.: US 8,415,736 B2
(45) Date of Patent: Apr. 9, 2013

(54) NON-VOLATILE SEMICONDUCTOR MEMORY DEVICE AND METHOD OF MANUFACTURING THE SAME

(75) Inventors: Yasushi Nakasaki, Yokohama (JP); Koichi Muraoka, Sagamihara (JP); Naoki Yasuda, Yokohama (JP); Shoko Kikuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/527,813

(22) Filed: Jun. 20, 2012

(65) Prior Publication Data

US 2012/0256249 A1    Oct. 11, 2012

Related U.S. Application Data

(62) Division of application No. 13/194,099, filed on Jul. 29, 2011, now Pat. No. 8,217,444, which is a division of application No. 12/212,128, filed on Sep. 17, 2008, now Pat. No. 8,013,380.

(30) Foreign Application Priority Data

Sep. 25, 2007    (JP) ................. 2007-248024

(51) Int. Cl.
*H01L 29/788*    (2006.01)

(52) U.S. Cl. .............. 257/316; 257/324; 257/E29.3; 257/E29.309

(58) Field of Classification Search ......... 257/316, 257/324, E29.3, E29.309
See application file for complete search history.

(56) References Cited

U.S. PATENT DOCUMENTS

| | | | |
|---|---|---|---|
| 7,655,971 B2 | 2/2010 | Ino et al. | |
| 7,999,303 B2 | 8/2011 | Kikuchi et al. | |
| 8,013,380 B2 | 9/2011 | Nakasaki et al. | |
| 2005/0006696 A1 | 1/2005 | Noguchi et al. | |
| 2008/0116507 A1 | 5/2008 | Ino et al. | |
| 2011/0284944 A1 | 11/2011 | Nakasaki et al. | |

FOREIGN PATENT DOCUMENTS

| | | |
|---|---|---|
| JP | 2003-68897 | 3/2003 |
| JP | 2003-282746 | 10/2003 |
| JP | 2004-55969 | 2/2004 |
| JP | 2004-158810 | 6/2004 |
| JP | 2004-363329 | 12/2004 |
| JP | 2005-5715 | 1/2005 |
| JP | 2005-328029 | 11/2005 |

(Continued)

OTHER PUBLICATIONS

Y. Saito, et al., "Characterization of non-volatile memory using a thin aluminosilicate film as a charge trapping layer", The Japanese Society of Applied Physics, No. 2, 2006, Extended Abstracts (the 67th Autumn Meeting, 2006), p. 723, 31a-P10-17.

(Continued)

*Primary Examiner* — Zandra Smith
*Assistant Examiner* — Marvin Payen
(74) *Attorney, Agent, or Firm* — Oblon, Spivak, McClelland, Maier & Neustadt, L.L.P.

(57) ABSTRACT

A MONOS type non-volatile semiconductor memory device which is capable of electrically writing, erasing, reading and retaining data, the memory device including source/drain regions, a first gate insulating layer, a first charge trapping layer formed on the first gate insulating layer, a second gate insulating layer formed on the first charge trapping layer, and a controlling electrode formed on the second gate insulating layer. The first charge trapping layer includes an insulating film containing Al and O as major elements and having a defect pair formed of a complex of an interstitial O atom and a tetravalent cationic atom substituting for an Al atom, the insulating film also having electron unoccupied levels within the range of 2 eV-6 eV as measured from the valence band maximum of $Al_2O_3$.

16 Claims, 24 Drawing Sheets

Direction of column    Direction of row

FOREIGN PATENT DOCUMENTS

JP  2006-312895  11/2006

OTHER PUBLICATIONS

T. Nakagawa, et al., "Charge Trapping Characteristics of Two—layered Al2O3/SiO2 Stack for Non-volatile Memory Device", Materials Research Society, 2006, Abstract No. G1.3., 2 pages.

Katsuyuki Matsunaga, et al., "First-principles study of defect energitics in titanium-doped alumina", Physical Review B, vol. 68, 2003, pp. 214102-1 to 214102-8.

Katsuyuki Matsunaga, et al., "First-principles calculations of intrinsic defects in $Al_2O_3$", Physical Review B, vol. 68, 2003, pp. 085110-1 to 085110-9.

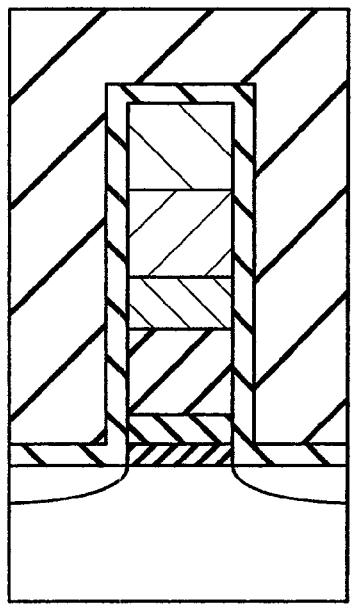
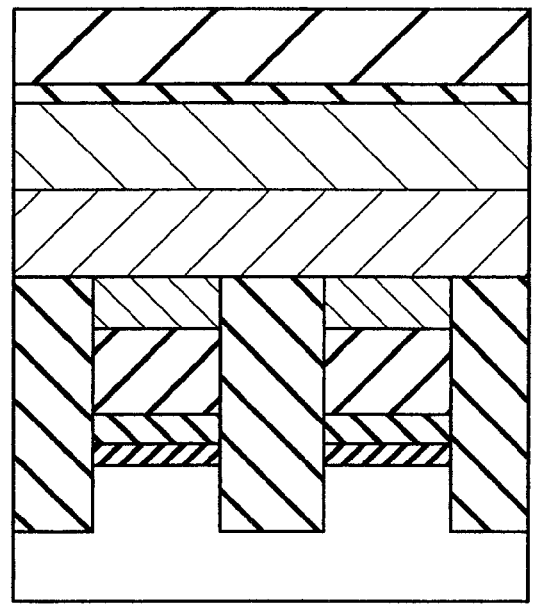
Direction of column　　　Direction of row
F I G. 1 A　　F I G. 1 B
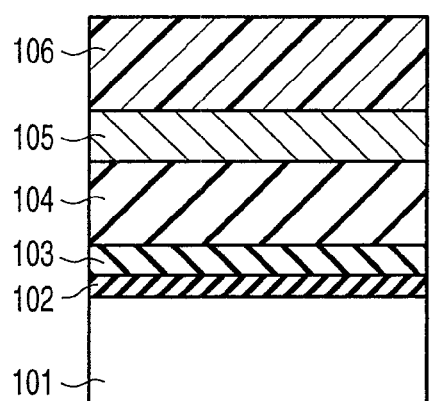
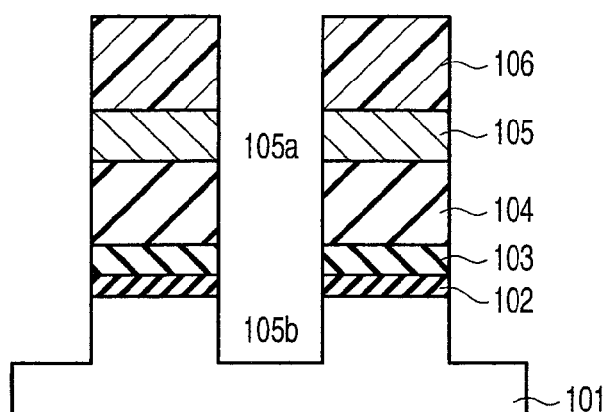
Direction of column　　　Direction of row
F I G. 2 A　　F I G. 2 B

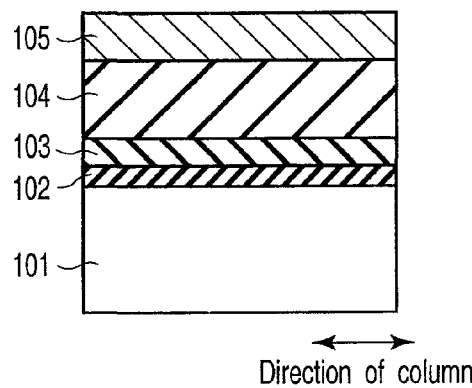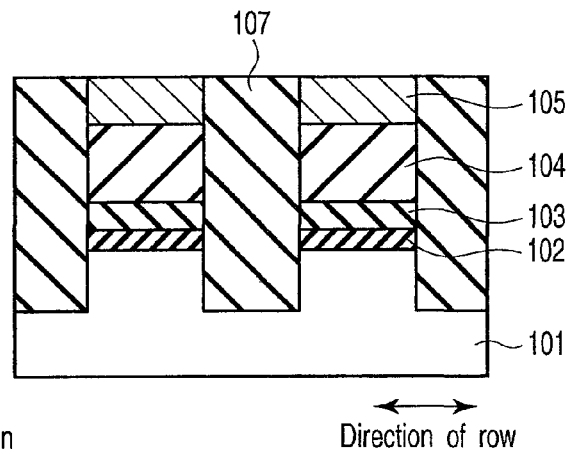
F I G. 3 A    F I G. 3 B
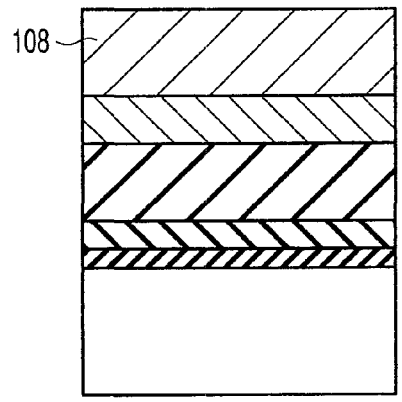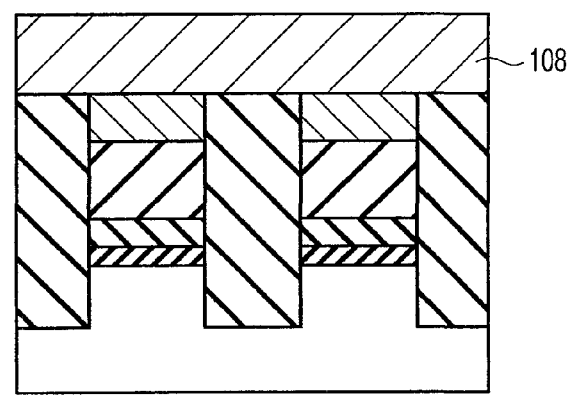
F I G. 4 A    F I G. 4 B

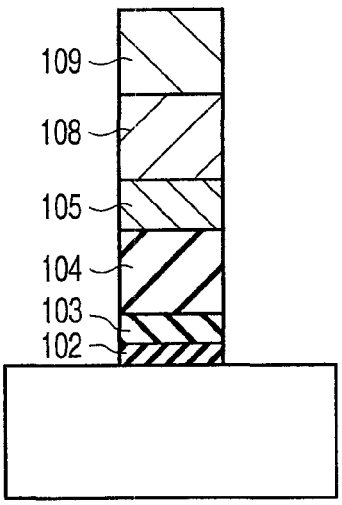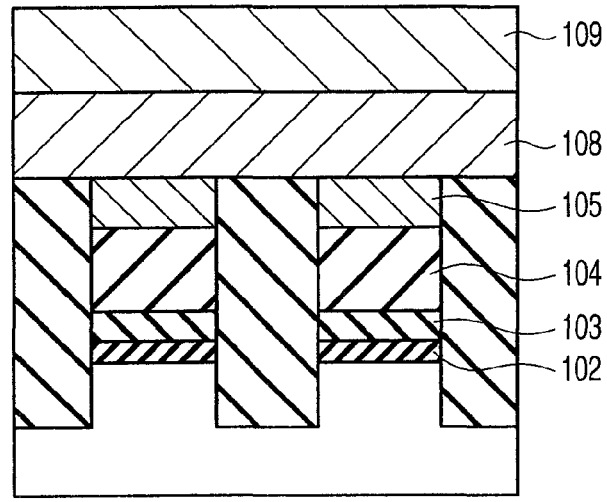
FIG. 5A  FIG. 5B
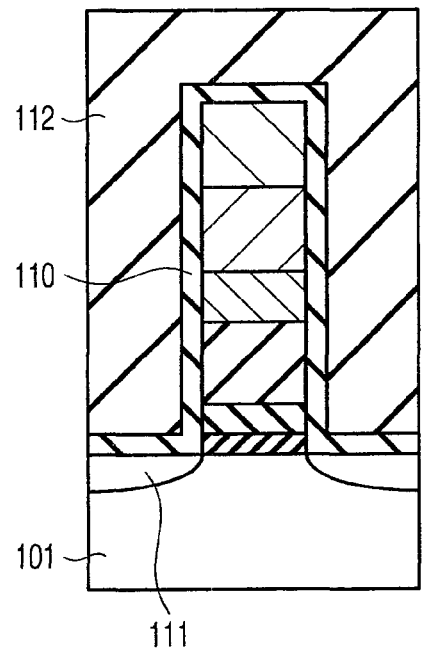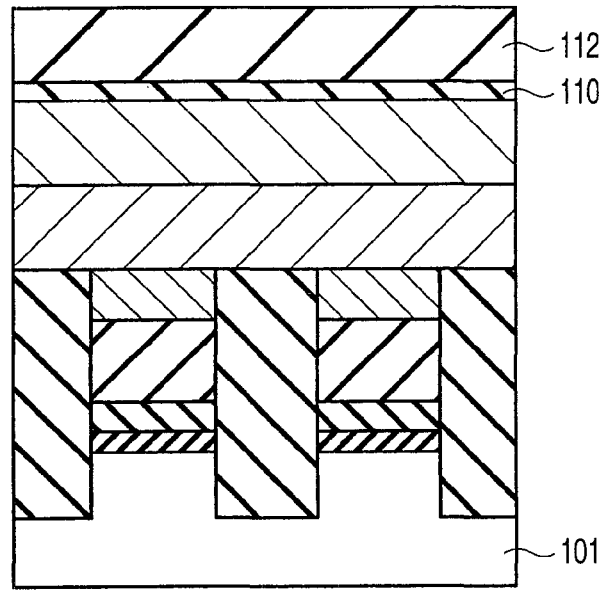
FIG. 6A  FIG. 6B

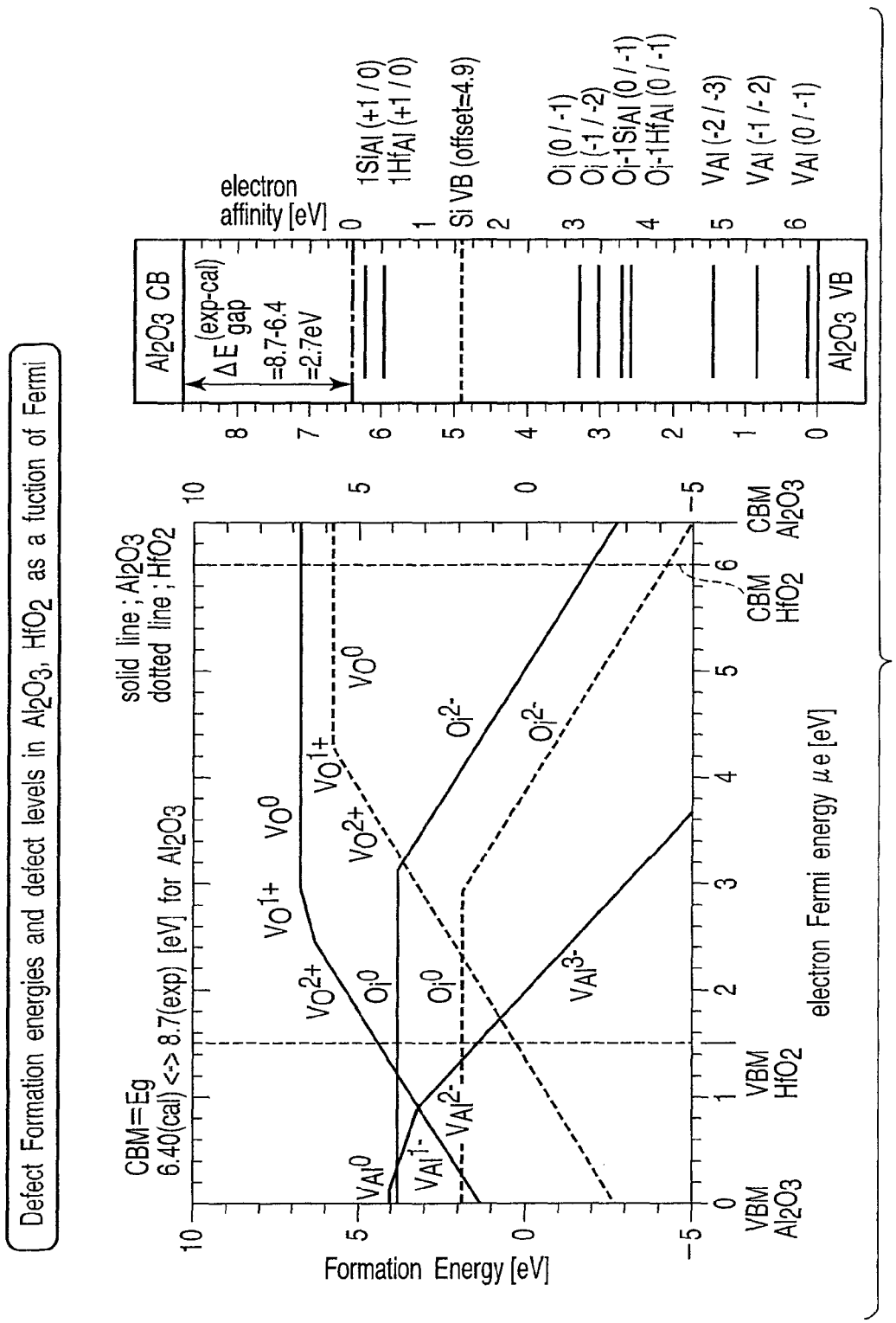
F I G. 8

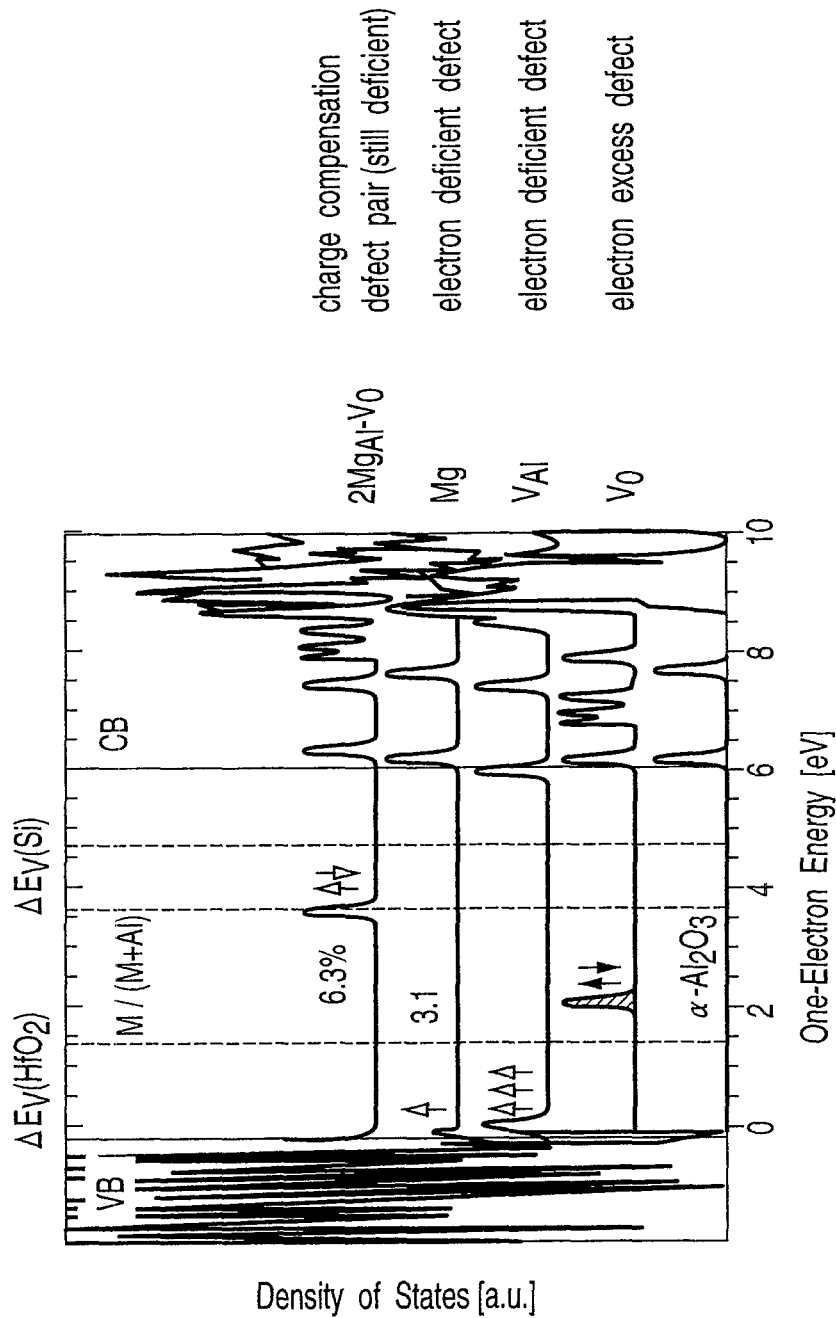
F I G. 10 B

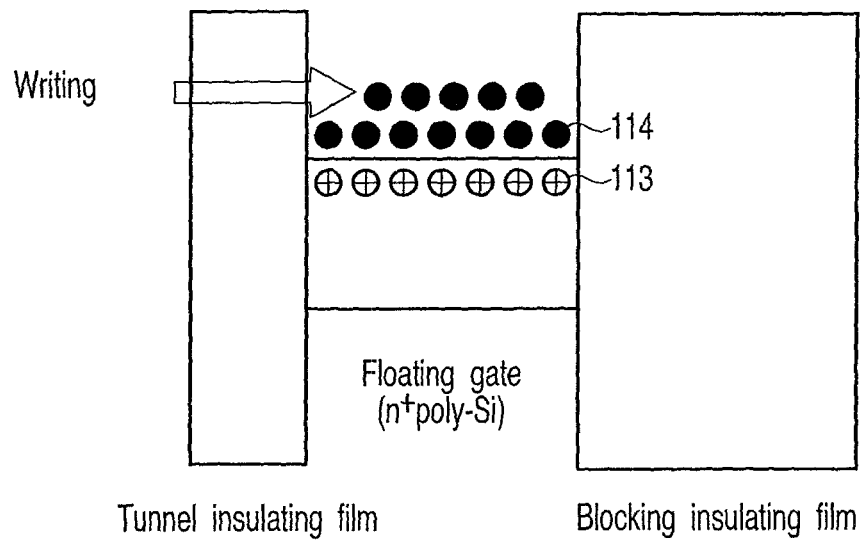
F I G. 1 3
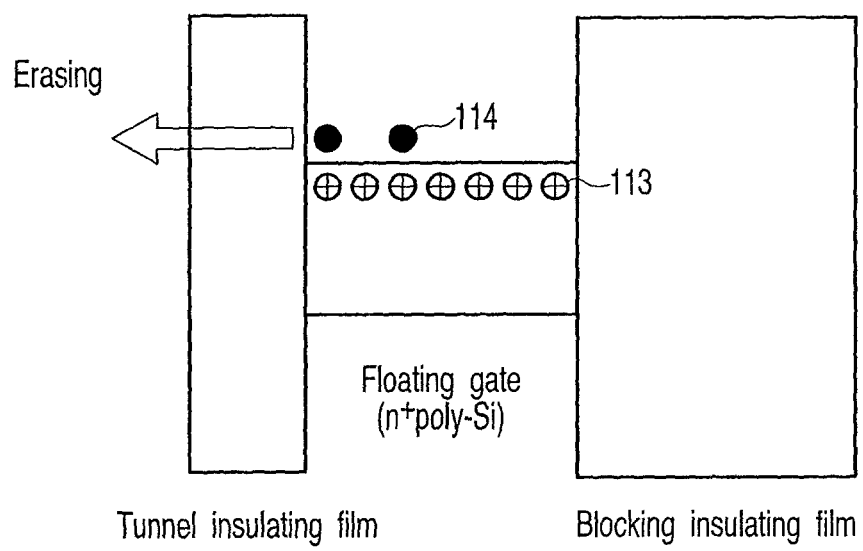
F I G. 1 4

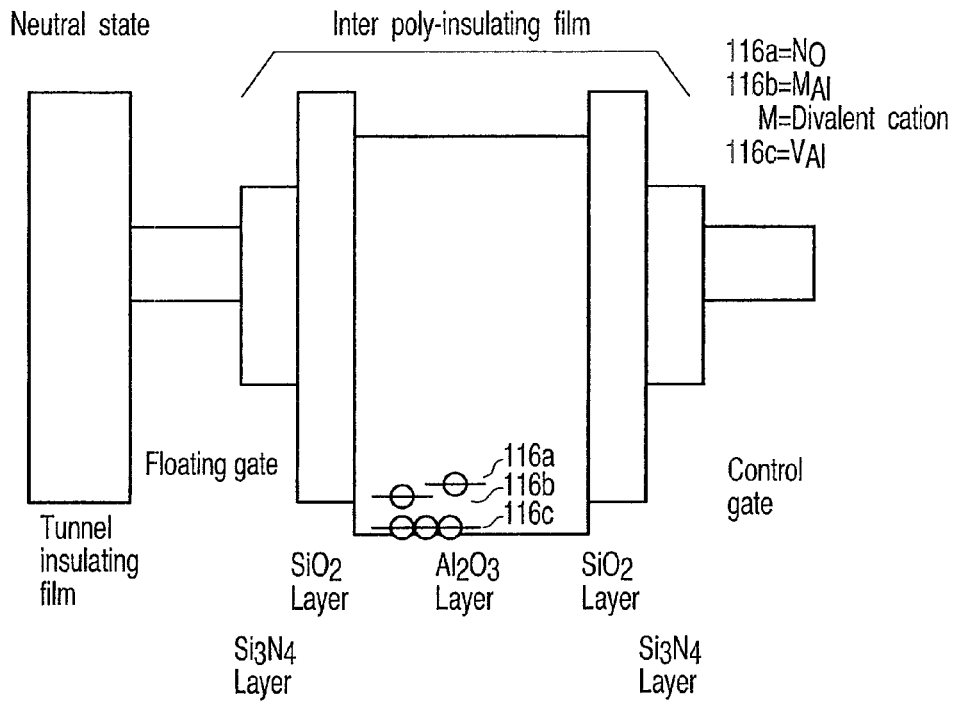
F I G. 21
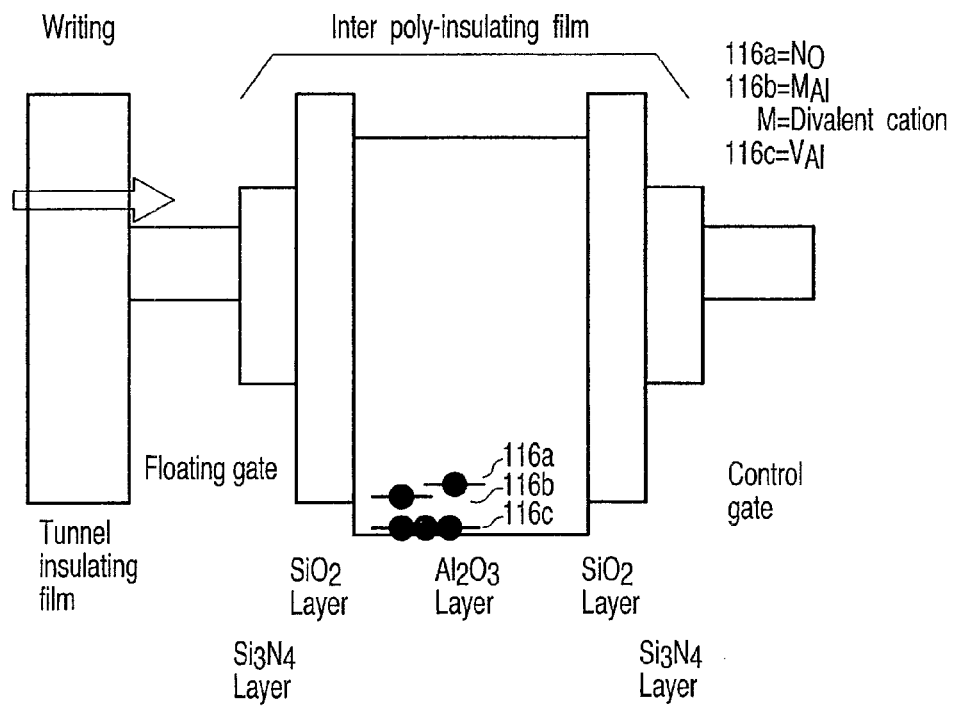
F I G. 22

NON-VOLATILE SEMICONDUCTOR MEMORY DEVICE AND METHOD OF MANUFACTURING THE SAME

CROSS-REFERENCE TO RELATED APPLICATIONS

This application is a divisional application claiming benefit to U.S. application Ser. No. 13/194,099, which was a divisional application of U.S. application Ser. No. 12/212,128, filed on Sep. 17, 2008, and is based upon and claims the benefit of priority from prior Japanese Patent Application No. 2007-248024, filed Sep. 25, 2007, the entire contents of each of which are incorporated herein by reference.

BACKGROUND OF THE INVENTION

1. Field of the Invention

The present invention relates to a non-volatile semiconductor memory device and a method of manufacturing the same.

2. Description of the Related Art

A NAND type flash memory having a floating gate is now confronted with a problem that the structure of memory cell (cell transistor) has to be changed because of the generation of interference between the neighboring cells and the difficulty in embedding an insulating film between the neighboring cells, owing to the persistent trend to further increase the fineness of a cell pattern.

A memory cell having a charge trapping layer consisting of an insulating film is considered as the most prospective as a structure of a memory cell of the next generation wherein the gate length is in the order of 20 nm. The memory cell of this sort is generally called a Metal/Oxide film/Nitride film/Oxide film/Semiconductor (MONOS). This MONOS memory cell is configured to have a gate stack structure, which is formed on a channel between source/drain diffusion regions formed in a surface region of a Si substrate, and is constituted by a tunnel insulating film for passing a writing/erasing charge, a silicon nitride film functioning as a charge trapping layer, a silicon oxide film functioning as an insulating film which is capable of obstructing electric current, and a gate electrode formed on the silicon oxide film and made of a metal. This MONOS memory cell is constructed as a planar cell, thereby overcoming the aforementioned problem with which the conventional floating gate type NAND flash memory has been troubled.

In this MONOS memory cell or in the conventional floating gate type memory cell, the employment of an alumina-based high-dielectric constant film is now studied in order to inhibit a high field leak current by increasing the film thickness of the block insulating film and by decreasing the effective electric field by enabling a portion of the block insulating film to trap electrons or in order to inhibit the inter-cell interference by decreasing EOT through the thinning of the film thickness of the charge trapping layer by increasing the trapping density of the charge trapping layer.

The MONOS memory cell, however, is still accompanied with many problems to be solved in terms of performance, such as the magnitude of variation of threshold voltage (hereinafter referred to simply as Vth), write/erase endurance and data retention characteristics. In addition to these problems, the MONOS memory cell is also accompanied with a problem that the threshold voltage thereof employed on the occasions of writing and erasing does not adapted to threshold voltage which is required when the MONOS memory cell is utilized as a NAND type flash memory which is suited for use as a memory of high density.

As a matter of fact, in the case of the NAND type flash memory, the threshold voltage after the writing operation is required to be Vth>0 and the threshold voltage after the erasing operation is required to be Vth<0. Whereas, in the case of the NOR type flash memory, the threshold voltage after the writing as well as after the erasing is generally required to be Vth>0. Even in the case of the MONOS memory device having most excellent in performance now, it cannot secure a sufficiently large negative Vth as a threshold voltage after the erasing, even though the Vth after the writing can be sufficiently increased. Thus, it cannot realize so-called over-erasing of charge.

Accordingly, even though the MONOS memory device can be easily applied to the NOR type flash memory, there is still a problem of the adjustment of threshold voltage if the MONOS memory device is to be applied to the NAND type flash memory.

Although it is of course conceivable, for the adjustment of the threshold voltage, to adopt a method wherein the dopant impurity concentration in the channel region of a Si substrate is adjusted, it will lead to a prominent increase in short channel effects as the fineness of memory cell is further advanced, thereby necessitating the raising of the neutral threshold voltage (the initial threshold voltage before writing/erasing) in order to suppress the short channel effects. On the other hand, as described above, since there is an increasing trend to lower the neutral threshold voltage in the operation of the NAND type flash memory, the aforementioned method goes against this trend to lower the neutral threshold voltage as there are persistent requirements to further enhance the fineness of the memory cell, thus indicating that the aforementioned problem cannot be solved simply through the adjustment of dopant impurity concentration in the channel region.

In addition to these problems, the MONOS memory cell is also required to exhibit so-called field relaxation effects. Namely, a plurality of block layers are laminated so as to provide a layer for accumulating a negative (fixed) charge in the block layers, thereby relaxing the electric field at the interfaces of the opposite ends of the block insulating films on the occasion of a writing/erasing operation (especially, on the occasion of an erasing operation) of the memory cell. As a result of the field relaxation effects, the generation of leakage current from a controlling electrode can be minimized, thus realizing high-speed erasing. One example of doping boron in a case where a silicon nitride film is employed is described in JP-A 2004-363329. This patent document discloses in detail about the theoretical background for realizing high-speed erasing through the relaxation of electric field.

Other than the aforementioned requirements, it is of course required to create a design prescription for the material itself for building up electron trap levels which are suited for the trap (writing) or detrapping (erasing) or retention of charge which is most important as a charge trapping layer.

As described above, in the case where an alumina-based insulating film is employed, there is a problem that there is no clear design prescription for the material for building up deep electron trap levels (for relaxing electric field) which are suited for the block insulating film, for building up defect levels having the depth which is suited for both writing/erasing required for the charge trapping layer (for efficient writing/erasing/retention characteristics), or for building up electron occupied levels which are capable of adjusting the threshold by way of over-erasing which is applicable to the NAND type flash memory (over-erasing directivity).

BRIEF SUMMARY OF THE INVENTION

An object of the present invention is to provide a semiconductor memory device which is capable of adjusting the electron-trapping/detrapping properties in conformity with an object aimed at by the reforming of an insulating film, i.e. by the build-up of desired defect levels in the insulating film, thereby making it possible to cope with the relaxation of electric field, the efficient writing/erasing/retention operations of charge, and the over-erasing of charge, respectively.

Another object of the present invention is to provide a method of manufacturing such a semiconductor memory device as described above.

According to a first aspect of the present invention, there is provided a MONOS type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a first charge trapping layer formed on the first gate insulating layer, including an insulating film containing Al and O as major elements and having a defect pair formed as a complex of an interstitial O atom and a tetravalent cationic atom substituting for an Al atom, or a defect pair formed as a complex of an oxygen vacancy and N atom(s) substituting for an O atom, the insulating film also having electron unoccupied levels within a range of 2 eV-6 eV from a valence band maximum of $Al_2O_3$; a second gate insulating layer formed on the first charge trapping layer and having a larger film thickness than that of the first gate insulating layer; and a controlling electrode formed on the second gate insulating layer.

According to a second aspect of the present invention, there is provided a floating gate type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a floating gate electrode functioning as a first charge trapping layer and formed on the first gate insulating layer; a second gate insulating layer including a first silicon nitride film formed on the first charge trapping layer and a first silicon oxide film formed on the first silicon nitride film; a second charge trapping layer formed on the second gate insulating layer, including an insulating film containing Al and O as major elements and having a defect pair formed as a complex of an interstitial O atom and a tetravalent cationic atom substituting for an Al atom, or a defect pair formed as a complex of an oxygen vacancy and an N atom(s) substituting for an O atom, the insulating film also having electron unoccupied levels within a range of 2 eV-6 eV from a valence band maximum of $Al_2O_3$; a third gate insulating layer including a second silicon oxide film formed on the second charge trapping layer and a second silicon nitride film formed on the second silicon oxide film; and a controlling electrode formed on the third gate insulating layer.

According to a third aspect of the present invention, there is provided a MONOS type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a first charge trapping layer formed on the first gate insulating layer; a second gate insulating layer formed on the first charge trapping layer, having a larger film thickness than that of the first gate insulating layer, and including an insulating film containing Al and O as major elements, the insulating film containing, in a region of the second gate insulating layer which is located near the first charge trapping layer, Al vacancy, interstitial O atom, N atom substituting for O atom, or divalent cationic atom substituting for Al atom, and having electron unoccupied levels within a range of 2 eV from a valence band maximum of $Al_2O_3$; and a controlling electrode formed on the second gate insulating layer.

According to a fourth aspect of the present invention, there is provided a MONOS type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a first charge trapping layer formed on the first gate insulating layer; a second gate insulating layer formed on the first charge trapping layer, having a larger film thickness than that of the first gate insulating layer, and including an insulating film containing Al and O as major elements, the insulating film comprising a first insulating film, a second insulating film formed on the first insulating film and functioning as a second charge trapping layer, and a third insulating film formed on the second insulating film and having a larger thickness than that of the first gate insulating layer, the second insulating film contains Al and O as major elements and having Al vacancy, interstitial O atom, N atom substituting for O atom, or divalent cationic atom substituting for Al atom, the second insulating film also having electron unoccupied levels within a range of 2 eV from a valence band maximum of $Al_2O_3$; and a controlling electrode formed on the second gate insulating layer.

According to a fifth aspect of the present invention, there is provided a floating gate type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a floating gate electrode functioning as a first charge trapping layer and formed on the first gate insulating layer; a second gate insulating layer including a first silicon nitride film formed on the first charge trapping layer and a first silicon oxide film formed on the first silicon nitride film; a second charge trapping layer formed on the second gate insulating layer, and including an insulating film containing Al and O as major elements, the insulating film having Al vacancy, interstitial O atom, N atom substituting for O atom, or divalent cationic atom substituting for Al atom, the insulating film also having electron unoccupied levels within a range of 2 eV from a valence band maximum of $Al_2O_3$; a third gate insulating layer including a second silicon oxide film formed on the second charge trapping layer and a second silicon nitride film formed on the second silicon oxide film; and a controlling electrode formed on the third gate insulating layer.

According to a sixth aspect of the present invention, there is provided a MONOS type non-volatile semiconductor memory device which is capable of electrically writing, erasing, reading and retaining data, the memory device comprising: source/drain regions formed in a semiconductor substrate; a first gate insulating layer formed on a channel region located between the source/drain regions; a first charge trapping layer formed on the first gate insulating layer, and including an insulating film containing Al and O as major elements and having a tetravalent cationic atom substituting for an Al atom, a pentavalent cationic atom substituting for an Al atom, interstitial trivalent cation atom, interstitial tetravalent cation atom, interstitial pentavalent cation atom, or oxygen vacancy, the insulating film also having electron occupied levels in the band gap of $Al_2O_3$; a second gate insulating layer formed on the first charge trapping layer and having a larger film thickness than that of the first gate insulating layer; and a controlling electrode formed on the second gate insulating layer.

According to a seventh aspect of the present invention, there is provided a method of manufacturing the non-volatile semiconductor memory device which is set forth in the aforementioned first or second aspect of the present invention, the method comprising forming the insulating film containing Al and O as major elements by oxidizing an insulating film containing Al, O and tetravalent cationic atoms under an Al-oxidizing condition neighboring on an Al-oxidation-reduction boundary condition and under around tetravalent cationic atom-oxidation-reduction boundary condition, thereby creating a vacancy pair formed as a complex of an interstitial O atom and tetravalent cationic atom substituting for an Al atom.

According to an eighth aspect of the present invention, there is provided a method of manufacturing the non-volatile semiconductor memory device which is set forth in one of the aforementioned third to fifth aspects of the present invention, the method comprising forming the insulating film containing Al and O as major elements by a process including mixing a source gas for the insulating film with an atom selected from the group consisting of He, Ne, Ar, Kr and Xe to obtain a mixture; forming a film by making use of the mixture; and subjecting the film to a post-oxidation treatment to eliminate He, Ne, Ar, Kr and Xe atoms and, at the same time, to replenish O vacancy in the film with oxygen, thereby creating an Al vacancy selectively.

According to a ninth aspect of the present invention, there is provided a method of manufacturing the non-volatile semiconductor memory device which is set forth in one of the aforementioned third to fifth aspects of the present invention, the method comprising forming the insulating film containing Al and O as major elements by a process including forming an Al—OH bond in the insulating film by feeding $H_2$ or $H_2O$ at the time of forming the insulating film; and subjecting the insulating film to a post-heat treatment to thereby eliminate the H atom from the Al—OH bond, thus creating an Al vacancy.

BRIEF DESCRIPTION OF THE SEVERAL VIEWS OF THE DRAWING

FIGS. 1A and 1B each show a cross-sectional view illustrating one example of the manufacturing method of a cell structure representing one reference example;

FIGS. 2A and 2B each show a cross-sectional view illustrating one example of the manufacturing method of a cell structure representing one reference example;

FIGS. 3A and 3B each show a cross-sectional view illustrating one example of the manufacturing method of a cell structure representing one reference example;

FIGS. 4A and 4B each show a cross-sectional view illustrating one example of the manufacturing method of a cell structure representing one reference example;

FIGS. 5A and 5B each show a cross-sectional view illustrating one example of the manufacturing method of a cell structure representing one reference example;

FIGS. 6A and 6B each show a cross-sectional view illustrating one example of the manufacturing method of a cell structure representing one reference example;

FIG. 8 is a diagram of energy levels illustrating the defects which are effective in improving the memory characteristics, which can be achieved through the control of the defects of alumina film according to the present invention;

FIG. 10B is a diagram of one-electron levels illustrating the defects which are effective in improving the memory characteristics that can be achieved through the control of the defects of alumina film according to the present invention, wherein the case where divalent cationic element was incorporated is shown;

FIG. 13 is a diagram illustrating a condition after writing of a floating gate type memory cell then setting to the flat band condition;

FIG. 14 is a diagram illustrating a condition after erasing of a floating gate type memory cell then setting to the flat band condition;

FIG. 21 is a diagram illustrating a charge neutral condition of a floating gate type memory cell according to another embodiment of the present invention;

FIG. 22 is a diagram illustrating a condition after writing of a floating gate type memory cell then setting to the flat band condition according to another embodiment of the present invention;

DETAILED DESCRIPTION OF THE INVENTION

Figure 7:
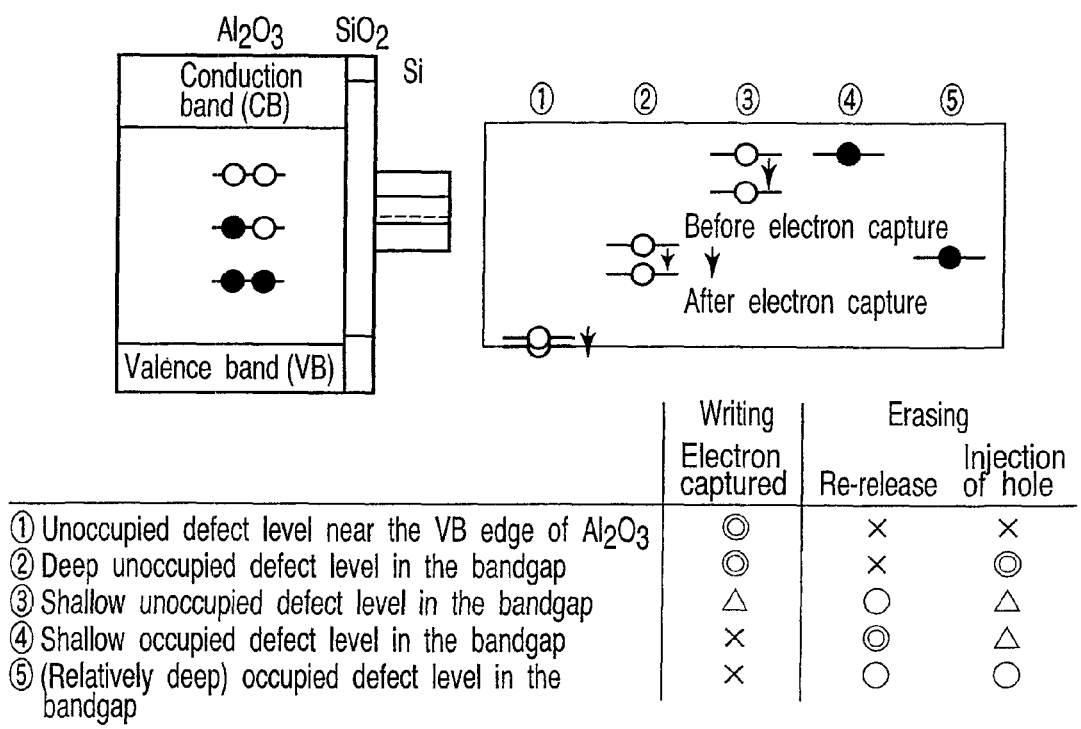
FIG. 7 is a diagram showing the relationship between the reforming of alumina film according to the present invention and the principle of improving the memory characteristics.

Next, various embodiments of the present invention will be explained.

In the case of the MONOS type non-volatile semiconductor memory device according to the first aspect of the present invention, the first charge trapping layer formed on the first gate insulating layer includes an insulating film containing Al and O as major elements and having a defect pair formed of a complex of an interstitial O atom and a tetravalent cationic atom substituting for an Al atom, or a defect pair formed of a complex of an oxygen vacancy and N atom substituting for an O atom, wherein the insulating film has also an electron unoccupied levels within the range of 2 eV-6 eV from the of the valence band maximum of $Al_2O_3$.

In the case of the floating gate type non-volatile semiconductor memory device according to the second aspect of the present invention, the second charge trapping layer formed on the second gate insulating film includes an insulating film containing Al and O as major elements and having a defect pair formed of a complex of an interstitial O atom and a tetravalent cationic atom substituting for an Al atom, or a defect pair formed of a complex of an oxygen vacancy and N atom substituting for an O atom, wherein the insulating film has also an electron unoccupied levels within the range of 2 eV-6 eV from the of the valence band maximum of $Al_2O_3$.

In the case of the MONOS type non-volatile semiconductor memory device according to the third aspect of the present invention, the second gate insulating layer includes an insulating film containing Al and O as major elements and having, in a region of the second gate insulating layer which is located near an interface between the first charge trapping layer and the second gate insulating layer, Al vacancy, interstitial O atom, N atom substituting for O atom, or divalent cationic atom substituting for Al atom, wherein the insulating film has also an electron unoccupied levels within the range of 2 eV from the valence band maximum of $Al_2O_3$.

In the case of the MONOS type non-volatile semiconductor memory device according to the fourth aspect of the present invention, the second gate insulating layer includes an insulating film containing Al and O as major elements and comprising a first insulating film, a second insulating film formed on the first insulating film and functioning as a second charge trapping layer, and a third insulating film formed on the second insulating film and having a larger thickness than that of the first gate insulating layer, wherein the second insulating film contains Al and O as major elements and having Al vacancy, interstitial O atom, N atom substituting for O atom, or divalent cationic atom substituting for Al atom, the second insulating film having also an electron unoccupied levels within the range of 2 eV from the valence band maximum of $Al_2O_3$.

In the case of the floating gate type non-volatile semiconductor memory device according to the fifth aspect of the present invention, the second charge trapping layer formed on the second gate insulating layer includes an insulating film containing Al and O as major elements and having Al vacancy, interstitial O atom and N atom substituting for O atom or divalent cationic atom substituting for Al atom, wherein the insulating film has also an electron unoccupied levels within the range of 2 eV from the valence band maximum of $Al_2O_3$.

In the case of the MONOS type non-volatile semiconductor memory device according to the sixth aspect of the present invention, the first charge trapping layer formed on the first gate insulating layer includes an insulating film containing Al and O as major elements and having a tetravalent cationic atom substituting for an Al atom, a pentavalent cationic atom substituting for an Al atom, interstitial trivalent cation atom, interstitial tetravalent cation atom, interstitial pentavalent cation atom, or oxygen vacancy, wherein the insulating film has also an electron occupied levels in the band gap of $Al_2O_3$.

In the cases of the non-volatile semiconductor memory devices according to the first through sixth aspects of the present invention, the electron unoccupied levels or the electron occupied levels may have a area density of less than $8 \times 10^{13}$ levels/cm$^2$ and more than $8 \times 10^{11}$ levels/cm$^2$.

Further, the divalent cationic atom, the tetravalent cationic atom or the pentavalent cationic atom may be contained in the insulating film to form a uniform solid solution or dispersed in the insulating film as an oxide or oxynitride.

Further, the divalent cationic atom may be selected from the group consisting of Mg, Ca, Sr and Ba. The tetravalent cationic atom may be selected from the group consisting of Si, Hf, Zr and Ti. The pentavalent cationic atom may be selected from the group consisting of V, Nb and Ta.

According to the aforementioned first through sixth aspects of the present invention, due to the reforming of the insulating film, i.e. the incorporation of desired defect levels in the insulating film, it is possible to adjust the charge-trapping/detrapping characteristics in conformity with the object of use, thereby making it possible to provide a semiconductor memory device which is capable of suitably coping with the relaxation of electric field, the efficient characteristics for writing/erasing/retention of charge and for over-erasing of charge.

Especially, in the case where alumina ($Al_2O_3$) is applied to a portion of the blocking layer or trapping layer of a MONOS type memory cell or to a portion of the floating gate layer of a floating gate type memory cell, a relatively deep electron trap levels (electron unoccupied levels) are created in the band gap of alumina, thereby realizing highly efficient trap of electrons and hence relaxing the electric field at the time erasing, thus realizing a high velocity erasing.

In the case where alumina ($Al_2O_3$) is applied to the trapping layer of a MONOS type memory cell, an electron trap levels (electron unoccupied levels) are created in the vicinity of the middle of the band gap of alumina, thereby making it possible to realize highly efficient writing through the trapping of electrons or highly efficient erasing through the injection of holes.

Further, in the case where alumina ($Al_2O_3$) is applied to the trapping layer of a MONOS type memory cell, an electron occupied levels of a charge neutral condition are created in the gap of alumina, thereby making it possible to draw out the electron toward the substrate via the first insulating film (tunnel insulating film) in the erasing operation, thus realizing "over erasing" which provides a sufficiently large negative threshold voltage at the time of erasing.

Next, various embodiments of the present invention will be explained in detail with reference to drawings.

One example of the non-volatile semiconductor memory device according to one aspect of the present invention is applicable to a non-volatile semiconductor memory device having a memory cell of a MONOS (metal-oxide-nitride-oxide-semiconductor) structure. Among the non-volatile semiconductor memory devices of this kind, the aforementioned non-volatile semiconductor memory device of the present invention is especially applicable to a NAND type MONOS flash memory which can be used as a high density semiconductor memory device.

The non-volatile semiconductor memory device of this kind is generally constructed to have a planar cell structure wherein the cells are respectively isolated by making use of a silicon oxide film so as to prevent the interference between neighboring memory cells even if the fineness of memory cell is further increased.

The memory device according to the aspects of the present invention can be classified, in gist, into three embodiments.

1. In the case where alumina ($Al_2O_3$) is applied to the trapping layer of a MONOS type memory cell, an electron trap levels (electron unoccupied levels) are created in the vicinity of the middle of the band gap of alumina by making use of either a complex of an interstitial oxygen and an Al site-substituting tetravalent cation, i.e. a defect pair ($O_i$-$1M_{Al}$; M=Si, Zr, Hf, Ti), or a complex of an oxygen vacancy ($V_O$) and oxygen site-substituting nitrogen(s) ($N_O$), i.e. a defect pair ($V_O$-$nN_O$, (n=1, 2)).

2. In the case where alumina ($Al_2O_3$) is applied to a part of the blocking layer or trapping layer of MONOS type memory cell or to a part of a laminated film functioning as the floating gate layer of a floating gate type memory cell, a relatively deep electron trap levels (electron unoccupied levels) are created in the band gap of alumina by making use of Al vacancy ($V_{Al}$), an Al site-substituting divalent cation ($M_{Al}$; M=Mg, Ca, Sr, Ba), oxygen site-substituting nitrogen ($N_O$), or interstitial oxygen ($O_i$).

3. In the case where alumina ($Al_2O_3$) is applied to the trapping layer of MONOS type memory cell, an electron occupied levels of a charge neutral condition are created in the band gap of alumina by making use of an Al site-substituting cation ($M_{Al}$; M=Si, Zr, Hf, Ti, V, Nb, Ta), interstitial cation ($M_i$; M=Al, Si, Zr, Hf, Ti, V, Nb, Ta), or oxygen vacancy ($V_O$).

FIGS. 1A and 1B each show one example of the cell structure of a NAND type MONOS flash memory as a reference example for explaining the non-volatile semiconductor memory device according to one embodiment of the present invention, wherein FIG. 1A shows the cross-sectional view thereof in the direction of column, and FIG. 1B shows the cross-sectional view thereof in the direction of row. In this case, the direction of row is a direction in which the word line (control gate electrode) extends and the direction of column is a direction orthogonally intersecting with the direction of the row.

FIGS. 2A through 6B show respectively a cross-sectional view illustrating the manufacturing process of the cell structure shown in FIGS. 1A and 1B. FIGS. 2A, 3A, 4A, 5A and 6A show respectively the cross-sectional view in the direction of the column, and FIGS. 2B, 3B, 4B, 5B and 6B show respectively the cross-sectional view in the direction of the row.

First of all, as shown in FIGS. 2A and 2B, by means of thermal oxidation, a tunnel oxide film 102 having a thickness of about 3-4 nm is formed on a silicon substrate (including a well) 101 containing a p-type impurity doped therein.

Then, by means of a chemical vapor deposition (CVD) method, a silicon nitride film 103 having a thickness of about 4 nm, a silicon oxide film (blocking insulating film) 104 having a thickness of about 10 nm, a phosphorus-doped polycrystalline silicon film (control gate electrode) 105 having a thickness of about 100 nm, and a mask material 106 for forming an element isolation region are successively formed on the tunnel oxide film 102.

Thereafter, a photoresist is formed on the mask material 106 and then subjected to exposure and development to form a photoresist pattern. Then, by means of a reactive ion etching (RIE), the pattern of the photoresist pattern is transcribed on the mask material 106. Subsequently, the photoresist pattern is removed.

Then, by making use of the mask material 106 as a mask and by means of RIE, the polycrystalline silicon film 105, the silicon oxide film 104, the silicon nitride film 103 and the tunnel oxide film 102 are successively etched to form a slit 105a, thereby isolating memory cells neighboring in the direction of row from each other.

Then, by means of RIE, the silicon substrate 101 is subjected to etching to form an element isolation trench 105b having a depth of about 100 nm in the silicon substrate 101.

Next, by means of CVD, a silicon oxide film (embedded oxide film) 107 completely filling the slit 105a and the element isolation trench 105b is formed. Thereafter, by means of a chemical mechanical polishing (CMP), the silicon oxide film 107 is polished until the mask material 106 is exposed, thereby flattening the surface of the silicon oxide film 107. Then, mask material 106 is selectively removed. Thereafter, as shown in FIGS. 3A and 3B, by making use of dilute hydrofluoric acid, the silicon oxide film 107 is back-etched so as to make the height of the silicon oxide film 107 equal to the height of the phosphorus-doped polycrystalline silicon film 105.

Then, as shown in FIGS. 4A and 4B, by means of CVD, a conductive film (word line) 108 having a thickness of about 100 nm and made of tungsten, for example, is formed on the phosphorus-doped polycrystalline silicon film 105. Then, by means of CVD, a mask material 109 is formed on the conductive film 108.

Thereafter, a photoresist is formed on the mask material 109 and subjected to exposure and development to form a photoresist pattern. Then, by means of RIE, the pattern of the photoresist pattern is transcribed to the mask material 109. Subsequently, the photoresist pattern is removed.

Then, as shown in FIGS. 5A and 5B, by making use of the mask material 109 as a mask and by means of RIE, the conductive film 109, the polycrystalline silicon film 105, the silicon oxide film 104, the silicon nitride film 103 and the tunnel oxide film 102 are successively subjected to etching, thereby forming the configuration of the MONOS gate stack.

Then, as shown in FIGS. 6A and 6B, by means of CVD, a silicon oxide film 110 is formed on the sidewall of the MONOS gate stack. Thereafter, by way of ion injection, an impurity is injected into the surface region of the silicon oxide film 110 in a self-aligned manner to form source/drain diffusion regions 111, thus accomplishing the memory cell.

Finally, by means of CVD, an interlayer insulating film 112 is formed so as to cover the memory cell.

Principle of the Present Invention:

According to the present invention, the improvement of electric characteristics for the memory device through the reforming of an alumina-based insulating film is applied to the charge-trapping layer (trapping layer) and/or the blocking layer. The relationship between the object of reforming the alumina-based insulating film and the principle of the present invention will be explained in detail with reference to FIGS. 7 to 17.

The reforming through the defect control of the charge-trapping layer (trapping layer) and the blocking layer both formed of an alumina-based insulating film may be classified into the following three groups in terms of the efficiency of electron trapping (electron affinity).

1) Electron unoccupied levels which are close to the valence band maximum of $Al_2O_3$ (circled number 1 in FIG. 7):

Because of Electron traping>>(Re) detrapping, when the reforming is applied to the blocking layer of the MONOS type memory cell, especially to a portion in the vicinity of the interface between the blocking layer and the trapping layer disposed below the blocking layer, it is possible to realize the relaxation of electric field by way of a highly efficient trapping of electrons. Further, when the reforming is applied to the alumina layer of a FG type memory cell, it is possible to realize a sufficient quantity of electron trapping.

2) Electron unoccupied levels which are deep in the band gap of $Al_2O_3$ (circled number 2 in FIG. 7):

Since the electron trap is not so deep as the levels of above item 1), it would not raise any problem in terms of charge retention characteristics. Further, on the contrary, since the electron trap is not so deep as the levels of above item 1), it is possible to execute the efficient erasing by the injection of holes. As a result, it is possible to apply the reforming to the alumina layer constituting a part of the laminate film functioning as the charge trapping layer of the MONOS type memory cell and the floating gate layer of the FG type memory cell.

3) Electron occupied levels in the gap of $Al_2O_3$ (circled numbers 4 and 5 in FIG. 7):

Since it is occupied by electrons under the neutral condition, it is possible to realize a negative threshold voltage by way of over-erasing by drawing out the electrons, through the tunnel film, toward the substrate on the occasion of erasing.

Incidentally, since the shallow electron occupied/electron unoccupied levels in the band gap (circled number 3 in FIG. 7) would cause electronic leakage current and deteriorate the retention characteristics of the memory, it is required to eliminate them, to electrically inactivate them or to convert them into defect configuration having another depth levels. The gist of the present invention resides in these points.

The electron excess type defect appearing immediately below the conduction band minimum of the band structure of $Al_2O_3$ shown in the right FIG. of FIG. 8 are defects wherein Si or Hf, both being a tetravalent cation, is substituted for Al which is a trivalent cation (this defect being referred to as $Si_{Al}$ and $Hf_{Al}$). These defects may become a cause for the leakage current if these defects are left as they are. However, when these defects are converted into a different type of defect $O_i$-$1M_{Al}$ (M=tetravalent cation such as Si, Hf, etc.) by binding it to an interstitial oxygen at a ratio of 1:1 to create a complex of defects (defect pair), this defect can be changed into a deep electron unoccupied levels (circled number 2 in FIG. 7), thus turning it into a defect which is capable of efficiently executing the writing/erasing operation of charge. The criticality of the aforementioned ratio is illustrated in FIGS. 9 and 10.

Figure 9:
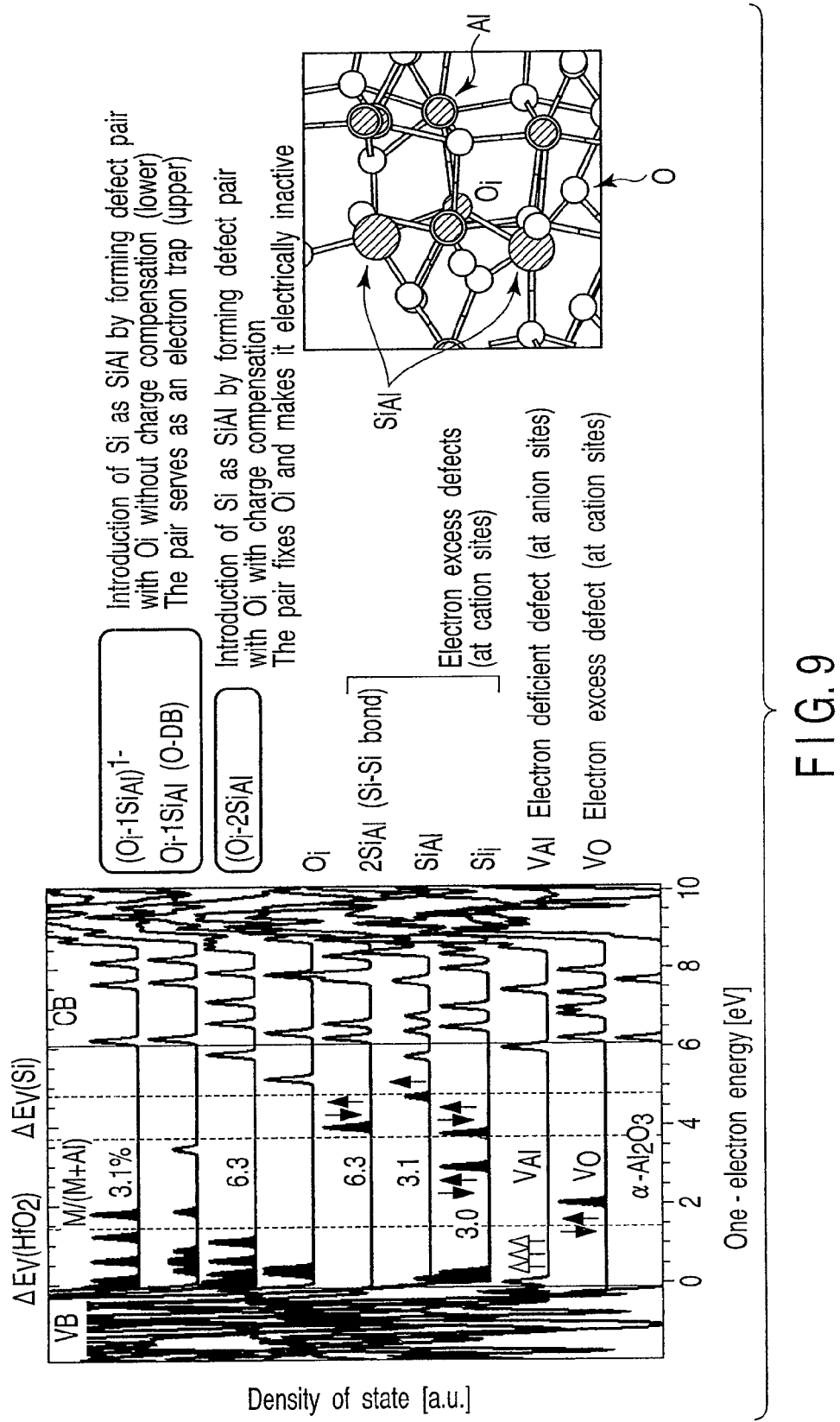
FIG. 9 is a diagram of one-electron energy levels illustrating the defects which are effective in improving the memory characteristics that can be achieved through the control of the defects of alumina film according to the present invention and the defects which are ineffective in improving the memory characteristics.

In FIGS. 9 and 10, 0 eV on the abscissa represents the valence band maximum of $Al_2O_3$ and 6 eV on the abscissa represents the conduction band minimum. The gap levels indicated by a dark tint in the gap represents an electron occupied levels and the levels having no tint in the gap represents an electron unoccupied levels. The results shown in FIGS. 8 to 10 were obtained from the first-principles band calculation. As far as the theoretical framework of the first-principles band calculation employed in the present invention is concerned, it has been theoretically demonstrated that the band gap will be underestimated as compared with experimental values. Further, the technique of correction thereof is also theoretically made clear such as GW approximation. However, since it requires more expensive calculation for the correction, it has not practiced the technique in the present invention.

FIG. 9 shows a typical example of one-electron levels indicating electronic states as various kinds of defects have been introduced into $Al_2O_3$. What should be noticed in FIG. 9 is a defect pair of an interstitial oxygen ($O_i$) and an Al site-substituting Si($Si_{Al}$) wherein Si (tetravalent cation) is substituted for Al. In the case where this defect pair is formed at a ratio of 1:1, if $Al_2O_3$ is kept in a charge neutral condition without no charge being injected from the outside, an electron unoccupied level appears at an intermediate depth of the band gap ($O_i$-$1Si_{Al}$ in FIG. 9), and if one electron is injected into it, the defect can be stabilized at a deep portion in the band gap as an electron occupied level (($O_i$-$1Si_{Al}$)$^{1-}$ in FIG. 9).

However, when the Al site-substituting Si is excessively increased to 1:2 ($O_i$-$2Si_{Al}$ in FIG. 9), the electron unoccupied levels at a middle portion of band gap will disappear. As shown in FIG. 8, since the electron affinity of interstitial oxygen is fairly large, electrons are enabled to move from the Al site-substituting Si where the defect thereof has one excess electron to the interstitial oxygen where the defect thereof is deficient of two electrons, thereby stabilizing these defects.

When the number of the Al site-substituting Si is two, the number of excess electrons becomes two, thus compensating for a shortage of two electrons in the interstitial oxygen, thereby enabling the electron unoccupied levels disappear. These phenomena indicate that the charge trapping characteristics can be determined by stoichiometry of created defect pairs in which how many electrons can move within them toward stabilization as a total system.

Figure 10A:
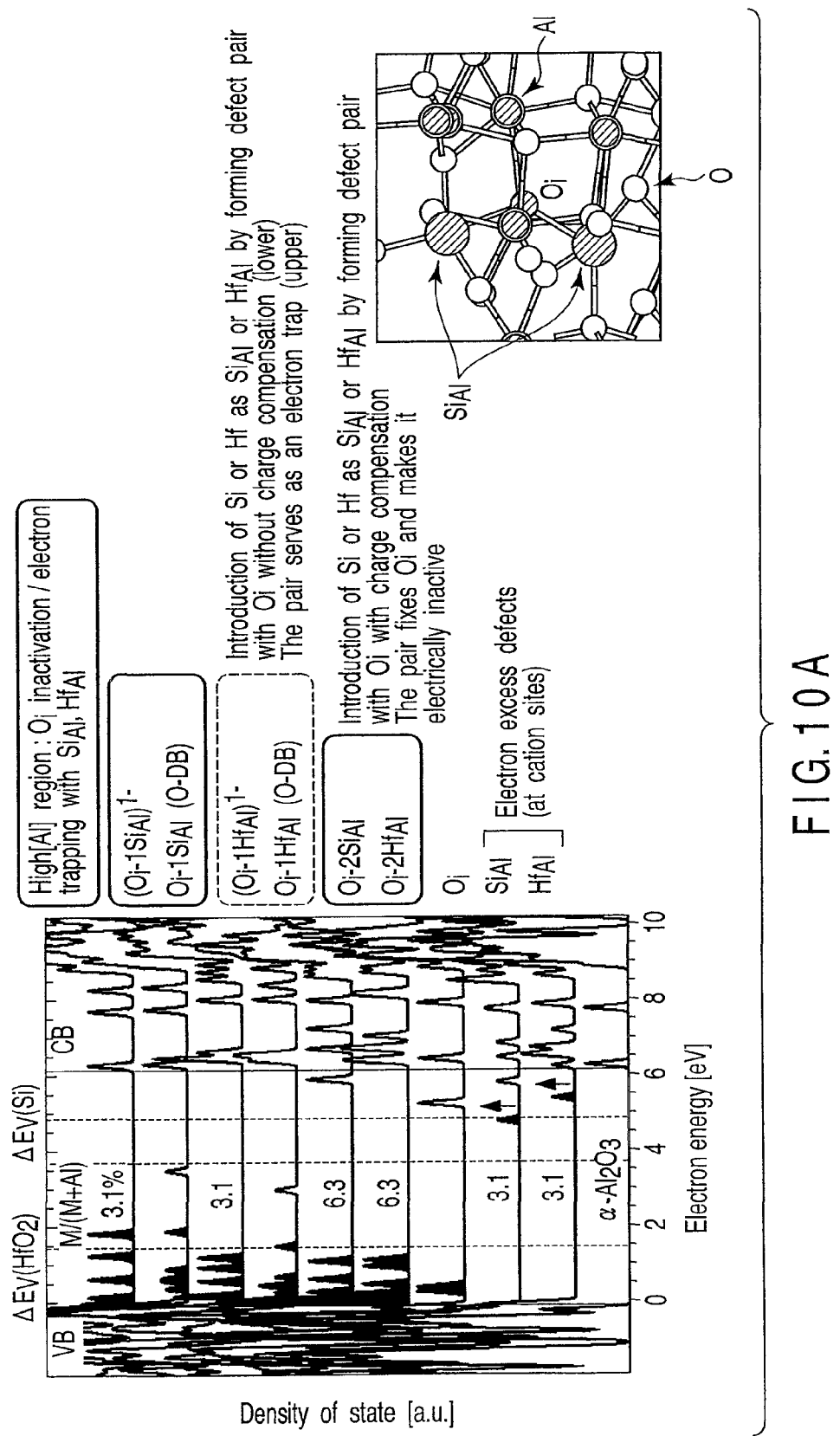
FIG. 10A is a diagram of one-electron energy levels illustrating the defects which are effective in improving the memory characteristics that can be achieved through the control of the defects of alumina film according to the present invention, wherein the case where a tetravalent typical element was incorporated and the case where a tetravalent transition metal element was incorporated are shown.

FIG. 10A illustrates the comparison between Si and Hf both employed as a substituent element for Al site. It will be recognized that even in the case of Hf, which is a transition metal element having a valence electron of $5d^26s^2$ which is higher in orbital energy as compared with valence electrons of Si which is a typical element, almost the same results as those of Si are indicated, from the view of the electronic states, with respect to not only the energy levels but also the above-described ratio. Even in the case of Zr having a valence electron of $4d^25s^2$, or even in the case of Ti having a valence electron of $3d^24s^2$, both falling within almost the same range in orbital energy as that of Hf or Si, almost the same results can be obtained.

Next, a defect pair formed of oxygen vacancy ($V_O$) and N atom substituting for an O atom ($N_O$) will be explained. In a charge neutral condition where no charge is injected from or released to the outside of the system, the oxygen vacancy ($V_O$) is enabled to generate two excess electrons in the gap. On the other hand, in the case of the N atom substituting for an O atom ($N_O$), a one-electron-deficient level appears at a deep location (in the vicinity of the valence band maximum) in the band gap. Therefore, the excess electrons of $V_O$ can be moved to the $N_O$ in short of an electron, thereby making it possible to compensate with each other for charge. By taking advantage of this phenomenon, it is possible to create a defect that can effectively execute the writing/erasing of charge.

First of all, in the case of a 1:1 pair ($V_O$-$1N_O$), in a charge neutral condition where no charge is injected from the outside, an electron occupied level (occupied by one electron) originating from $V_O$ leaves at an middle portion of the band gap and, at the same time, an electron unoccupied level (unoccupied by one electron) also originating from $V_O$ that could not be pushed up to the conduction band appears. When an electron is trapped at this electron unoccupied level, the electron unoccupied level is stabilized into an electron occupied level again at a deep portion in the band gap. What is important is to stabilize the electron occupied level down to a deep portion in the band gap as the electron is trapped. This is because, if the electron occupied levels remains in the vicinity of the conduction band minimum even after trapping electrons, it would become a cause for the leakage level of the electron.

Then, in the case of a 1:2 pair ($V_O$-$2N_O$), in a charge neutral condition where no charge is injected from the outside of the system, an electron occupied level originating from $V_O$ is no longer left in the band gap. Instead of that, an electron unoccupied level (it is deficient of two electrons) also originating from $V_O$ that could not be pushed up to the conduction band appears. When an electron is to be trapped at this electron unoccupied level, the electron occupied levels is stabilized again at a deep portion in the band gap, as in the case of the above-described $V_O$-$1N_O$.

Incidentally, as is apparent from the forgoing explanation, if the electron occupied levels remain under a charge neutral condition in the band gap, it is possible to erase this occupied electron(s) also by applying an excessive erasing operation to the electron occupied levels, so that it is possible to realize "over-erasing" which provides a sufficiently large negative threshold voltage in the erasing condition.

FIG. 10B shows the case of an Al site-substituting Mg ($Mg_{Al}$) where Al is substituted for Mg (divalent cation), and the $Mg_{Al}$ forms a defect pair of the $Mg_{Al}$ and oxygen vacancy ($V_O$). The Al site-substituting Mg is a defect which is deficient of one electron. Since this shortage of one electron results from a 2p orbital of oxygen atom, shortage of one electron is caused to generate at a deep location (in the vicinity of the valence band maximum) in the band gap, as in a case of N atom substituting for an O atom ($N_O$). Therefore, electron affinity of the defect is as large as approximately band gap energy.

Since the defect $V_O$ has two excess electrons, it is possible for these electrons to move to two defect sites of $Mg_{Al}$ each in short of one electron, and to realize charge compensation with each other as a defect pair ($2Mg_{Al}$-$V_O$ in FIG. 10B). However, the oxygen defect which becomes electron unoccupied state is not pushed up to the conduction band and still leaves at an middle portion of the band gap as electron unoccupied level. Therefore, charge can be injected from the outside of the system. This is different from the case of a 1:2 defect pair of the an interstitial oxygen and two Al site-substituting Si atoms ($Si_{Al}$) as shown in FIG. 8, where electron unoccupied level resulting from the interstitial oxygen disappear. These difference shows that the charge trapping characteristic can be determined depending on what kinds of the defects are, to what kinds of the defect pair they are converted, and how many electrons should to be moved to the defect pair.

In the foregoing description, the principle of the present invention has been discussed in view-point of the reformation, in other word a defect control, of an alumina-based insulating film. However, this principle of a defect control method can be, of course, applied also to an insulating film in contact with the alumina-based insulating film, that is, to interface regions of the insulating films. Especially, this principle is effectively applied to the case where the insulating film in contact with the alumina-based insulating film is formed of an oxide, nitride or oxynitride of higher-valent cations than that of Al. For example, in a case where a tetravalent Si-based insulating film such as a film of $SiO_2$, $Si_3N_4$ or SiON (i.e. $SiO_xN_y$) is in contact with an $Al_2O_3$ film, the Al that has settled into the Si-substituting site of an Si-based insulating film is enabled to form a deep electron unoccupied level originating from the O 2p orbital exactly at the valence band maximum of the Si-based insulating film. Therefore, a structure having an Al atom substituting for an Si atom in a region of the Si-based insulating film, which is located near the interface of the Si-based insulating film in contact with the $Al_2O_3$ film, will bring about a highly efficient electron trap, thereby making it possible to realize not only a sufficient trap in quantity of charge but also an electric field relaxation effect. This indicates that the principle of the present invention can be applied to a charge trapping layer.

As described above, by making use of the defect-controlling technique of the alumina-based insulating film to be employed in the present invention, it is possible to secure desired charge-trapping/detrapping properties which are required for the alumina layer (electron-trapping layer) to be used as a portion of the laminate film functioning as an FG type floating gate layer or required for the MONOS type blocking/trapping layer. As a result, it is possible to provide a NAND type flash memory device which is excellent not only in writing/erasing properties but also in retention (charge-retaining) properties.

As described above, it is very important to provide a defect-controlling technique for finding out what kinds of defects should be combined and how to select them based on the changes in the levels that may be brought about from the combination of defects. It is clearly impossible to realize the reforming of the alumina-based insulating film to be employed in the present invention even if the descriptions of the prior documents are referred to, such prior documents including, for example, JP-A 2003-68897 which discloses the doping of a tetravalent element in trivalent element metal oxides without any statement on the chemical/physical structure of the dopant element; a document "T. Nakagawa et al., 2006-Spring MRS. P. 156 (2006)" which discloses the creation of a trap not in $Al_2O_3$ but in the interface reaction layer of $Al_2O_3/SiO_2$, namely no definition is made on the chemical/physical structure of the reaction layer; or a document "S. Saito et al., the 67$^{th}$ Lecture Meeting of the Society of Applied Physics in Ritsumeikan University (autumn in 2006), Preliminary Booklet p. 723, 31a-P10-17" which describes that the formation of a trap is originated from the mixing of Al and Si, namely no definition is made on what chemical/physical structure the mixing is realized.

Further, the idea to reform the alumina-based insulating film to be employed in the embodiments of the present invention cannot be inferred from the idea of the prior art, wherein the matrix phase of $M_2O_3$ type oxide is simply combined with the dispersed deposit of $MO_2$ type oxide which can be phase-separated to each other, then difference in band gap between them is to be emerged, which is then singly utilized for sufficiently securing the valence band offset and conduction band offset, thereby generating a local potential minimum of a band structure for enabling an electron to be trapped therein as disclosed, for example, in JP-A 2003-282746, JP-A 2004-55959 and JP-A 2005-328029.

Furthermore, it would be clear that the idea of simply using the oxide, oxynitride, silicate and aluminate including elements such as Al, Hf, Zr, Ta, Ti or {Ln: lanthanoids elements} for creating a charge trapping film as disclosed in JP-A 2004-158810 or JP-A 2005-5715 could not possibly lead to the reforming of the alumina-based insulating film to be employed in the embodiments of the present invention.

In the embodiments of the present invention, in order to obtain a guiding principle based on the physical properties inherent to a material with respect to the aforementioned defect control, the first-principles band calculation without any employment of empirical parameters is executed against the models of $Al_2O_3$, $SiO_2$, $HfO_2$ and $HfSiO_4$ having various kinds of defect (vacancy, interstitial, substitutionals, defect-pair), thereby investigating the stable structure, the formation energy and the electronic states to make clear the aforementioned phenomena. The objects of the present invention have been achieved based on the aforementioned knowledge.

Herein, with respect to the definition of defect levels regarding "shallow/deep", since it depends also on the distance between the spatially neighboring defects (therefore their levels), it cannot necessarily be uniquely determined and will fluctuate depending on the dielectric constant of the base material of an insulating film and also on the applied electric field. For the purpose of easily understanding this definition, Poole-Frenkel conduction mechanism may be imagined. Namely, when an electric field is applied to a base material, the spatial expansion of a potential barrier is caused to decrease in proportion to the inverse of the square root of the product of the dielectric constant of the base material and the electric field and, at the same time, the potential barrier itself is also forced to decrease, thereby enabling the trapped electron to be easily released.

In this specification, the region ranging from 2 eV above the valence band maximum to 2 eV below the conduction band minimum is defined as "shallow" by taking into account the fluctuation of the magnitude of structural relaxation (about 1 eV at maximum) in the determination of the levels that has been obtained based on the results of the first-principles calculations performed at this time on various kinds of defect structure and their charge-trapping levels.

Figure 11:
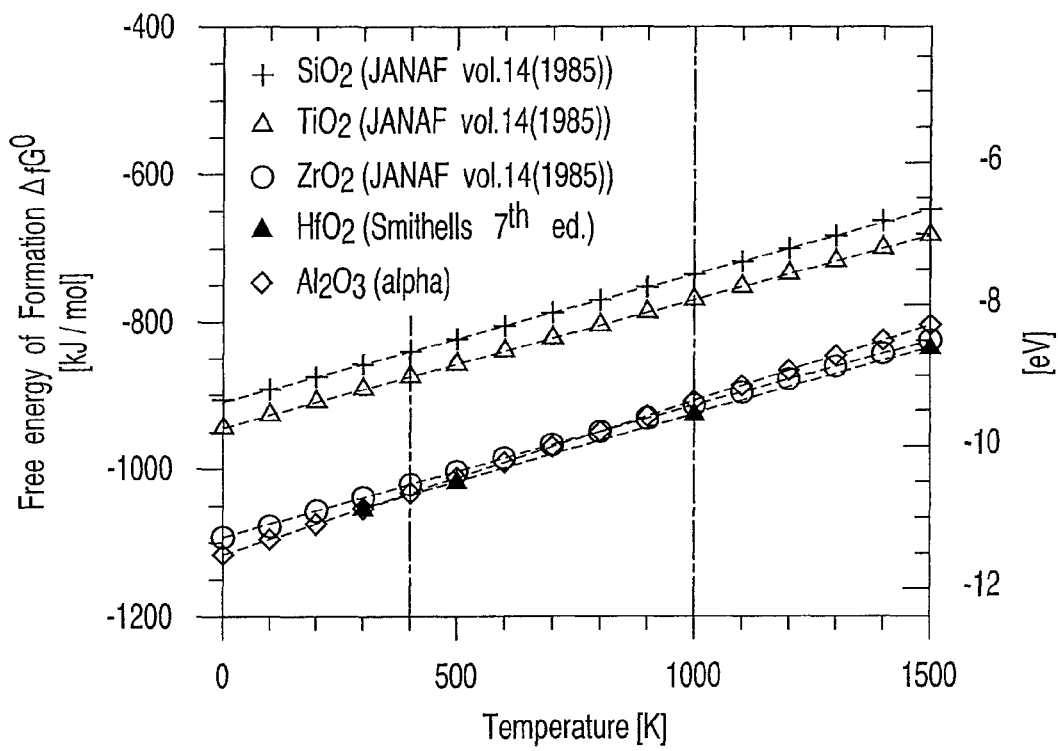
FIG. 11 is a graph of a Gibbs free energy of formation of typical elements related to the present invention, illustrating the oxidation-reduction conditions which are required for controlling the defects of alumina film according to the present invention.

FIG. 11 shows the Gibbs free energy of formation indicating the oxidation condition which is required for preventing the complete oxidation of an additive element in a case where this additive element is existed as an interstitial atom. This is because, when Si is employed as an additive element, if Si is completely oxidized, it will be turned into $SiO_2$, so that neither the electron occupied level nor the electron unoccupied level can be created in the band gap of alumina.

Figure 12:
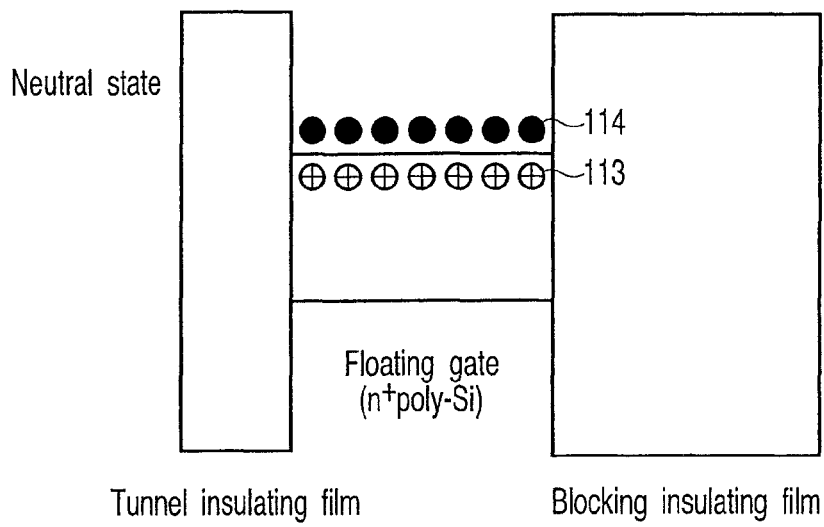
FIG. 12 is a diagram illustrating a charge neutral condition of a floating gate type memory cell.

FIG. 12 shows a band diagram of the neutral condition (a condition wherein writing/erasing operation is not executed) of the floating gate type memory cell. The floating gate that has been formed from n$^+$-type polycrystalline silicon is in a neutral state as a whole without the storage of charge. However, when examined in detail, the n-type dopant impurity of the polycrystalline silicon is turned, through the release of electron, into a donor ion 113, thereby making it possible to keep electric neutrality under the condition where the free electron 114 in polycrystalline silicon conduction band that has been released from the dopant impurity atom is balanced with the charge of the donor ion 113 which is positively charged.

FIG. 13 shows schematically a band diagram which has been returned to a neutral condition after the execution of writing operation to the floating gate type memory cell. By trapping the injected electron in the floating gate, the threshold voltage is shifted to the positive direction.

On the other hand, FIG. 14 shows a band diagram wherein the condition has been returned to neutral after the execution of an erasing operation (FIG. 13) to the floating gate type memory cell. On the occasion of an erasing operation, even after the neutral condition of the floating gate wherein all injected electrons are drawn out is passed by, the draw-out of electrons from the floating gate will be continued. This is possible because a large quantity of free electrons can be released from the donor atom of the floating gate as described above, so that, even in the charge neutral condition, the free electrons exist in the conduction band of the floating gate.

Figure 15:
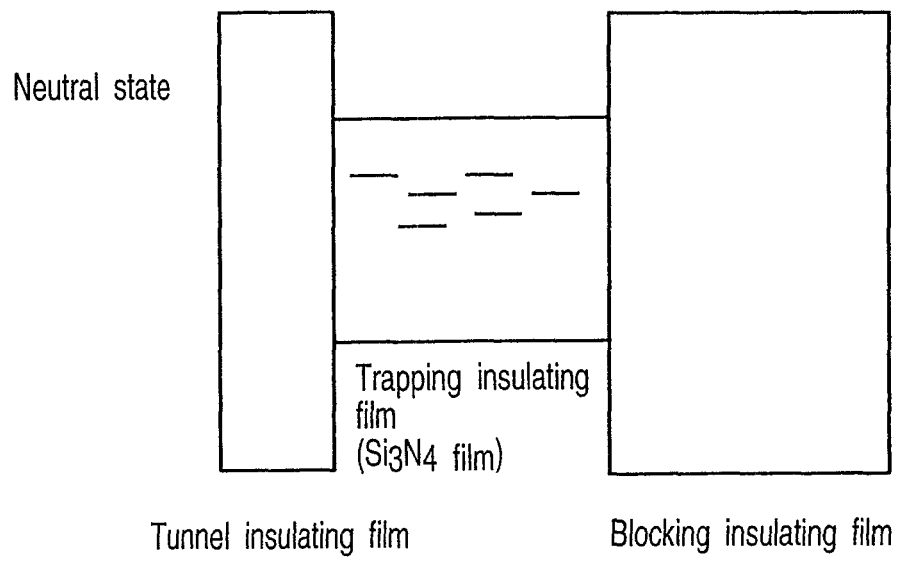
FIG. 15 is a diagram illustrating a charge neutral condition of a MONOS type memory cell.

FIG. 15 shows a band diagram of the neutral condition of the MONOS type memory cell. In the case of the conventional MONOS type memory cell, electrons cannot be stored in the trap of the silicon nitride film employed as a charge trapping layer under the charge neutral condition.

Figure 16:
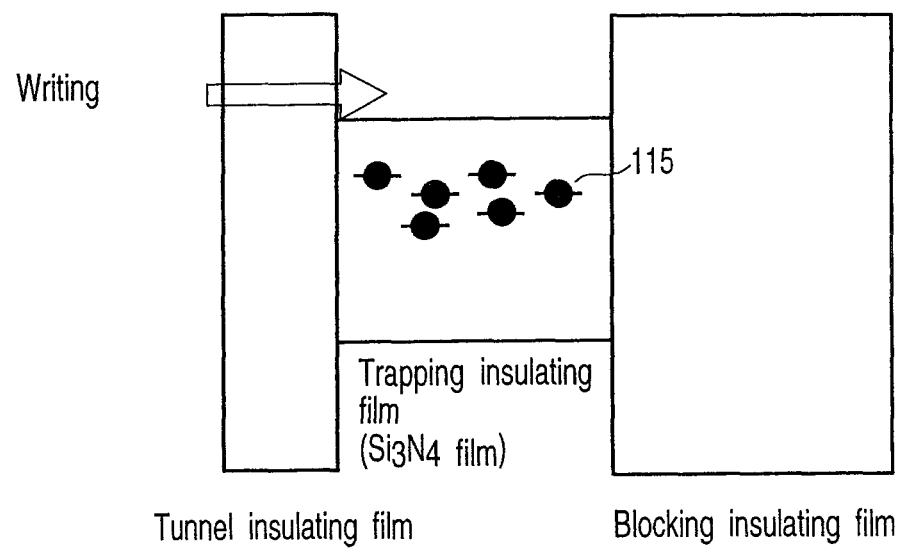
FIG. 16 is a diagram illustrating a condition after writing of a MONOS type memory cell then setting to the flat band condition.

FIG. 16 shows a band diagram wherein the condition has been returned to neutral after the execution of writing operation to the MONOS type memory cell. In this case, electrons are trapped by the silicon nitride film and the threshold voltage is shifted to the positive direction.

Figure 17:
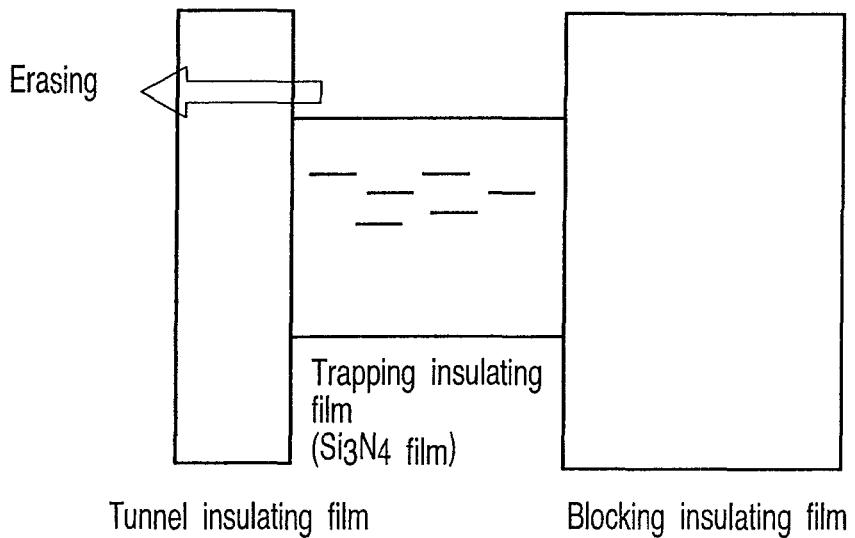
FIG. 17 is a diagram illustrating a condition after erasing of a MONOS type memory cell then setting to the flat band condition.

FIG. 17 shows a band diagram wherein the condition has been returned to neutral after the execution of erasing operation to the MONOS type memory cell. Since the electrons that can be released on the occasion of erasing operation are limited at most to those trapped by the silicon nitride film in the neutral condition, the threshold voltage merely returns to the initial voltage at minimum in the erasing operation in the case of the MONOS type memory cell, so that it is impossible to change the threshold voltage to the negative direction to a sufficient degree as required.

Next, by referring to various embodiments directed to the trapping layer and the blocking layer, the effects of improvement of electric characteristics for the memory device through the reforming of an alumina-based insulating film will be explained with reference to FIGS. 18 to 33.

Figure 18:
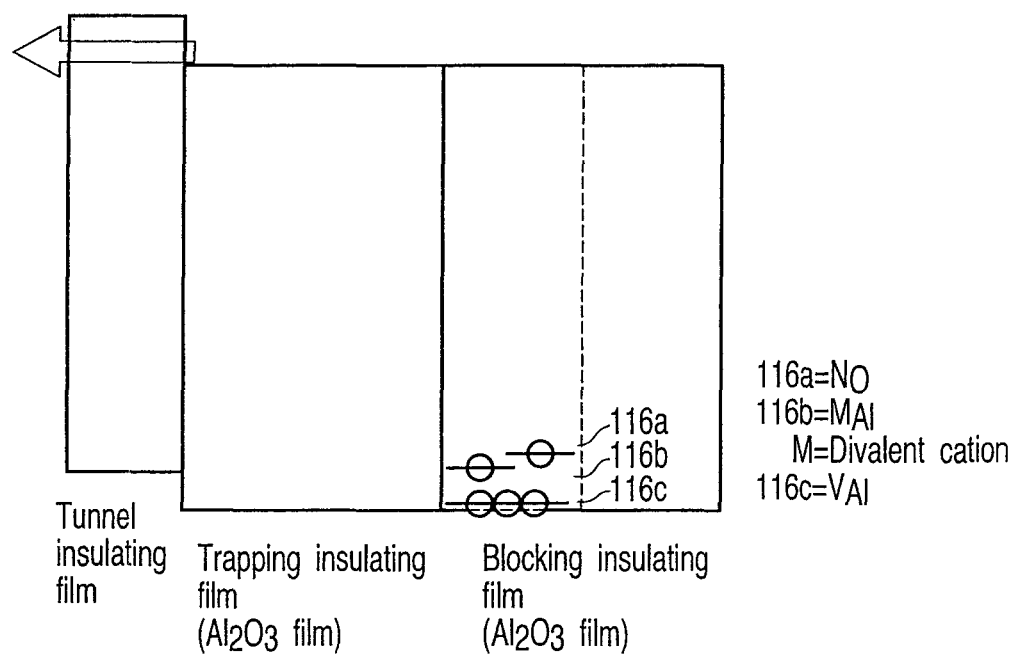
FIG. 18 is a diagram illustrating a charge neutral condition of a MONOS type memory cell according to one embodiment of the present invention.

FIG. 18 shows a band diagram in the neutral condition of charge in one example wherein deep electron trap levels (electron unoccupied levels) are created in the band gap of alumina employed as a blocking insulating film of the MONOS type memory according to a first embodiment (corresponding to the aforementioned third aspect) of the present invention, thereby realizing a highly efficient electron trap and relaxing the electric field on the occasion of erasing operation. In this case, due to the shortage of electrons around the defects, an electron unoccupied levels are created in the vicinity of the valence band maximum. Herein, it is indispensable for the electron unoccupied levels to be created in a region of the blocking layer which is close to the trapping layer. Incidentally, the electron trapping levels of the trapping insulating layer is not shown for simplicity.

Figure 19:
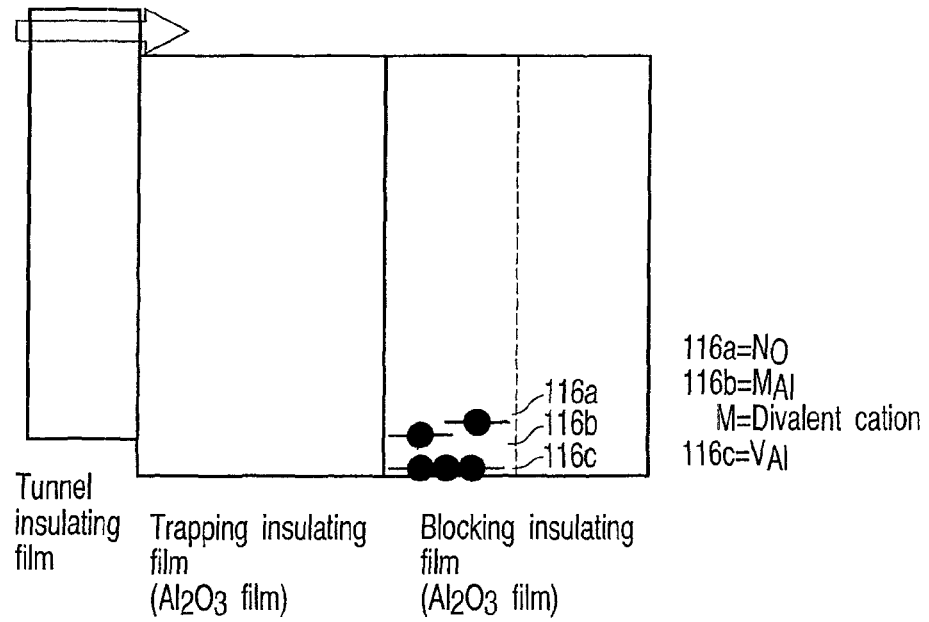
FIG. 19 is a diagram illustrating a condition after writing of a MONOS type memory cell then setting to the flat band condition according to one embodiment of the present invention.

FIG. 19 shows a band diagram wherein the condition has been returned to neutral after the execution of writing operation in FIG. 18. In this case, almost all traps in the blocking insulating film, which has been left in electron unoccupied levels is brought into electron trapped states. Incidentally, the electron trapped by the trapping insulating layer is not shown for simplicity.

Figure 20:
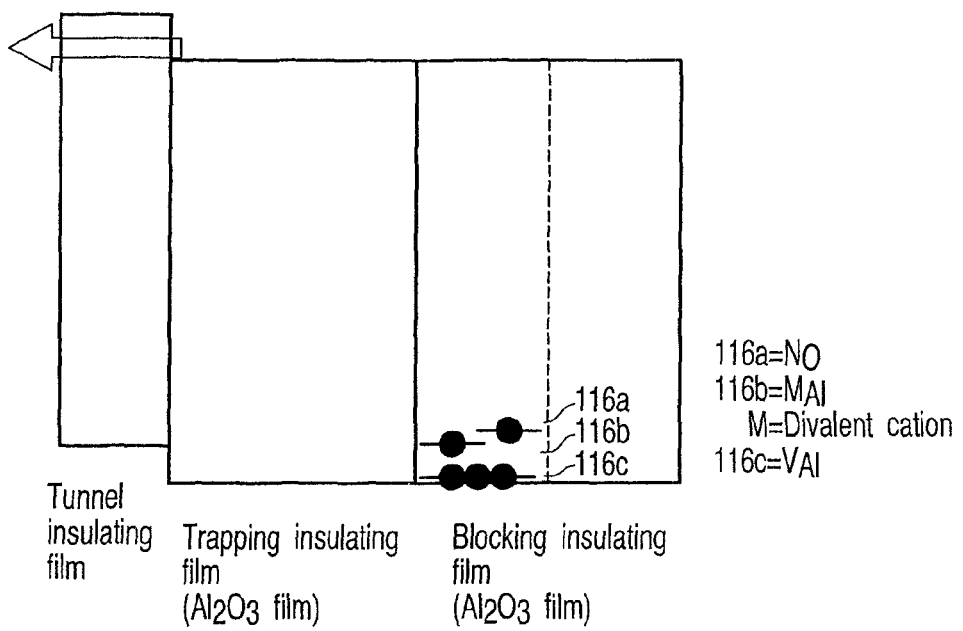
FIG. 20 is a diagram illustrating a condition after erasing of a MONOS type memory cell then setting to the flat band condition according to one embodiment of the present invention.

FIG. 20 shows a band diagram wherein the condition has been returned to neutral after the execution of erasing operation in FIG. 19. Since the electron trapping levels that have been written in the blocking insulating film is sufficiently deep, the ionization energy is increased up to almost the same degree as that of the band gap, thereby enabling most of the electrons to remain without being detrapped. As a result, it is possible to decrease the erasing threshold voltage and to execute the erasing deeply and quickly.

As described above, in the case of the MONOS type memory according to the first embodiment of the present invention, since it is possible to relax the electric field at the time of erasing operation which is demanded in a NAND type flash memory, it is possible to suppress the injection of electrons from the control electrode to the trapping layer and to perform an efficient injection of holes from the substrate, thereby easily realizing high-speed erasing. This would lead to the reduction in power consumption at the time of erasing operation.

Figure 23:
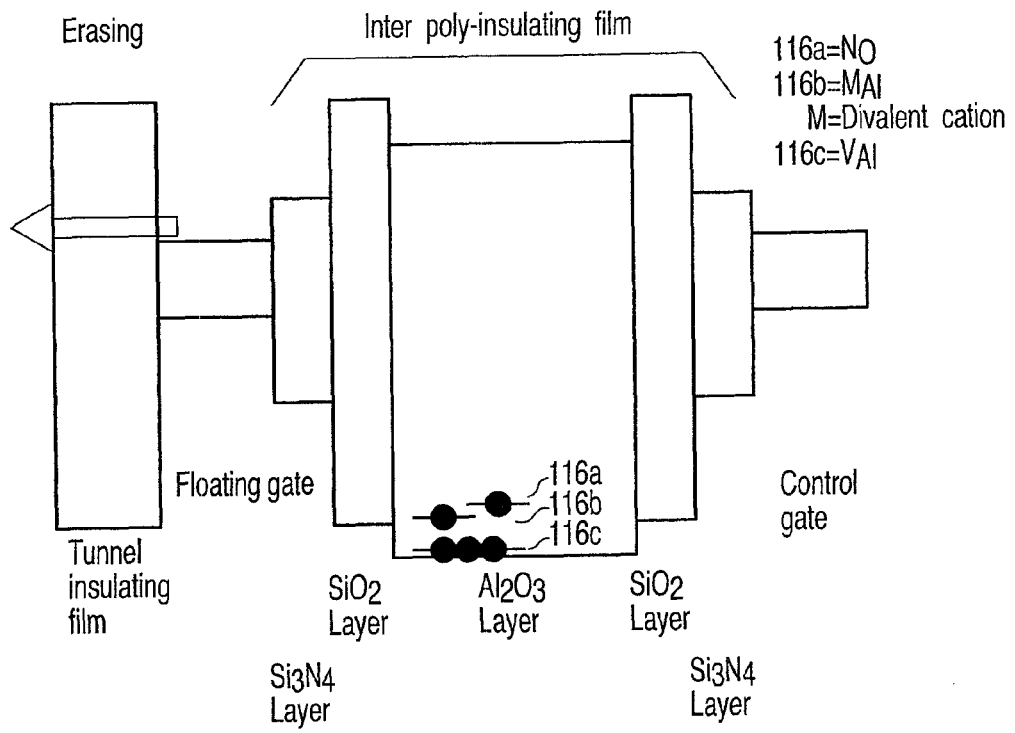
FIG. 23 is a diagram illustrating a condition after erasing of a floating gate type memory cell then setting to the flat band condition according to another embodiment of the present invention.

FIGS. 21 to 23 show a band diagram in a charge neutral condition (FIG. 21), a band diagram wherein the condition has been returned to neutral after the execution of writing operation (FIG. 22) and a band diagram wherein the condition has been returned to neutral after the execution of erasing operation (FIG. 23), respectively, in a modification example of the first embodiment of the present invention (corresponding to the aforementioned fifth aspect) wherein deep electron trap levels (electron unoccupied levels) are created in an alumina layer which is formed to constitute a part of the inter-poly insulating film of FG type memory, thereby making it possible to realize a highly-efficient electron trap and to relax the electric field at the time of erasing operation. In this case also, in the same mechanism as that explained with reference to FIGS. 18-20, since it is possible to relax the electric field at the time of erasing operation which is demanded in the operation of a NAND type flash memory, it is possible to suppress the injection of electrons from the control electrode to the trapping layer and to perform an efficient injection of holes from the substrate, thereby easily realizing high-speed erasing.

Figure 24:
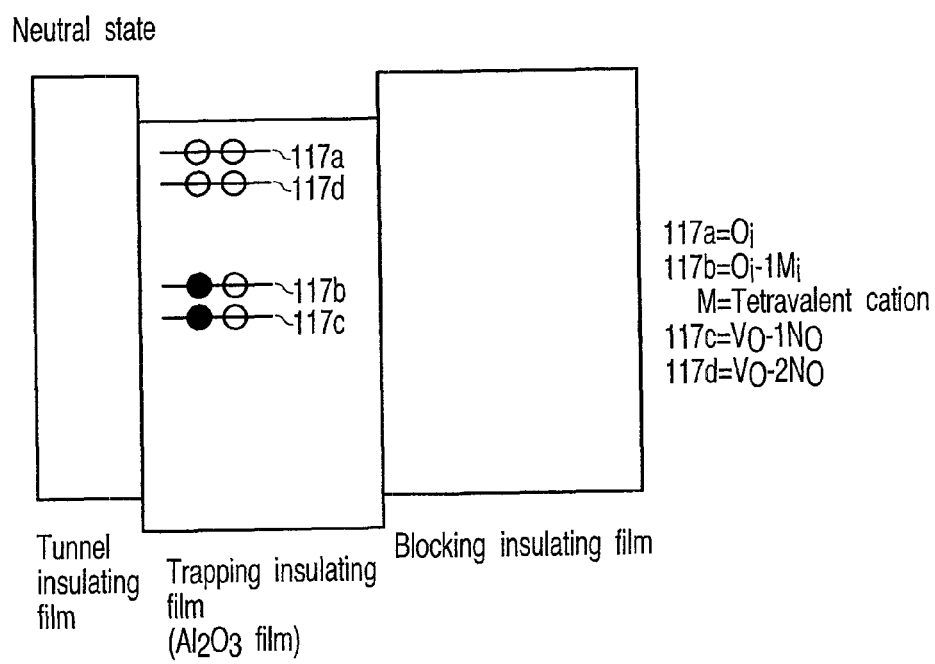
FIG. 24 is a diagram illustrating a charge neutral condition of a MONOS type memory cell according to another embodiment of the present invention.

FIG. 24 shows a band diagram in the neutral condition of charge in one example wherein electron trap levels (electron unoccupied levels) are created in the vicinity of the middle of the band gap of the alumina layer formed as a trapping insulating film of the MONOS type memory according to a second embodiment (corresponding to the aforementioned first aspect) of the present invention, thereby realizing not only a highly efficient writing operation through electron traps but also a highly-efficient erasing operation through the injection of holes.

In this embodiment, due to the shortage of electrons around the defects, electron unoccupied levels are created in an energy region ranging from the vicinity of the conduction band minimum to a middle of the band gap. The gist of this embodiment resides in the inclusion of electron unoccupied levels that can be developed only when defects are turned into a defect pair instead of a single defect as already explained above. Namely, these defect pairs include a defect pair ($O_i$-$1M_{Al}$) consisting of an interstitial oxygen ($O_i$) and an Al site-substituting cation element ($M_{Al}$) wherein M which is a tetravalent cation is substituted for Al, or a defect pair ($V_O$-$nN_O$; (n=1, 2)), i.e. a complex of an oxygen vacancy ($V_O$) and oxygen site-substituting nitrogen(s) ($N_O$). Further, what should be kept in mind herein is that the electron unoccupied levels of interstitial oxygen emerged in the vicinity of the conduction band minimum, and the electron unoccupied levels of oxygen vacancy defect that has been turned into an electron unoccupied state due to charge compensation with $N_O$, have a sufficiently large electron affinity, and drop (stabilize) greatly down to a middle portion of the band gap as electrons are trapped by the defect pairs.

Figure 25:
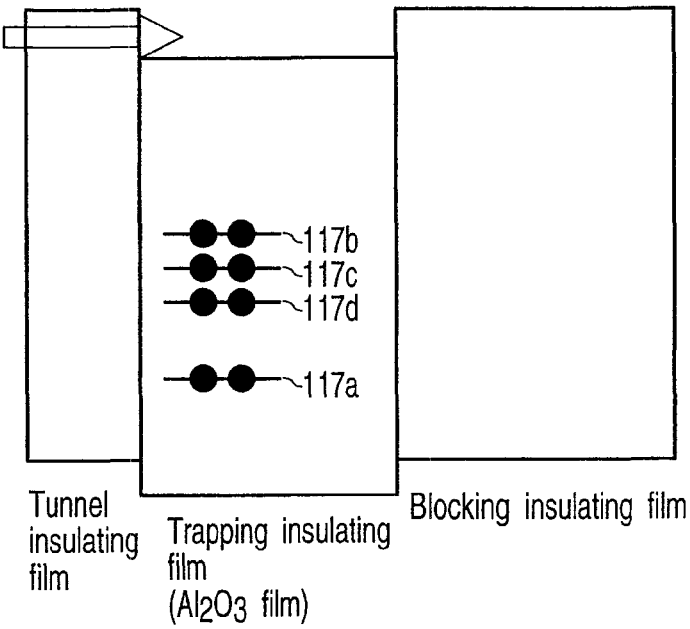
FIG. 25 is a diagram illustrating a condition after writing of a MONOS type memory cell then setting to the flat band condition according to another embodiment of the present invention.

FIG. 25 shows a band diagram wherein the condition has been returned to neutral after the execution of the writing operation in FIG. 24. In this case, almost all traps in the trapping film of the charge trapping layer, which has been partially left in an electron unoccupied levels, is brought into an electron trapped states. As described above, the electron occupied state ($O_i^{2-}$) of the interstitial oxygen that has trapped electrons as well as the electron occupied state of the oxygen vacancy is stabilized to a middle portion of the gap.

Figure 26:
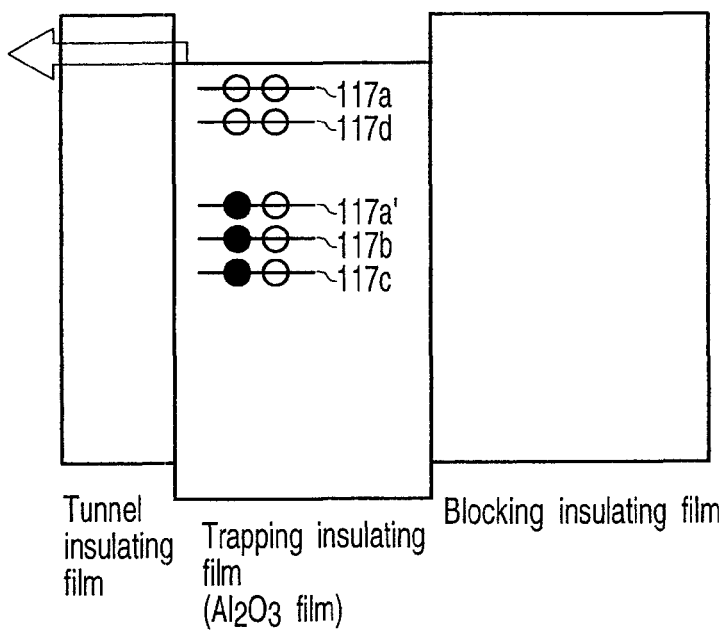
FIG. 26 is a diagram illustrating a condition after erasing of a MONOS type memory cell then setting to the flat band condition according to another embodiment of the present invention.

FIG. 26 shows a band diagram wherein the condition has been returned to neutral after the execution of the erasing operation in FIG. 25. Since the electron occupied levels at around a middle portion of the band gap after the trapping of charge is rendered active even to the trapping of holes in the same degree as that to the trapping of electrons, it is possible to restore it to nearly the charge neutral condition by simply executing an appropriate erasing operation. More specifically, by adjusting the quantity of trapped electrons by adjusting conditions of both the writing operation and the erasing operation, it is possible to realize a plurality of charge-trapping conditions, thus realizing the multi-valuation of the memory. Further, since it is also possible to erase the residual electron in FIG. 26 i.e. half-occupied (not-doubly-occupied) electron of charge-trapping levels in a charge neutral condition by simply applying an excessive erasing operation, it is also possible to realize "over-erasing" which provides a sufficiently large negative threshold voltage at the time of erasing.

Figure 27:
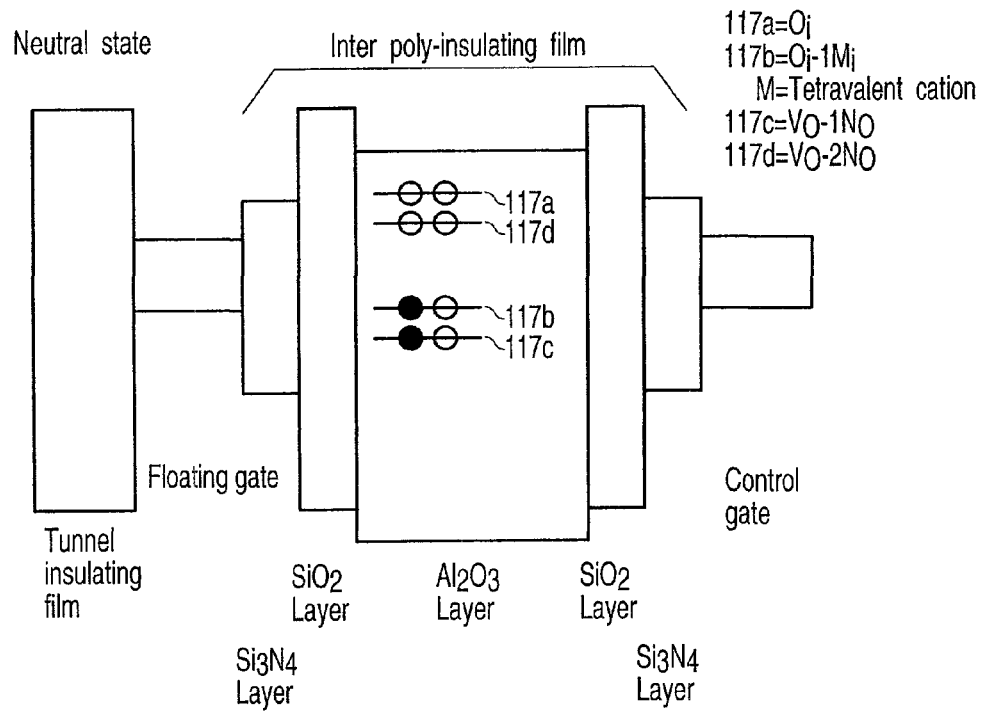
FIG. 27 is a diagram illustrating a charge neutral condition of a floating gate type memory cell according to another embodiment of the present invention.
Figure 28:
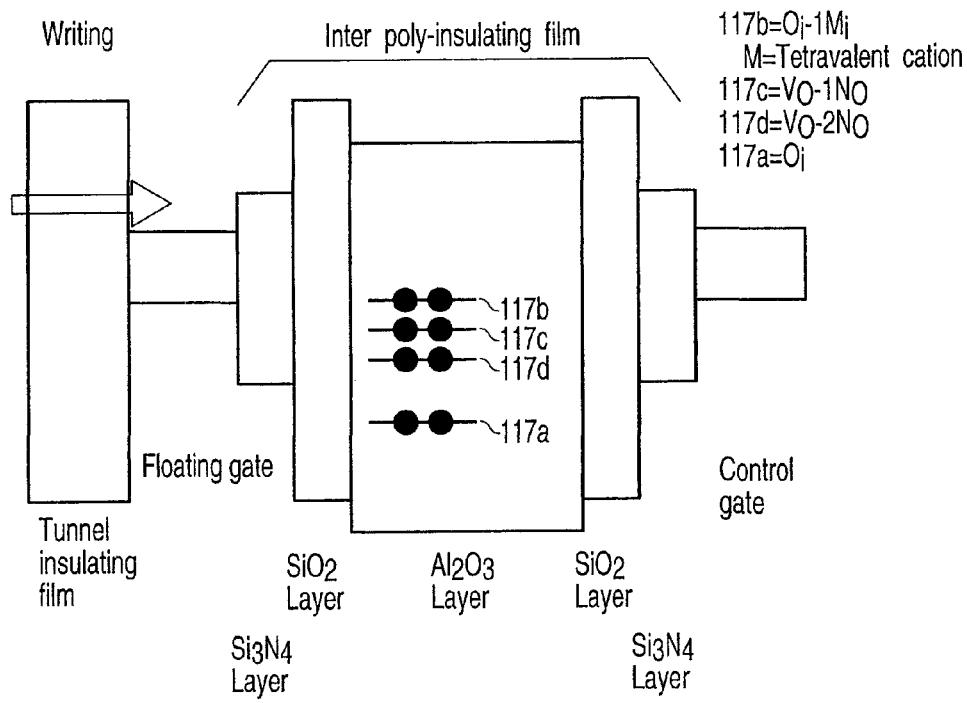
FIG. 28 is a diagram illustrating a condition after writing of a floating gate type memory cell then setting to the flat band condition according to another embodiment of the present invention.
Figure 29:
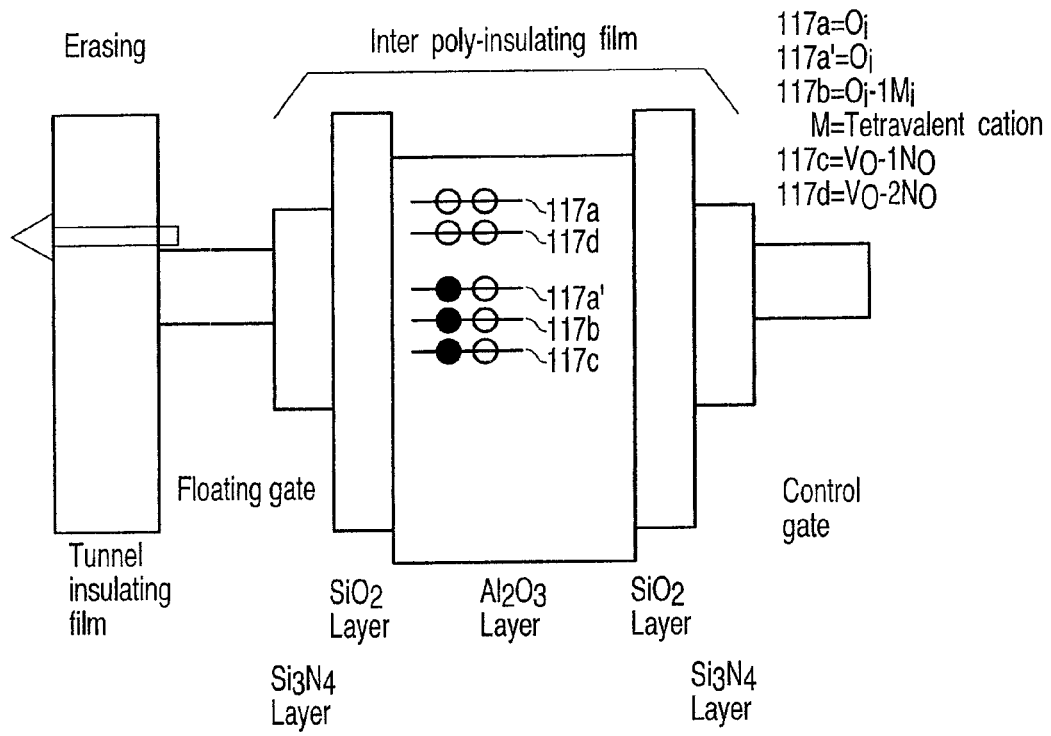
FIG. 29 is a diagram illustrating a condition after erasing of a floating gate type memory cell then setting to the flat band condition according to another embodiment of the present invention.

FIGS. 27 to 29 show a band diagram in a charge neutral condition (FIG. 27), a band diagram wherein the condition has been returned to neutral after the execution of writing operation (FIG. 28) and a band diagram wherein the condition has been returned to neutral after the subsequent execution of erasing operation (FIG. 29), respectively, in a modification example of the second embodiment (corresponding to the aforementioned second aspect) of the present invention wherein electron trap levels (electron unoccupied levels) are created in the vicinity of the middle portion of the band gap of the alumina layer which is formed to constitute a part of the inter-poly insulating film of the FG type memory, thereby making it possible to realize not only a highly-efficient writing operation through the electron traps but also a highly-efficient erasing operation through the injection of holes.

In this case also, in the same mechanism as that explained with reference to FIGS. 24-26, since the defects having an electron occupied levels at around a middle portion of the band gap after trapping electrons is rendered active even to trapping holes to the same degree as that of trapping electrons, it is possible to restore it to nearly the charge neutral condition by simply executing an appropriate erasing operation. More specifically, by adjusting the quantity of trapped electrons by adjusting conditions of both the writing operation and the erasing operation, it is possible to realize a plurality of charge-trapping conditions, thus realizing the multi-valuation of the memory. Further, since it is also possible to erase the residual electron in FIG. 29, i.e. half-occupied (not-doubly-occupied) electron of charge trapping levels in a charge neutral condition by simply applying an excessive erasing operation, it is also possible to realize "over-erasing" which provides a sufficiently large negative threshold voltage at the time of erasing.

Figure 30:
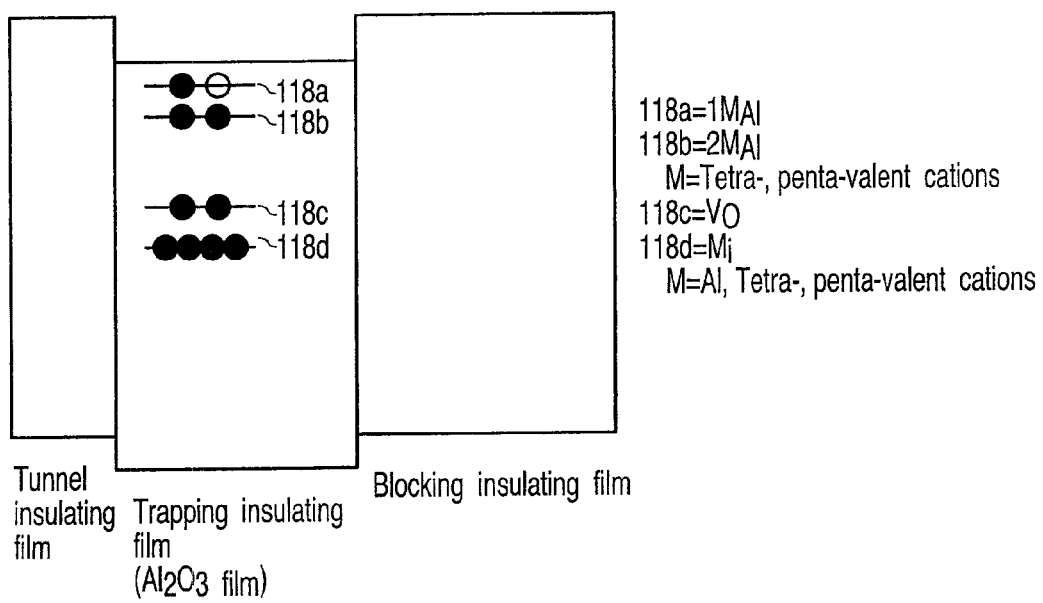
FIG. 30 is a diagram illustrating a charge neutral condition of a MONOS type memory cell according to another embodiment of the present invention.

FIG. 30 shows a band diagram in the neutral condition of charge in one example wherein electron occupied levels of a charge neutral condition are formed in the band gap of the alumina layer which acts as a charge trapping layer of the MONOS type memory according to a third embodiment (corresponding to the aforementioned sixth aspect) of the present invention, thereby realizing "over-erasing" which provides a sufficiently large negative threshold voltage at the time of erasing.

Further, what should be kept in mind herein is that all of the electron occupied levels is not occupied by two electrons in the neutral condition. Because, if all of the levels in the band gap is occupied by two electrons, it would become impossible for the charge trapping layer to trap electron any more at the time of writing operation.

However, it would be needless to pay special attention to this condition. Because, since the electron occupied levels in the band gap are located higher than the valence band maximum and hence are unstable in terms of electron energy, electrons are enabled to be released without fail at a certain ratio according to the law of mass action, thereby defects having the above occupied levels maintain positive charging automatically.

With respect to the interstitial cation however, if an excessive oxidation treatment is applied thereto, all of the interstitial cations can be oxidized completely, so that the electron occupied levels cannot be left in the band gap even though it may contribute to the modulation of the valence band maximum or the conduction band minimum. In this respect, the heat treatment after the formation of the charge trapping layer is required to be limited to a short period of time even if it is performed at a high temperature as in the case of rapid thermal annealing (RTA), or to be performed under controlled oxidation/reduction conditions.

Figure 31:
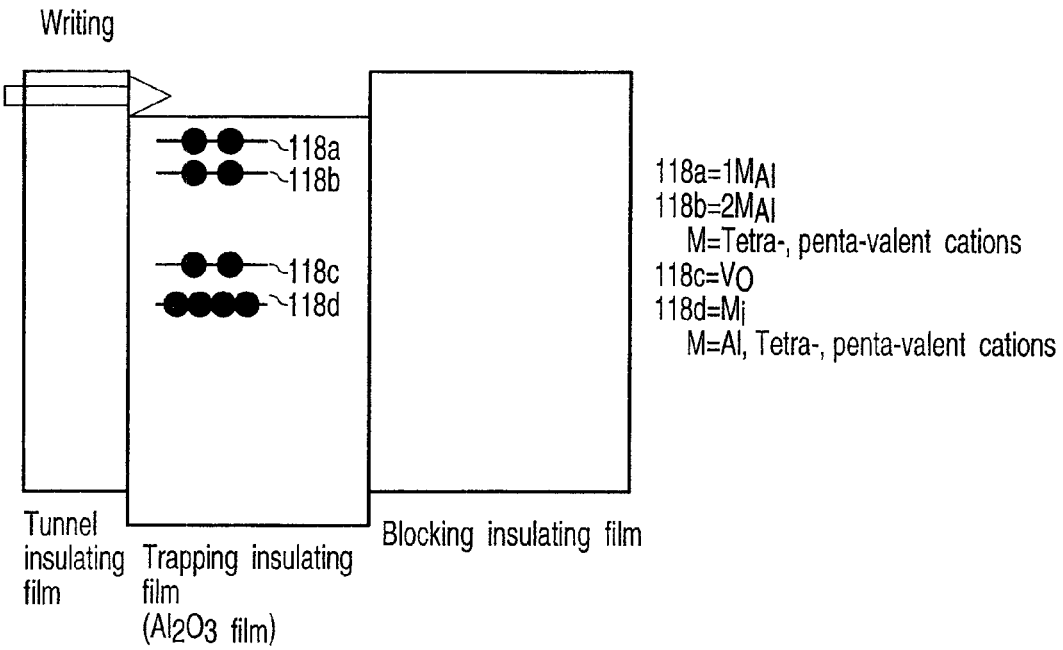
FIG. 31 is a diagram illustrating a condition after writing of a MONOS type memory cell then setting to the flat band condition according to another embodiment of the present invention.

FIG. 31 shows a band diagram wherein the condition has been returned to a neutral after the execution of a writing operation in FIG. 30. In this case, almost all of the defects trap electrons in the charge trapping layer, which has been partially left in an electron unoccupied state.

Figure 32:
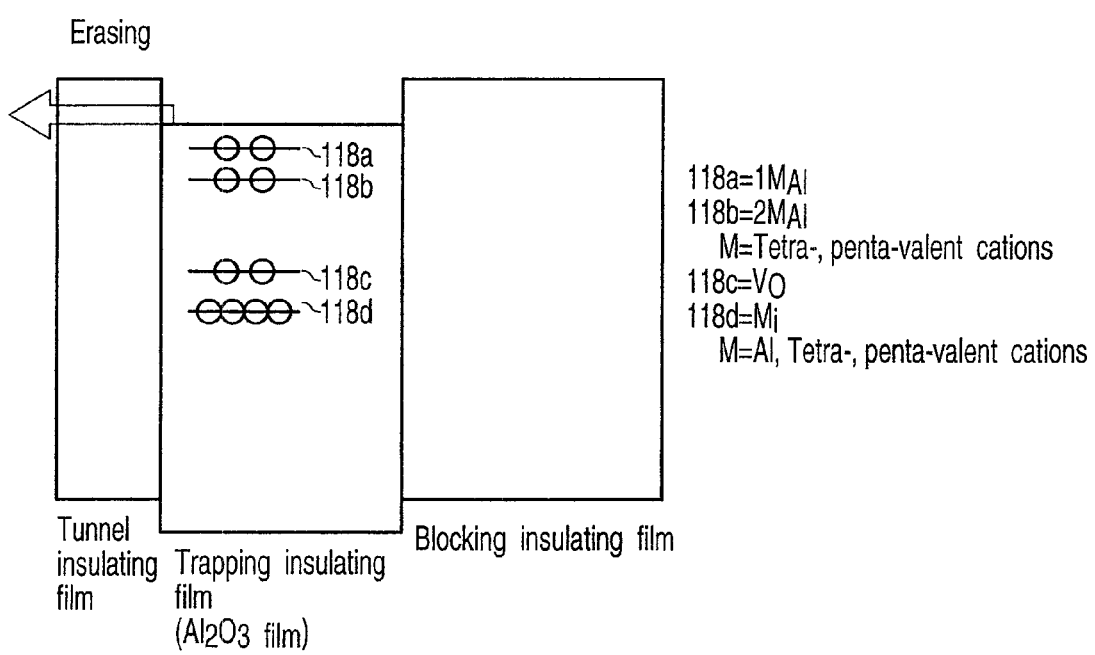
FIG. 32 is a diagram illustrating a condition after erasing of a MONOS type memory cell then setting to the flat band condition according to another embodiment of the present invention.
Figure 33:
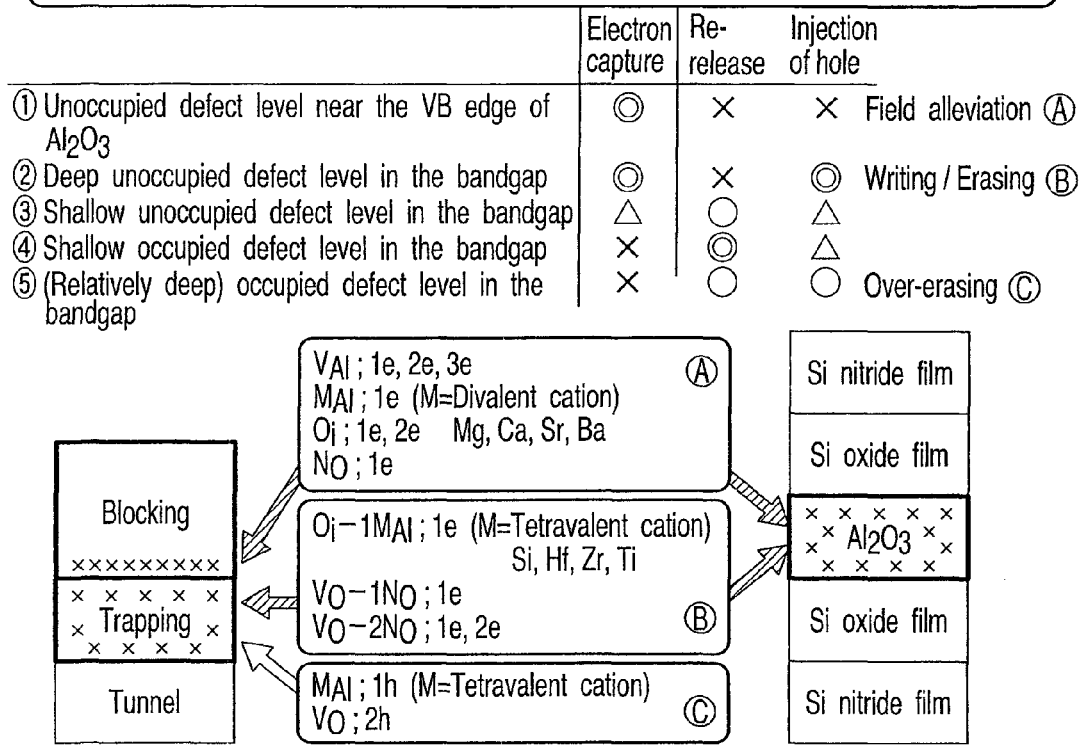
FIG. 33 is a table wherein all embodiments of the present invention are summarized.

FIG. 32 shows a band diagram wherein the condition has been returned to neutral after the execution of an erasing operation in FIG. 31. Since almost all of electrons including excess electron having a high energy in the band gap existing in the charge trapping layer in a neutral condition can be released under the erasing operation, the threshold voltage can be sufficiently shifted to the negative direction.

As explained above, in the case of the MONOS type memory cell according to the third embodiment of the present invention, it is possible to easily realize a distribution of threshold voltage so as to secure Vth>0 under the writing condition and Vth<0 under the erasing condition which are required in the operation of the NAND type flash memory.

In the first to third embodiments of the present invention described above, the explanation thereof is directed to the case where all of the charge trapping layer and the blocking layer are constituted by a single-layer structure. However, the embodiments of the present invention are not limited to such a single-layer structure. It is because the emergence of the charge trapping/detrapping natures of various kinds of defects in relation to the gist of the present invention is not necessarily required to be the single-layer structure. What is only required in the embodiments of the present invention is the inclusion of defects and defect pairs comprising such defects as defined in this specification.

For example, the same kind of alumina films may be used as a base material and one of the alumina films which is accompanied with the aforementioned defects may be sandwiched between a pair of the alumina films which are free from the aforementioned defects, or fine particles or fine crystals accompanied with the aforementioned defects may be dispersed in the alumina film which is free from the aforementioned defects. Alternatively, fine particles or fine crystals formed of an oxide or an oxynitride comprising, as major elements, a cation element and oxygen both required for creating the aforementioned defects may be dispersed in the alumina film which is free from the aforementioned defects, thereby creating desired defects within the alumina film side at the interface of different kinds of film and particles/crystals. It is possible, through the employment of CVD, to impregnate fine particles or crystals having, typically, a diameter of several nanometers into the base insulating material.

The aforementioned embodiments with respect to the charge trapping layer and the blocking layer can be summarized as follows. Namely, depending on the aforementioned three categories and the objects of electric field relaxation, efficient writing/erasing operation and over-erasing operation, optimum combinations of defects can be classified into those shown in the table of FIG. 33.

Based on the foregoing explanation on the various embodiments of the present invention, various examples of the present invention will be explained in detail with reference to FIGS. 34 to 42.

Example 1

Figure 34:
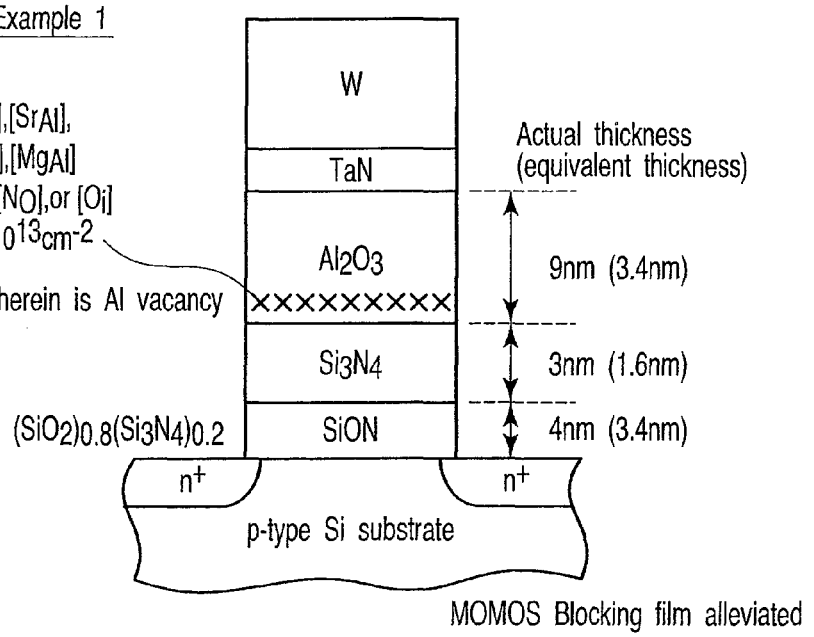
FIG. 34 shows a cross-sectional view illustrating the cell structure according to Example 1.

FIG. 34 illustrates a main portion of the cross-sectional structure of the memory cell according to a first example of the present invention. This first example relates to the blocking layer of a MONOS type memory cell and corresponds to the aforementioned third aspect of the present invention.

A silicon oxynitride film (SiON) is formed, as a tunnel insulating film, in a channel region of a p-type silicon substrate. Further, a silicon nitride film ($Si_3N_4$) is deposited, as a charge trapping layer, on the tunnel insulating film. Then, an alumina film ($Al_2O_3$) is deposited, as a blocking insulating layer, on the silicon nitride film. On this alumina film is deposited tantalum nitride as a control gate electrode. Further, tungsten is deposited, as a conductive film of a low resistant metal, on the resultant structure.

Herein, for the purpose of securing not only the writing/erasing characteristics but also the data retention characteristics, the thickness of the tunnel insulating film (SiON) was set to about 4 nm when the composition of the tunnel insulating film was $(SiO_2)_{0.8} \cdot (Si_3N_4)_{0.2}$. On the other hand, the thickness of the charge trapping layer ($Si_3N_4$) was set to about 3 nm. The thickness of the blocking insulating layer ($Al_2O_3$) was set to about 9 nm. By making use of an Al vacancy ($V_{Al}$), Al site-substituting divalent cation ($M_{Al}$; M=divalent cation (Mg, Ca, Sr, Ba)), oxygen site-substituting nitrogen ($N_O$) or interstitial oxygen ($O_i$), relatively deep electron trap levels (electron unoccupied levels) were created in the band gap of alumina at about $3 \times 10^{13}$ cm$^{-2}$ in area density of defects. The defect-controlled alumina ($Al_2O_3(X)$) layer having the defects created therein is enabled to act as a layer for trapping negative charges, thereby making it possible to relax the electric field at the interfaces located on the opposite ends of the blocking insulating film during the writing/erasing operation of memory cell and to minimize the leakage current.

In this case, the existence of the desired defect levels was confirmed by the analysis of hysteresis of C-V measurement performed on an alumina single layer which was separately created. The procedures for this analysis is reported in detail in a document "K. Nagatomo et al.; Extended Abstract (The 53$^{rd}$ Spring Meeting, 2006); The japan Society of Applied Physics, 25p-V-15". However, since it is important in understanding the gist of the present invention, the procedures for this analysis are set forth as follows.

First of all, the dependency of hysteresis $V_{hys}$ on the film thickness and electric field strength are measured in the C-V measurement. Then, by means of I-V measurement (carrier separation method), the hole current and electron current are measured, separately. Thereafter, a carrier injection quantity $N_{inj}$ is determined from the integration of I-V curve on I. At first, nFET which has a relation of electron current>>hole current is analyzed. It is because, in this nFET, the $V_{hys}$ is thought to be generated mostly due to electron trap. In this analysis, by making use of the electron trap area density $N_e$ and its electron-trapping cross-section $\sigma_e$, the electron density $n_e$ that have been trapped is calculated as follows.

$$n_e = N_e [1 - \exp(-\sigma_e \cdot N_{inj-e})]$$

Then, the location $X_e$ of intersection between the electron injection levels $\Phi_e$, which is determined by the electric field, and the electron trap defect levels $\Phi_{b-e}$, is determined in the direction of film thickness to obtain the $V_{hys}$.

$$V_{hys} = (q \cdot n_e)/(2C_{OX}) \cdot [(T_{Al2O3}^2 - X_e^2)/T_{Al2O3}]$$

By adjusting the electron trap defect levels $\Phi_{b-e}$, the electron trap area density $N_e$ and the electron-trapping cross-section $\sigma_e$ as parameters, fitting is performed so as to make the calculated value of $V_{hys}$ coincide with the measured value. By making use of the results of this fitting (parameters for electron trap level), the analysis is performed likewise on the pFET. By adjusting the hole trap defect levels $\Phi_{b-h}$, the hole trap area density $N_h$ and the hole-trapping cross-section $\sigma_h$ as parameters, fitting is performed so as to reproduce the measured values of both of n-type poly-Si and p-type poly-Si. This process is continued until the fitting is accomplished self-consistently, thereby obtaining the parameters related to the defect levels. By repeating this procedure on n$^+$-poly nFET, n$^+$-poly pFET, p$^+$-poly nFET and p$^+$-poly pFET, it is possible to accurately determine the trap defect level, area density and trapping cross-section of the defects.

Although a silicon oxynitride film was employed as a tunnel insulating film in this example, it is possible to employ a laminate film consisting of a stack of a silicon oxide film/a silicon nitride film/a silicon oxide film (ONO film). The usefulness of the ONO film as a tunnel insulating film is described, for example, in a document "Y. Mitani, JP-A 2006-13003".

Further, the silicon nitride film functioning as the charge trapping layer need not necessarily be $Si_3N_4$ having a stoichiometric composition and hence may be a Si-rich silicon nitride film for the purpose of increasing the in-film electron trap density. Further, a germanium nitride film ($Ge_3N_4$) having similar characteristics to those of $Si_3N_4$ may be employed as the charge trapping layer. The employment of $Ge_3N_4$ as an insulating film for the MIS structure is described in a document "T. Maeda, T. Yasuda, M. Nishizawa, N. Miyata and Y. Morita; 'Ge metal-insulator-semiconductor structure with $Ge_3N_4$ dielectrics by direct nitridation of Ge substrates', Appl. Phys. Lett. 85, 3181 (2004)".

Further, the alumina film employed as a blocking insulating film may be replaced by a film of a laminate structure comprising an alumina film and a film of other materials which are capable of inhibiting the leakage current between the control gate electrode and the charge trapping layer. For example, it is possible to employ various materials, such as lanthanum aluminate ($LaAlO_x$), hafnium aluminate ($HfAlO_x$), hafnium nitride aluminate (HfAlON), aluminium oxynitride (AlON), hafnium silicate ($HfSiO_x$), hafnium nitride silicate (HfSiON), lanthanum-doped hafnium silicate (La-doped $HfSiO_x$), hafnium lanthanum oxide ($HfLaO_x$), etc.

With respect to the metallic material for the control gate electrode, it may be selected by taking account of the work function, specific resistivity, and the reactivity thereof with the blocking insulating film. Therefore, $TaN_x$ may be replaced by various kinds of metallic materials, such as $WN_x$, $TiN_x$, $HfN_x$, $TaSi_xN_y$, $TaC_x$, $WC_x$, $TaSi_xC_yN_z$, Ru, W, $WSi_x$, $NiSi_x$, $CoSi_x$, $PtSi_x$, $NiPt_xSi_y$, etc. With respect to the low resistance metallic layer to be laminated on the control gate electrode also, W may be replaced by $WSi_x$, $NiSi_x$, $MoSi_x$, $TiSi_x$, $CoSi_x$, $PtSi_x$, etc.

With respect to the manufacturing method of the memory cell shown in FIG. 34, the process explained in Reference Example (FIGS. 1-6) can be applied. In the following, only the process which differs from that of Reference Example will be explained.

With respect to the oxynitride film of the tunnel insulating film, it can be created by forming a silicon oxide film as a base film and then by subjecting the silicon oxide film to a plasma nitriding treatment. The silicon nitride film of the charge trapping layer can be formed by means of a CVD method using, as source gases, dichlorosilane ($SiH_2Cl_2$) and ammonia ($NH_3$) for example. The alumina film to be used as the blocking layer can be formed by means of successive CVD or ALD (Atomic Layer Deposition) wherein trimethyl aluminum ($Al(CH_3)_3$), ammonia ($NH_3$) and oxygen ($O_2$) are employed or trimethyl aluminum ($Al(CH_3)_3$) and water ($H_2O$) are employed as source gases. The TaN/W laminate film to be used as the control gate electrode can be created by the procedure wherein TaN is formed at first by means of a CVD method using $Ta(N(CH_3)_2)_5$ or using $Ta(N(CH_3)_2)_5$ and $NH_3$ as source gases and then W is deposited thereon by means of a CVD method using $WF_6$ as a source gas.

There are four methods with respect to the step of introducing defects into the alumina film as described below. At first, with respect to the Al vacancy ($V_{Al}$), the H of Al—OH bond that has been created from dissociated H atoms in the step of CVD of the aforementioned alumina film or from the H that has been derived from $H_2O$ is eliminated in a subsequent heat treatment to be performed in $N_2$ atmosphere and at a temperature ranging from 450° C. to 900° C. As a result of this step, although an Al—O—Al bond may be partially formed due to dehydrating condensation, at the site where tensile strain is greatly imposed immediately after the formation of film, it is impossible to create this Al—O—Al bond, resulting in the formation of an Al vacancy. Incidentally, a very small amount of oxygen, i.e. 0.1-5% in flow ratio or partial pressure ratio of oxygen may be incorporated into $N_2$ gas in this step. With respect to the Al site-substituting divalent cation ($M_{Al}$; M=divalent cation (Mg, Ca, Sr, Ba)), it can be created by using, as a source gas, a material which is suited for the vapor pressure and selected from the group consisting of HFA complex, FOD complex, PPM complex, DPM complex, AcAc complex and β-diketone complex of Mg, Ca, Sr or Ba, and then by feeding the gas mixture at a flow ratio of 0.1-10% together with the trimethyl aluminum gas. With respect to Ba for example, it is possible to improve the sublimating property and stability of source gas by making use of $Ba(DPM)_2(DPM)(Add)_2$ (Add=DPM, THF, Phen), which is consisted of a dipivloyl methane (DPM) complex, $Ba(DPM)_2$ and an adduct selected from DPM, tetrahydrofuran (THF) and phenanthroline. Incidentally, including the case of forming a film by a method other than CVD, after the formation of the alumina film to a partial or full thickness, a very thin film of the aforementioned divalent metals or their oxides may be deposited by means of sputtering or these materials may be introduced into the alumina film by means of ion implantation. With respect to the oxygen site-substituting nitrogen ($N_O$), nitrogen may be introduced in the same manner as using ammonia gas in the aforementioned step of CVD. Including the cases where ammonia is not employed or where the formation of the film is performed by a method other than CVD, after the formation of the alumina film to a partial or full thickness, nitrogen may be introduced into the alumina film by means of plasma nitriding using a plasma of such gases as $N_2$, $NH_3$, NO, $N_2O$, etc. From the viewpoint of a depth profile of nitrogen, if it is desired to introduce nitrogen into a region of the alumina film which is close to the substrate, the plasma treatment should be performed after the thin alumina film has been partially deposited. With respect to the interstitial oxygen ($O_i$), since it would become more difficult to introduce the interstitial oxygen into alumina film as the density of alumina becomes higher, i.e. the number of defects becomes smaller, it would be desirable to employ the plasma oxidation method in introducing the oxygen as interstitials into the alumina film. However, in the case where a Hf-based oxide or a Zr-based oxide (including silicate and aluminate) is laminated in contact with the upper surface of alumina film, the oxygen atoms can be easily introduced into the alumina film since the oxygen molecule is enabled to catalytically dissociate, generating atomic oxygen in these oxides, silicates or aluminates.

It should be appreciated that the manufacturing methods shown herein illustrate only limited examples, and the memory cell of FIG. 34 may be formed by any other manufacturing method. For example, the oxynitride film of the tunnel insulating film may be formed by making use of high-temperature/low pressure oxidation after the formation of a silicon nitride film constituting a base material. The silicon nitride film may be obtained, for example, by the nitriding of a Si substrate using dilute ammonia ($NH_3$). As for the method of forming a silicon nitride film which is minimal in defects, it is described in JP Patent No. 3887364. With respect to the source gases to be used in the CVD method, the aforementioned gases may be replaced by other appropriate gases. Further, the CVD may be replaced by sputtering. For example, the alumina film which is capable of functioning as the blocking insulating film may be formed by means of reactive sputtering using a Al metal target. The TaN film of the TaN/W laminate film which is capable of functioning as the control gate electrode can be formed by way of a sequential process using sputtering (including a reactive sputtering method) using a tantalum target. Further, each of the aforementioned layers may be formed by means of a vapor deposition method, a laser ablation method, an MBE method, or a combination of these methods other than the aforementioned CVD method and sputtering method.

Modification Example of Example 1

Figure 35:
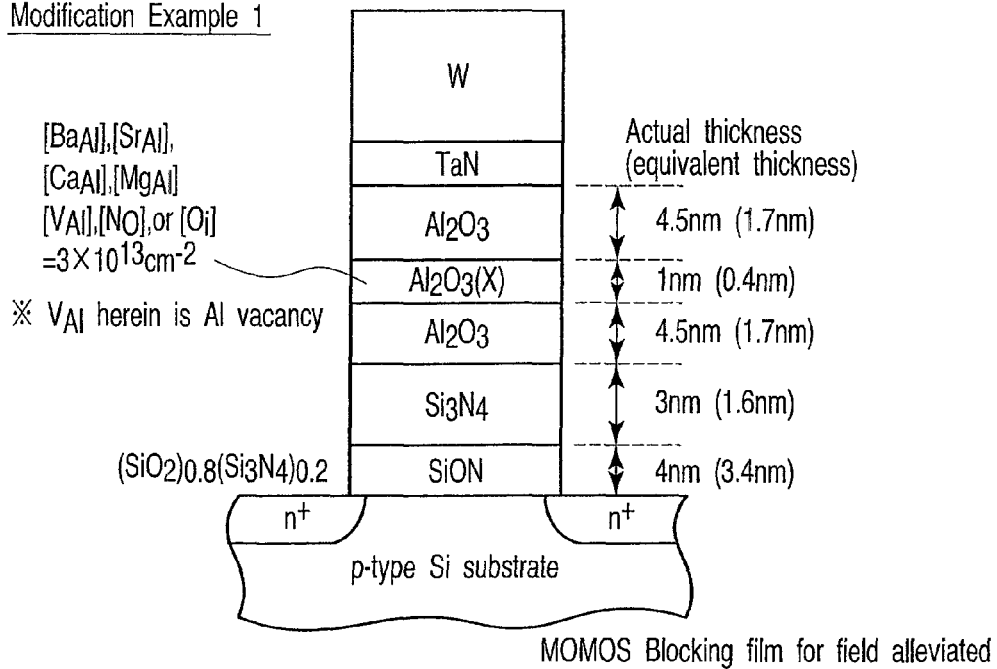
FIG. 35 shows a cross-sectional view illustrating a modification example of the cell structure of Example 1.

FIG. 35 illustrates a main portion of the cross-sectional structure of the memory cell according to a modification example of Example 1 (corresponding to the fourth aspect of the present invention).

This modification example of Example 1 differs from Example 1 in the respect of only the features of the blocking insulating film. This blocking insulating film consists of three layers, i.e. an alumina layer ($Al_2O_3$), an alumina layer accompanied with defects ($Al_2O_3(X)$) and an alumina layer ($Al_2O_3$). The thickness of the alumina film constituting the lower layer and the upper layer of the blocking insulating film was set to about 4.5 nm. The thickness of the alumina film accompanied with defects was set to about 1 nm. This $Al_2O_3$(X) layer is enabled to act as a layer for trapping a negative charge, so that this layer is capable of relaxing the electric field at the interfaces of the opposite ends of the blocking insulating film at the time of writing/erasing operation of memory cell, and therefore minimizing the leakage current.

As for the manufacturing method of the alumina layer accompanied with defects ($Al_2O_3(X)$), the same method as described in Example 1 can be employed. With respect to the Al vacancy ($V_{Al}$), which is one of the steps for introducing defects into the alumina film, the following method may be employed other than that shown in Example 1. One or plural kinds of rare gases selected from the group consisting of He, Ne, Ar, Kr and Xe are employed as a carrier gas or a diluting gas in the step of CVD for the formation of the alumina film, thereby making it possible to enable the alumina film to contain 1-10 atomic % of a rare gas atom. The rare gas atom may become a steric hindrance not only against the cation site but also against the anion site, thereby obstructing the formation of the network of alumina. The defects of the anion site (i.e. oxygen vacancy) can be compensated by releasing these rare gases out of the film by performing a heat treatment after the formation of film and performing subsequently an oxidation heat treatment in order to fill the anion vacancy. By this process, only the cation site defect (i.e. Al defect) is permitted to remain in the film. As for the rare gas, it is preferable to employ He, Ne, Ar or Kr. Among them, the employment of He, Ne or Ar is more preferable.

It should be appreciated that the manufacturing method shown in Example 1 illustrates only one example, so that the memory cell of FIG. 35 may be formed by any other manufacturing methods. For example, the source gases to be used in the CVD method may be replaced by other appropriate source gases. Further, the sputtering method may be replaced by the CVD method. Further, each of the aforementioned layers may be formed by means of a vapor deposition method, a laser ablation method, an MBE method, or a combination of these methods other than the aforementioned CVD method and sputtering method.

Example 2

Figure 36:
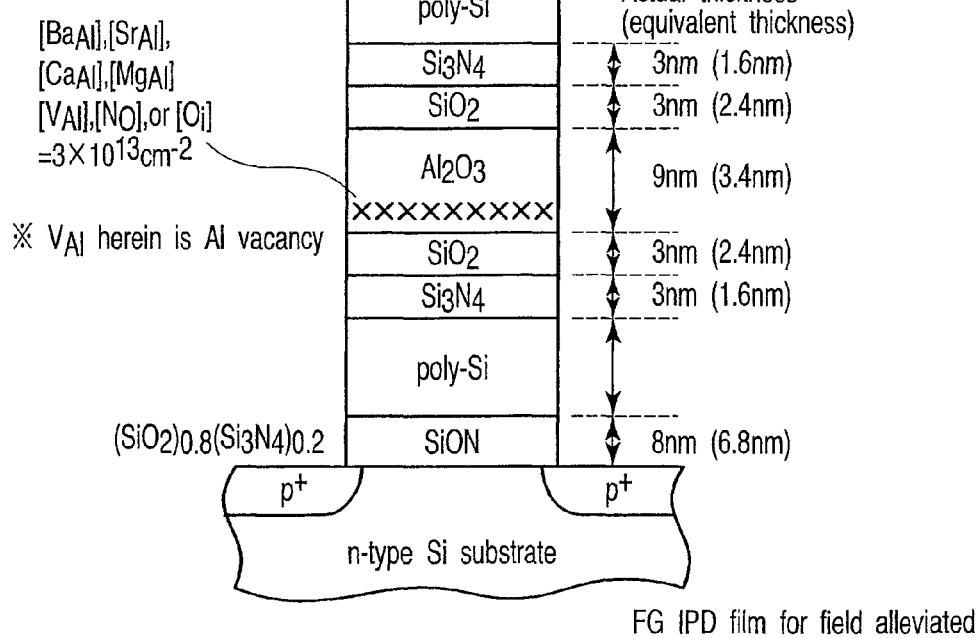
FIG. 36 shows a cross-sectional view illustrating the cell structure according to Example 2.

FIG. 36 illustrates a main portion of the cross-sectional structure of the memory cell according to a second example of the present invention. This Example 2 shows one example wherein reformed alumina is applied to the blocking layer of an FG type memory cell and corresponds to the aforementioned fifth aspect of the present invention.

A silicon oxynitride film (SiON) is formed, as a tunnel insulating film, in a channel region of an n-type silicon substrate. A polysilicon floating gate electrode is formed, as a charge trapping layer, on the tunnel insulating film. Further, a silicon nitride film ($Si_3N_4$) and a silicon oxide film ($SiO_2$) are successively deposited on the polysilicon floating gate electrode. Thereon, an alumina film ($Al_2O_3$) is deposited, as an another charge trapping layer. On this alumina film a silicon oxide film ($SiO_2$) and a silicon nitride film ($Si_3N_4$) are successively deposited. Furthermore, polysilicon is deposited thereon as a control gate electrode. Thereon, a conductive film made of a lower resistance metal than polysilicon is deposited.

Herein, for the purpose of placing the highest priority on the control of stress-induced leakage current (SILC), the thickness of the tunnel insulating film (SiON) was set to about 8 nm, especially when the composition of the tunnel insulating film was $(SiO_2)_{0.8} \cdot (Si_3N_4)_{0.2}$. This film thickness may be reduced to about 4 nm depending on the improvement in quality of the tunnel insulating film. Further, the so-called inter-poly insulating film, which is sandwiched between the polysilicon floating gate electrode and the upper control electrode, is formed of a 5-ply structure, wherein the $Si_3N_4$ film functioning as a low band gap layer was set to about 3 nm in film thickness, and the $SiO_2$ film functioning as a high band gap layer was set to about 3 nm in film thickness. The thickness of the $Al_2O_3$ film functioning as the charge trapping layer which was interposed therebetween was set to about 9 nm. By making use of an Al vacancy ($V_{Al}$), Al site-substituting divalent cation ($M_{Al}$; M=divalent cation (Mg, Ca, Sr, Ba)), oxygen site-substituting nitrogen ($N_O$) or interstitial oxygen ($O_i$), relatively deep electron trap levels (electron unoccupied levels) were created in the band gap of alumina at about $3 \times 10^{13}$ $cm^{-2}$ in area density of defects. The defect-controlled alumina ($Al_2O_3(X)$) layer having the defects created therein is enabled to act as a layer for trapping negative charges, thereby making it possible to relax the electric field at the interfaces located on the opposite ends of the blocking insulating film during the writing/erasing operation of a memory cell and to minimize the leakage current.

With respect to the manufacturing method of the memory cell shown in FIG. 36, the process explained in Example 1 and Modification example of Example 1 can be applied as it is as far as the portion related to the defect control of alumina film is concerned. In the following, only the process which differs from that of Example 1 will be explained.

With respect to the laminate film formed on the floating gate electrode and including the silicon nitride film ($Si_3N_4$) and the silicon oxide film ($SiO_2$), at first, $Si_3N_4$ is created by means of the ALD method using dichlorosilane ($SiH_2Cl_2$) and ammonia ($NH_3$). Then, $SiO_2$ is sequentially formed by means of ALD using $SiH_2Cl_2$ and ozone ($O_3$). On this laminate film a defect-controlled alumina film ($Al_2O_3$) is deposited as a charge trapping layer. On this alumina film are successively deposited $SiO_2$ and $Si_3N_4$ by means of the same deposition method.

Although a silicon oxynitride film was employed as a tunnel insulating film in this example, it is possible to employ a laminate film consisting of a silicon oxide film/a silicon nitride film/a silicon oxide film (ONO film). Further, the silicon oxynitride film of the tunnel insulating film may be formed by making use of high-temperature/low pressure oxidation after the formation of a silicon nitride film constituting a base material. The silicon nitride film may be obtained, for example, by the nitriding of a Si substrate using dilute ammonia ($NH_3$). As for the method of forming a silicon nitride film which is minimal in defects, it is described in JP Patent No. 3887364. It is also possible to employ a tunnel insulating film having fine silicon crystals introduced into the tunnel oxide film.

With respect to the low resistance metallic layer to be laminated on the control gate electrode also, W may be replaced by $WSi_x$, $NiSi_x$, $MoSi_x$, $TiSi_x$, $CoSi_x$, $PtSi_x$, etc.

Figure 38:
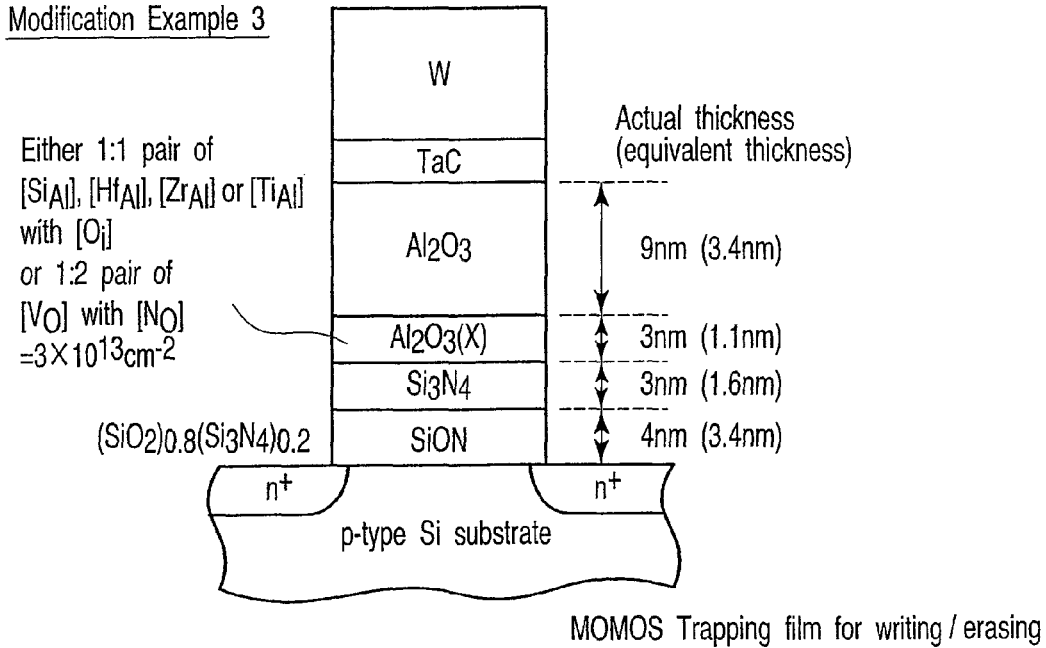
FIG. 38 shows a cross-sectional view illustrating a modification example of the cell structure of Example 3.

It should be appreciated that the manufacturing method shown herein illustrates only one example, so that the memory cell of FIG. 38 may be formed by any other manufacturing method. For example, the CVD method and the sputtering method may be interchanged as desired. Further, each of the aforementioned layers may be formed by means of a vapor deposition method, a laser ablation method, an MBE method, or a combination of these methods other than the aforementioned CVD method and sputtering method.

Example 3

A third example of the present invention is directed to one example wherein reformed alumina is applied to the charge trapping layer of a MONOS type memory cell and corresponds to the aforementioned first aspect of the present invention.

Figure 37:
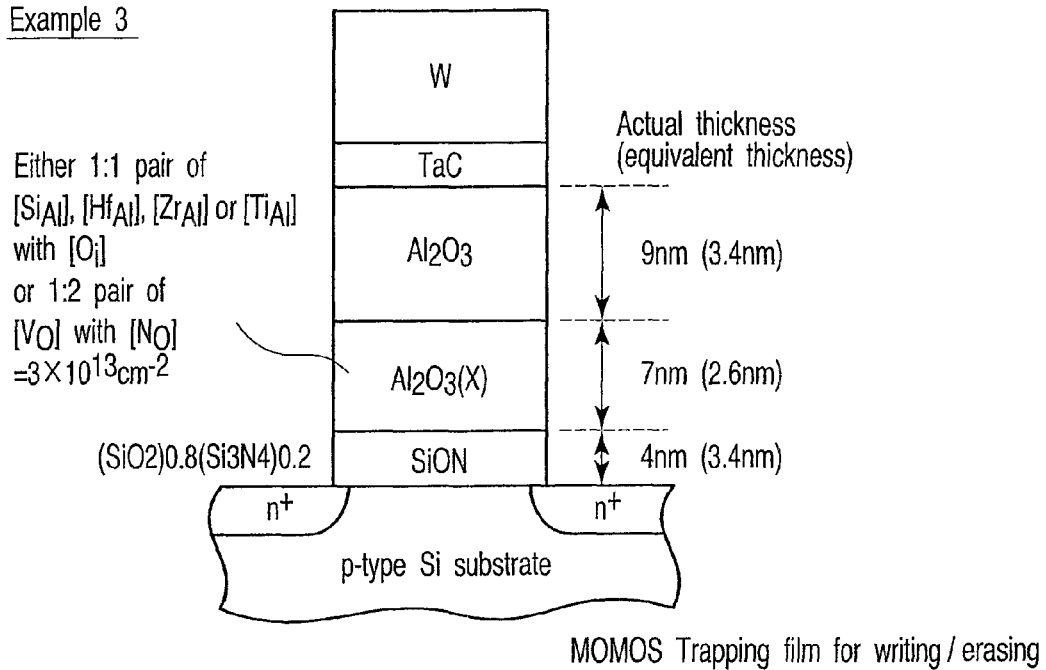
FIG. 37 shows a cross-sectional view illustrating the cell structure according to Example 3.

FIG. 37 illustrates a main portion of the cross-sectional structure of the memory cell according to this example.

A silicon oxynitride film (SiON) is formed, as a tunnel insulating film, in a channel region of a p-type silicon substrate. Further, an alumina film ($Al_2O_3$) is deposited on the tunnel insulating film. Then, an alumina film ($Al_2O_3$) is deposited thereon as a blocking insulating layer. On this alumina film is deposited tantalum carbide as a control gate electrode. Further, tungsten is deposited, as a conductive film of a lower resistant metal, on the resultant structure.

Herein, for the purpose of securing not only the writing/erasing characteristics but also the data retention characteristics, the thickness of the tunnel insulating film (SiON) was set to about 4 nm, especially when the composition of the tunnel insulating film was $(SiO_2)_{0.8} \cdot (Si_3N_4)_{0.2}$. On the other hand, the thickness of the charge trapping layer ($Al_2O_3$) was set to about 7 nm. The thickness of the blocking insulating film ($Al_2O_3$) was set to about 9 nm. By making use of either a 1:1 complex of an interstitial oxygen ($O_i$) and an Al site-substituting tetravalent cation (i.e. a defect pair ($O_i$-$1M_{Al}$; M=Si, Zr, Hf, Ti)), or a 1:1-2 complex of an oxygen vacancy ($V_O$) and oxygen site-substituting nitrogen ($N_O$), electron trap levels (electron unoccupied levels) were created at nearly a middle of the band gap of alumina at about $3 \times 10^{13}$ $cm^{-2}$ in area density of defects. Due to this defect-controlled alumina ($Al_2O_3(X)$) layer having the defects created therein, it is made possible to perform, with a high efficiency, the writing operation through the electron trapping as well as the erasing operation through the hole injection. Further, since it is also possible to erase the half-occupied (not-doubly-occupied) electron of charge trapping levels in a charge neutral condition by simply applying an excessive erasing operation, it is also possible to realize "over-erasing" which provides a sufficiently large negative threshold voltage under the erasing condition.

The alumina film to be used as the charge trapping layer can be formed by means of successive CVD or ALD (Atomic Layer Deposition) wherein trimethyl aluminum ($Al(CH_3)_3$), ammonia ($NH_3$) and oxygen ($O_2$) are employed or trimethyl aluminum ($Al(CH_3)_3$) and water ($H_2O$) are employed as source gases. With respect to the process of introducing defects into this alumina film, two examples thereof will be described as follows.

First of all, with respect to the complex of an interstitial oxygen ($O_i$) and an Al site-substituting tetravalent cation ($M_{Al}$) (i.e. a defect pair ($O_i$-$1M_{Al}$; M=Si, Zr, Hf, Ti)), it was created by making use of a source gases containing a desired cation selected from the group consisting of $SiH_4$, $SiH_2(C_2H_5)_2$, $Hf(OC(CH_3)_3)_4$, $Zr(OC(CH_3)_3)_4$ and $Ti(OC(CH_3)_3)_4$ and by adding the selected gas at a flow rate ratio or a partial pressure ratio of 0.1-15% in the step of CVD of alumina. In order to promote the generation of the interstitial oxygen ($O_i$), it would be effective to incorporate ozone ($O_3$) in the gas. Since it would become more difficult to introduce the interstitial oxygen into the alumina film as the density of alumina becomes higher, i.e. the number of defects becomes smaller, it would be desirable to employ the plasma oxidation method in introducing nitrogen into the alumina film. However, in the case where a Hf-based oxide or a Zr-based oxide (including silicate and aluminate) is laminated in contact with the upper surface of alumina film, interstitial oxygen atoms can be easily introduced into the alumina film since the oxygen molecule in these oxides is enabled to catalytically dissociate to thereby generate atomic oxygen in these oxides, silicates or aluminates. Incidentally, including the case of forming a film by a method other than CVD, after the formation of the alumina film to a partial or full thickness, a very thin film of the aforementioned tetravalent cationic metals or oxides or oxynitrides may be deposited by means of sputtering or these materials may be introduced into the alumina film by means of ion implantation.

With respect to the complex of oxygen vacancy ($V_O$) and oxygen site-substituting nitrogen ($N_O$), i.e. a defect pair ($V_O$-$nN_O$; (n=1, 2)), nitrogen can be introduced in the same manner as using ammonia gas in the aforementioned step of CVD. Including the cases where ammonia is not employed or where the formation of a film is performed by a method other than CVD, after the formation of the alumina film to a partial or full thickness, nitrogen may be introduced into the alumina film by means of plasma nitridation using a plasma of such gases as $N_2$, $NH_3$, NO, $N_2O$, etc. From the viewpoint of a depth profile of nitrogen, if it is desired to introduce nitrogen into a region of the alumina film which is close to the substrate, the plasma treatment should be performed after the thin alumina film has been partially deposited.

Further, the alumina film employed as the charge trapping layer may be replaced by a film of a laminate structure including an alumina film and a film of other materials which are capable of atoms the generation of interstitial oxygen as described above. For example, it is possible to employ various materials, including lanthanum aluminate ($LaAlO_x$), hafnium oxide ($HfO_2$), hafnium aluminate ($HfAlO_x$), hafnium nitride aluminate (HfAlON), aluminium oxynitride (AlON), hafnium silicate ($HfSiO_x$), hafnium nitride silicate (HfSiON), lanthanum-doped hafnium silicate (La-doped $HfSiO_x$), hafnium lanthanum oxide ($HfLaO_x$), and zirconium-based materials which can be derived by substituting Zr for Hf in the above-described hafnium-based materials, etc. With respect to the source gases to be employed in the CVD method, it is possible to employ an amine-based gas such as $Zr[N(C_2H_5)_2]_4$, $Zr[N(CH_3)_2]_4$, $Zr[N(C_2H_5)CH_3]_4$, $Hf[N(C_2H_5)_2]_4$, $Hf[N(CH_3)_2]_4$, $Hf[N(C_2H_5)CH_3]_4$, etc. It is also possible to employ other kinds of source gases in place of the above-described gases.

With respect to the metallic material for the control gate electrode, it may be selected by taking account of the work function, the specific resistivity and the reactivity thereof with the blocking insulating film. Therefore, $TaN_x$ may be replaced by various kinds of metallic materials, such as $TaN_x$, $WN_x$, $TiN_x$, $HfN_x$, $TaSi_xN_y$, $TaC_x$, $WC_x$, $TaSi_xC_yN_z$, Ru, W, $WSi_x$, $NiSi_x$, $CoSi_x$, $PtSi_x$, $NiPt_xSi_y$, etc. With respect to the low resistance metallic layer to be laminated on the control gate electrode also, W may be replaced by $WSi_x$, NiSix, MoSix, $TiSi_x$, $CoSi_x$, etc.

Modification Example of Example 3

This modification example of Example 3 shows one example wherein reformed alumina is applied to the charge trapping layer of the MONOS type memory cell and corresponds to the aforementioned first aspect of the present invention. FIG. 38 illustrates a main portion of the cross-sectional structure of the memory cell according to the modification example of Example 3.

This modification example of Example 3 differs from Example 3 in the respect of only the features of the charge trapping film. This charge trapping film is formed of a 2-ply laminate structure formed of $Si_3N_4$ and an alumina layer accompanied with controlled defects ($Al_2O_3(X)$). The film thickness of these films was set to about 3 nm, respectively. In this defect-controlled $Al_2O_3(X)$, electron trap levels (electron unoccupied levels) were created at nearly a middle of the band gap of alumina at about $3 \times 10^{13}$ cm$^{-2}$ in area density of defects by making use of either a 1:1 complex of an interstitial oxygen ($O_i$) and an Al site-substituting tetravalent cation (i.e. a defect pair ($O_i$-$1M_{Al}$; M=Si, Zr, Hf, Ti)), or a 1:1-2 complex of an oxygen vacancy ($V_O$) and oxygen site-substituting nitrogen(s) ($N_O$). Due to this defect-controlled alumina ($Al_2O_3(X)$) layer having the defects created therein, it is made possible to perform, with a high efficiency, the writing operation through the electron trapping as well as the erasing operation through the hole injection.

The process that differs from that of Example 3 is a step of forming a silicon nitride film on the tunnel insulating film. Herein, the silicon nitride film can be formed by making use of the CVD method using, as source gases, dichlorosilane ($SiH_2Cl_2$) and ammonia ($NH_3$). The manufacturing method of the alumina layer ($Al_2O_3(X)$) accompanied with defects is the same as described in Example 3. The manufacturing method shown in Example 3 is simply one example, so that the memory cell of FIG. 38 may be created by any other manufacturing method. For example, with respect to the source gases to be employed in the CVD method, it is possible to employ amine-based gases such as $Zr[N(C_2H_5)_2]_4$, $Zr[N(CH_3)_2]_4$, $Zr[N(C_2H_5)CH_3]_4$, $Hf[N(C_2H_5)_2]_4$, $Hf[N(CH_3)_2]_4$, $Hf[N(C_2H_5)CH_3]_4$, etc. It is also possible to employ other kinds of source gases in place of the above-described gases.

Further, each of the aforementioned layers may be formed by means of a vapor deposition method, a laser ablation method, an MBE method, or a combination of these methods other than the aforementioned CVD method and sputtering method.

Example 4

A fourth example of the present invention is directed to one example wherein reformed alumina is applied to the charge trapping layer of a MONOS type memory cell and corresponds to the aforementioned first aspect of the present invention. In this case, fine particles or fine crystals made of/containing of tetravalent cation elements such as Si, Hf, Zr or Ti are formed in the alumina film which is employed as the charge trapping layer. Due to the creation of the fine particles/crystals, i.e. precipitates, it is possible to increase the contact area of the interface between the alumina constituting a matrix phase and precipitates containing a high concentration of tetravalent cation and to expect the effects of promoting, through an interface reaction, the reaction of creating a 1:1 complex of an interstitial oxygen ($O_I$) and an Al site-substituting tetravalent cation ($M_{Al}$), i.e. a defect pair ($O_I$-$1M_{Al}$; M=Si, Zr, Hf, Ti).

Figure 39:
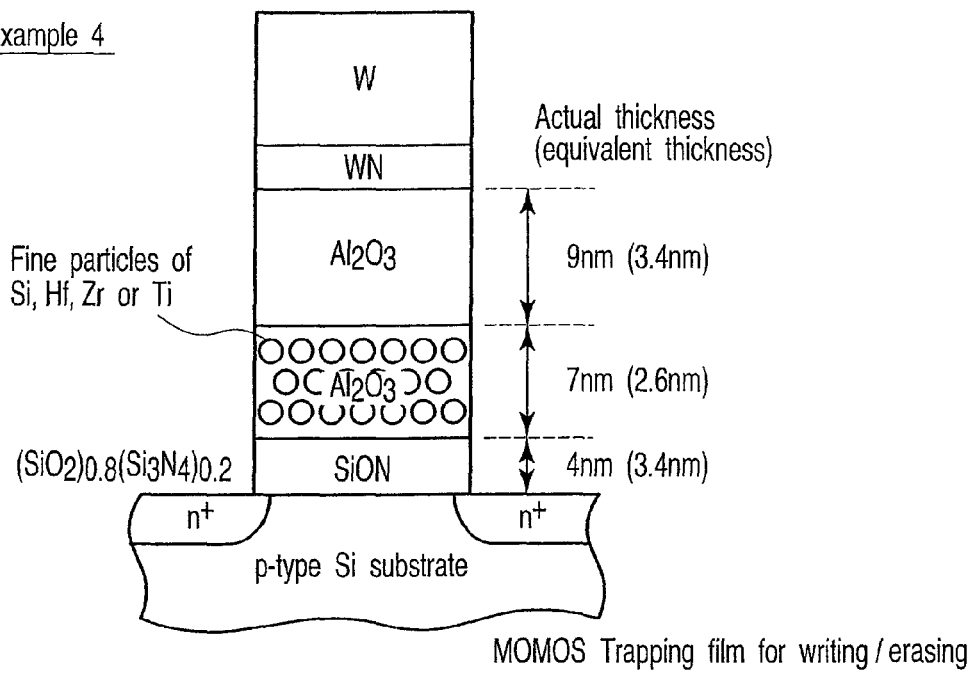
FIG. 39 shows a cross-sectional view illustrating the cell structure according to Example 4.

FIG. 39 illustrates a main portion of the cross-sectional structure of the memory cell according to this example.

An silicon oxynitride film (SiON) is formed, as a tunnel insulating film, in a channel region of a p-type silicon substrate. Further, an alumina film ($Al_2O_3$) having defects introduced therein and functioning as the charge trapping layer is deposited on the tunnel insulating film. Then, an alumina film ($Al_2O_3$) is deposited thereon as a blocking insulating layer. On this alumina film is deposited tungsten nitride as a control gate electrode. Further, tungsten is deposited, as a conductive film of a low resistant metal, on the resultant structure.

Herein, for the purpose of securing not only the writing/erasing characteristics but also the data retention characteristics, the thickness of the tunnel insulating film (SiON) was set to about 4 nm, especially when the composition of the tunnel insulating film was $(SiO_2)_{0.8}$-$(Si_3N_4)_{0.2}$. On the other hand, the thickness of the charge trapping layer ($Al_2O_3$) was set to about 7 nm. The thickness of the blocking insulating film ($Al_2O_3$) was set to about 9 nm. Fine particles or fine crystals made of/containing of tetravalent cation elements such as Si, Hf, Zr or Ti are embedded in the alumina film employed as the charge trapping layer. Due to the creation of the fine particles/crystals, i.e. precipitates, it becomes possible to enable the substitution reaction between Al atoms in the alumina constituting a matrix phase and the tetravalent cation atoms in the precipitates to easily take place and to create, at a high concentration, the 1:1 complex of an interstitial oxygen and an Al site-substituting tetravalent cation, i.e. a defect pair ($O_I$-$1M_{Al}$; M=Si, Zr, Hf, Ti). As a result, electron trap levels (electron unoccupied levels) were created at nearly a middle of the band gap of alumina at about $8 \times 10^{13}$ $cm^{-2}$ in area density of defects. With respect to the electron trap levels (electron unoccupied levels) created at nearly a middle of the band gap of alumina due to the complex of an oxygen vacancy ($V_O$) and oxygen site-substituting nitrogen(s) ($N_O$), i.e. a defect pair ($V_O$-$nN_O$; (n=1, 2)), the electron trap levels were created, in the same manner as in the case of Example 3 or the modification example thereof, at about $3 \times 10^{13}$ $cm^{-2}$ in area density of defects. Due to this defect-controlled alumina ($Al_2O_3(X)$) layer having the defects created therein, it is made possible to perform, with a high efficiency, the writing operation through the electron trapping as well as the erasing operation through the hole injection. Further, since it is also possible to erase the half-occupied (not-doubly-occupied) electron of charge trapping levels in a charge neutral condition by simply applying an excessive erasing operation, it is also possible to realize "over-erasing" which provides a sufficiently large negative threshold voltage under the erasing condition.

Further, the alumina film employed as the charge trapping layer may be replaced by a film of a laminate structure comprising an alumina film and a film of other materials which are capable of promoting the generation of interstitial oxygen atoms as described above. For example, it is possible to employ various materials, including lanthanum aluminate ($LaAlO_x$), hafnium oxide ($HfO_2$), hafnium aluminate ($HfAlO_x$), hafnium nitride aluminate (HfAlON), aluminium oxynitride (AlON), hafnium silicate ($HfSiO_x$), hafnium nitride silicate (HfSiON), lanthanum-doped hafnium silicate (La-doped $HfSiO_x$), hafnium lanthanum oxide ($HfLaO_x$), zirconium-based materials which can be derived by substituting Zr for Hf in the above-described hafnium-based materials, etc.

Further, the alumina film employed as a blocking insulating film may be replaced by various materials, including aluminum oxynitride (AlON), hafnia ($HfO_2$), hafnium aluminate ($HfAlO_x$), hafnium nitride aluminate (HfAlON), hafnium silicate ($HfSiO_x$), hafnium nitride silicate (HfSiON), lanthanum-doped hafnium silicate (La-doped $HfSiO_x$), hafnium lanthanum oxide ($HfLaO_x$), lanthanum aluminate ($LaAlO_x$), etc.

With respect to the metallic material for the control gate electrode, it may be selected by taking account of the work function and the reactivity thereof with the blocking insulating film. Therefore, $TaN_x$ may be replaced by various kinds of metallic materials, such as $WN_x$, $TiN_x$, $HfN_x$, $TaSi_xN_y$, $TaC_x$, $WC_x$, $TaSi_xC_yN_z$, Ru, W, $WSi_x$, $NiSi_x$, $CoSi_x$, $PtSi_x$, $NiPt_xSi_y$, etc. With respect to the low resistance metallic layer to be laminated on the control gate electrode also, W may be replaced by $WSi_x$, $NiSi_x$, $MoSi_x$, $TiSi_x$, $CoSi_x$, $PtSi_x$, etc.

With respect to the manufacturing method of the memory cell shown in FIG. 39, the process explained in Reference Example (FIGS. 1-6) can be applied as it is. In the following, only the process which differs from that of Reference Example will be explained.

The process of embedding the fine particles or fine crystals of tetravalent cation element(s) such as Si, Hf, Zr, or Ti in the alumina of the charge trapping layer was performed by repeating the deposition of the alumina film and the deposition of tetravalent cation particles by making use of the successive CVD method while controlling the film thickness and the in-depth profile (concentration distribution) of the tetravalent cationic element. The alumina film was formed by making use of either source gases comprising trimethyl aluminum ($Al(CH_3)_3$), ammonia ($NH_3$) and oxygen ($O_2$) or source gases including trimethyl aluminum ($Al(CH_3)_3$) and water ($H_2O$).

Then, the deposition of the fine particles or fine crystal made of/containing of the tetravalent cation element(s) was performed by employing a source gases containing a desired cation selected from $SiH_4$, $SiH_2(C_2H_5)_2$, $Hf(OC(CH_3)_3)_4$, $Zr(OC(CH_3)_3)_4$ and $Ti(OC(CH_3)_3)_4$ and by adding the gases at a flow rate ratio or a partial pressure ratio of 0.1-15% to another kind of gases selected from nitrogen gas, Ar gas, a mixed gas nitrogen gas and Ar gas, a mixed gas nitrogen gas and hydrogen gas, a mixed gas of Ar gas and hydrogen gas, a mixed gas of nitrogen gas, hydrogen gas and hydrogen gas, a mixed gas of nitrogen gas and oxygen gas, a mixed gas of Ar gas and oxygen gas, and a mixed gas of nitrogen gas, hydrogen gas and oxygen gas.

In the case where oxygen is not added to the mixed gas, metallic fine particles of a tetravalent cationic element will be formed, and in the case where oxygen is added to the mixed gas, oxides of a tetravalent cationic element ($MO_x$: $x \leq 2$) will be formed. If a plasma-assisted process is employed in this step, not only oxides but also oxynitride of s tetravalent cationic element will be formed. A plurality of cycles, each cycle including a sequential deposition step of depositing an alumina film and depositing particles of a tetravalent cationic element and the following step of heat treatment, were repeated until a desired film thickness could be obtained. With respect to the control of the in-depth profile (concentration distribution) of the tetravalent cation, it was performed through adjusting the step of depositing the fine particles/crystals of the tetravalent cationic element(s) by omitting the step of deposition itself from these cycles, by controlling the depositing period of time, or by controlling the deposition gas conditions (ratio, partial pressure, temperature, etc), thereby realizing a desired profile. The step of converting the alumina film having the fine particles/crystals of the tetravalent cationic element(s) embedded therein into the alumina layer ($Al_2O_3(X)$) accompanied with defect pair ($O_i$-$1M_{Al}$: M=Si, Zr, Hf, Ti) formed of an interstitial oxygen ($O_i$) and an Al site-substituting cation ($M_{Al}$: M=tetravalent cation) is executed by the heat treatment to be performed following each depositing step of each cycle. Since the thickness of the charge trapping layer is as thin as 7 nm, the heat treatment may be executed at a time after finishing all of the deposition steps.

Figure 41:
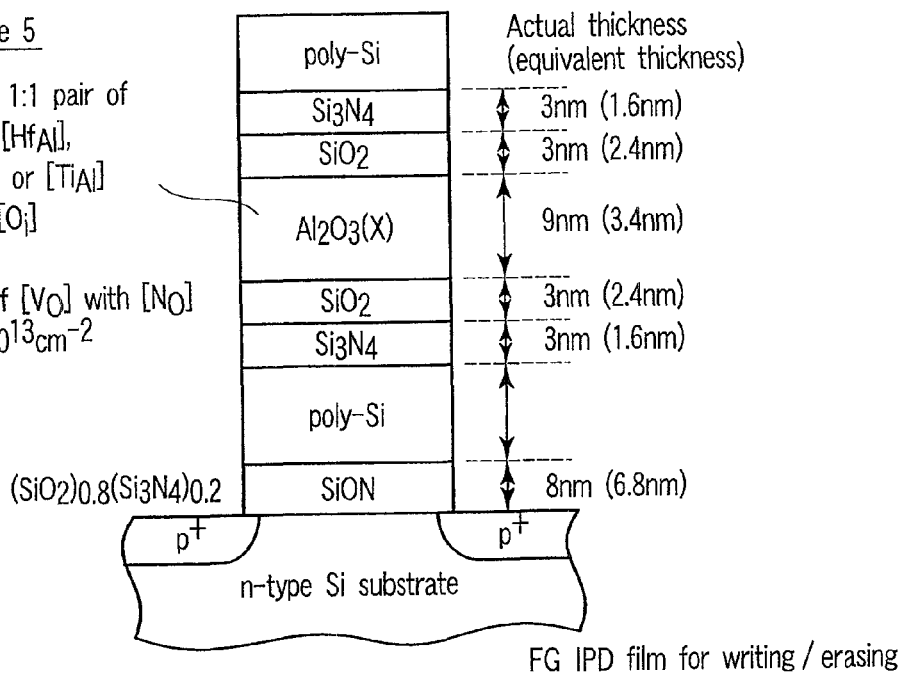
FIG. 41 shows a cross-sectional view illustrating the cell structure according to Example 5.

The manufacturing method shown herein is simply one example, so that the memory cell of FIG. 41 may be created by any other manufacturing method. For example, with respect to the source gases to be employed in the CVD method, it is possible to employ an amine-based gas such as $Zr[N(C_2H_5)_2]_4$, $Zr[N(CH_3)_2]_4$, $Zr[N(C_2H_5)CH_3]_4$, $Hf[N(C_2H_5)_2]_4$, $Hf[N(CH_3)_2]_4$, $Hf[N(C_2H_5)CH_3]_4$, etc. It is also possible to employ other kinds of source gases in place of the above-described gases. The sputtering method may be replaced by the CVD method.

Modification Example of Example 4

This modification example of Example 4 according to the present invention shows one example wherein reformed alumina is applied to the charge trapping layer of the MONOS type memory cell and corresponds to the aforementioned first aspect of the present invention.

Figure 40:
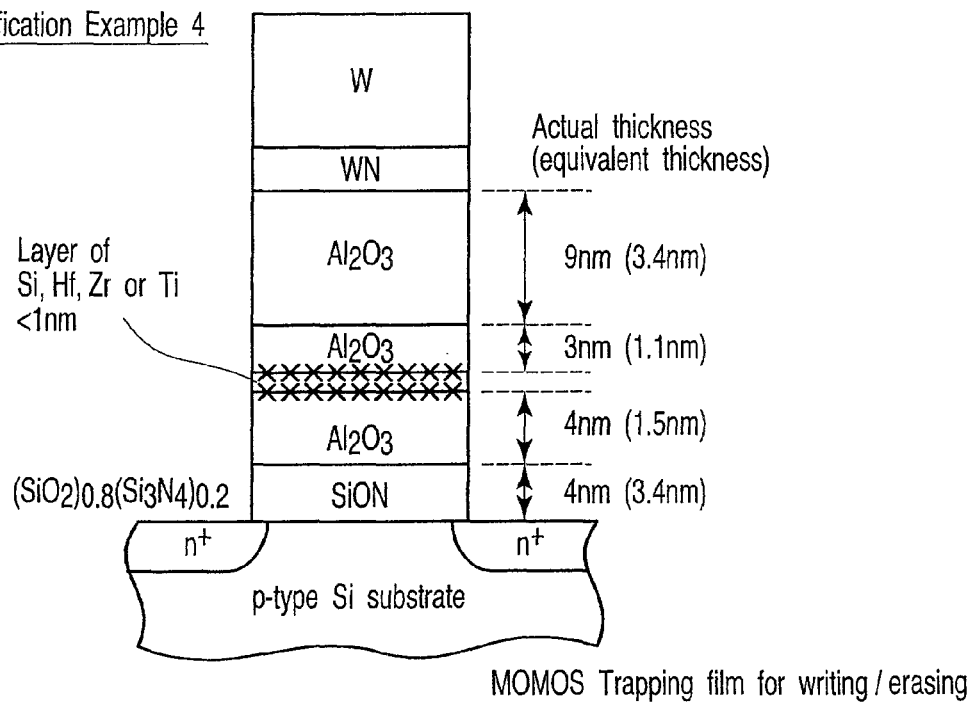
FIG. 40 shows a cross-sectional view illustrating a modification example of the cell structure of Example 4.

FIG. 40 illustrates a main portion of the cross-sectional structure of the memory cell according to the modification example of Example 4. This modification example of Example 4 differs from Example 4 in the respect of only the features of the charge trapping film. This charge trapping film has a 3-ply laminate structure including a lower alumina film, a metallic film of a tetravalent cationic element, and an upper alumina film. This 3-ply laminate structure may be considered to be an alumina layer accompanied with controlled defects ($Al_2O_3(X)$). The thickness of the upper film was set to about 4 nm, the thickness of the intermediate film was set to about 1 nm and the thickness of the lower film was set to about 3 nm. The advantages of depositing the metallic film of tetravalent cationic element reside in that the reaction for substituting the tetravalent cationic element for the Al site of alumina film, which is required in the first step in the formation of the defect pair ($O_i$-$1M_{Al}$: M=Si, Zr, Hf, Ti) formed of an interstitial oxygen ($O_i$) and an Al site-substituting cation ($M_{Al}$: M=tetravalent cation), takes place more easily when the tetravalent cationic element exists in a metallic state rather than in an oxide or oxynitride state. Since the thickness of the charge trapping layer is as thin as 7 nm, the heat treatment may be executed at a time after finishing all of the deposition steps.

With respect to the manufacturing method of the memory cell shown in FIG. 40, the process explained in Reference Example (FIGS. 1-6) and in Example 4 can be applied as it is. The step which differs from that of Example 4 is a step of depositing a metallic film of tetravalent cationic elements. This step is merely a modification of the step explained in Example 4. Namely, the deposition of the metallic film of tetravalent cation elements was performed by employing a source gases containing desired cations selected from $SiH_4$, $SiH_2(C_2H_5)_2$, $Hf(OC(CH_3)_3)_4$, $Zr(OC(CH_3)_3)_4$ and $Ti(OC(CH_3)_3)_4$ and by adding the gases at a flow rate ratio or a partial pressure ratio of 0.1-15% to another kind of gases selected from nitrogen gas, Ar gas, a mixed gas of nitrogen gas and Ar gas, a mixed gas of nitrogen gas and hydrogen gas, a mixed gas of Ar gas and hydrogen gas, and a mixed gas of nitrogen gas, hydrogen gas and hydrogen gas. Since oxygen gas is not employed herein, metallic fine particles/crystals of tetravalent cation element(s) are enabled to be formed, so that it is possible to deposit a metallic film of a tetravalent cation element(s) having a desired thickness by repeating only the deposition step of the particles/crystals of the tetravalent cation element(s) of the process of the modification example of Example 4.

The manufacturing method shown herein is simply one example, so that the memory cell of FIG. 40 may be created by any other manufacturing methods. With respect to the source gases to be employed in the CVD method, it is possible to employ other kinds of source gases. For example, the alumina film was formed by making use of either source gases comprising trimethyl aluminum ($Al(CH_3)_3$), ammonia ($NH_3$) and oxygen ($O_2$) or source gases including trimethyl aluminum ($Al(CH_3)_3$) and water ($H_2O$). The deposition of the tetravalent cation film may be executed by means of the CVD method wherein an amine-based gas such as $Zr[N(C_2H_5)_2]_4$, $Zr[N(CH_3)_2]_4$, $Zr[N(C_2H_5)CH_3]_4$, $Hf[N(C_2H_5)_2]_4$, $Hf[N(CH_3)_2]_4$, and $Hf[N(C_2H_5)CH_3]_4$; $Ti(DPM)_3$, etc. is employed as a source gases. With respect to the formation of the blocking insulating film and metal electrodes, the sputtering method may be replaced by the CVD method.

Example 5

FIG. 41 illustrates a main portion of the cross-sectional structure of the memory cell according to a fifth example of the present invention. This example is directed to one example wherein reformed alumina is applied to the blocking layer of an FG type memory cell and corresponds to the aforementioned second aspect of the present invention.

A silicon oxynitride film (SiON) is formed, as a tunnel insulating film, in a channel region of an n-type silicon substrate. Further, a polysilicon floating gate electrode is formed as a charge trapping layer on the tunnel insulating film. On this floating gate electrode, a silicon nitride film ($Si_3N_4$) and a silicon oxide film ($SiO_2$) are successively formed. On this resultant structure, an alumina film ($Al_2O_3$) is further deposited as a charge trapping layer. On this alumina film, a silicon oxide film ($SiO_2$) and a silicon nitride film ($Si_3N_4$) are successively formed. Then, polysilicon is deposited as a control gate electrode. Further, a conductive film of a low resistant metal is deposited on the resultant structure.

Herein, for the purpose of giving the highest priority to the suppression of stress-induced leakage current (SILC), the thickness of the tunnel insulating film (SiON) was set to about 8 nm, especially when the composition of the tunnel insulating film was constituted by $(SiO_2)_{0.8}$-$(Si_3N_4)_{0.2}$. This film thickness may be reduced to about 4 nm depending on the improvement in quality of the tunnel insulating film. Further, the so-called inter-poly insulating film, which is sandwiched between the polysilicon floating gate electrode and upper control electrode, is formed of a 5-ply structure, wherein $Si_3N_4$ film functioning as a low band gap layer was set to about 3 nm in film thickness, and $SiO_2$ film functioning as a high band gap layer was set to about 3 nm in film thickness. The thickness of $Al_2O_3$ film functioning as the charge trapping layer which was interposed therebetween was set to about 9 nm. By making use of either a 1:1 complex of an interstitial oxygen and an Al site-substituting tetravalent cation (i.e. a defect pair ($O_i$-$1M_{Al}$; M=Si, Zr, Hf, Ti)), or a 1:1-2 complex of an oxygen vacancy ($V_O$) and oxygen site-substituting nitrogen(s) ($N_O$) (i.e. a defect pair ($V_O$-$nN_O$: n=1, 2)), electron trap levels (electron unoccupied levels) were created at nearly a middle of the band gap of alumina at about $3 \times 10^{13}$ cm$^{-2}$ in area density of defects. Due to this defect-controlled alumina (Al$_2$O$_3$(X)) layer having the defects created therein, it is made possible to perform, with a high efficiency, the writing operation through the electron trapping as well as the erasing operation through the hole injection. Further, since it is also possible to erase the half-occupied (not-doubly-occupied) electron of charge trap levels in a charge neutral condition by simply applying an excessive erasing operation, it is also possible to realize "over-erasing" which provides a sufficiently large negative threshold voltage under the erasing condition.

The alumina film to be used as the charge trapping layer can be formed by means of successive CVD or ALD (Atomic Layer Deposition) wherein trimethyl aluminum (Al(CH$_3$)$_3$), ammonia (NH$_3$) and oxygen (O$_2$) are employed or trimethyl aluminum (Al(CH$_3$)$_3$) and water (H$_2$O) are employed as source gases. With respect to the process of introducing defects into this alumina film, two examples thereof will be described as follows.

First of all, with respect to the complex of an interstitial oxygen (O$_i$) and an Al site-substituting tetravalent cation (M$_{Al}$) (i.e. a defect pair (O$_i$-1M$_{Al}$; M=Si, Zr, Hf, Ti)), it was created by making use of a source gases containing desired tetravalent cation(s) selected from SiH$_4$, SiH$_2$(C$_2$H$_5$)$_2$, Hf(O-C(CH$_3$)$_3$)$_4$, Zr(OC(CH$_3$)$_3$)$_4$ and Ti(OC(CH$_3$)$_3$)$_4$ and by adding the gases at a flow rate ratio or a partial pressure ratio of 0.1-15% in the step of CVD of alumina. In order to promote the generation of the interstitial oxygen (O$_i$), it would be effective to incorporate ozone (O$_3$) in the gas. Since it would become more difficult to introduce the interstitial oxygen atoms into the alumina film as the density of alumina becomes higher, i.e. the number of defects becomes smaller, it would be desirable to additionally employ successive oxidation by means of the plasma oxidation method. However, in the case where a Hf-based oxide or a Zr-based oxide (including silicate and aluminate) is laminated in contact with the upper surface of alumina film, interstitial oxygen can be easily introduced into the alumina film since the oxygen molecule is enabled to catalytically dissociate, generating atomic oxygen in these oxides, silicates or aluminates. Incidentally, including the case of forming a film by a method other than CVD, after the formation of the alumina film to a partial or full thickness, a very thin film of the aforementioned tetravalent cationic metals, oxides or oxynitride may be deposited by means of sputtering or these materials may be introduced into the alumina film by means of ion implantation.

With respect to the complex of an oxygen vacancy (V$_O$) and oxygen site-substituting nitrogen(s) (N$_O$), i.e. a defect pair (V$_O$-nN$_O$; (n=1, 2)), nitrogen can be introduced in the same manner as using ammonia gas in the aforementioned step of CVD. Including the cases where ammonia is not employed or where the formation of a film is performed by a method other than CVD, after the formation of the alumina film to a partial or full thickness, nitrogen may be introduced into the alumina film by means of plasma nitridation using a plasma of such gases as N$_2$, NH$_3$, NO, N$_2$O, etc. From the viewpoint of a depth profile of nitrogen, if it is desired to introduce nitrogen into a region of the alumina film which is close to the substrate, the plasma treatment should be performed after the thin alumina film has been partially deposited.

With respect to the manufacturing method of the memory cell shown in FIG. 41, the process explained in Example 3 and Modification example of Example 3 can be applied as it is as far as the portion related to the defect control of alumina film is concerned. In the following, only the process which differs from that of Example 3 will be explained, though it may be irrelevant to the gist of the present invention.

With respect to the laminate film formed on the floating gate electrode and formed of the silicon nitride film (Si$_3$N$_4$) and the silicon oxide film (SiO$_2$), at first, Si$_3$N$_4$ is created by means of the ALD method using dichlorosilane (SiH$_2$Cl$_2$) and ammonia (NH$_3$). Then, SiO$_2$ is sequentially formed by means of ALD using SiH$_2$Cl$_2$ and ozone (O$_3$). On this laminate film is deposited, as a charge trapping layer, a defect-controlled alumina film (Al$_2$O$_3$). On this alumina film are successively deposited SiO$_2$ and Si$_3$N$_4$ by means of the same deposition method.

Although a silicon oxynitride film was employed as a tunnel insulating film in this example, it is possible to employ a laminate film formed of a silicon oxide film/a silicon nitride film/a silicon oxide film (ONO film). It is also possible to employ a tunnel insulating film having fine silicon crystals introduced into the tunnel oxide film.

It should be appreciated that the manufacturing method shown herein illustrates only one example, so that the memory cell of FIG. 43 may be formed by any other manufacturing method. For example, the CVD method and the sputtering method may be interchanged as desired. Further, each of the aforementioned layers may be formed by means of a vapor deposition method, a laser ablation method, an MBE method, or a combination of these methods other than the aforementioned CVD method and sputtering method.

Further, the alumina film employed as a blocking insulating film may be replaced by various materials, including aluminum oxynitride (AlON), hafnia (HfO$_2$), hafnium aluminate (HfAlO$_x$), hafnium nitride aluminate (HfAlON), hafnium silicate (HfSiO$_x$), hafnium nitride silicate (HfSiON), lanthanum nitride aluminate (LaAlON), lanthanum-doped hafnium silicate (La-doped HfSiO$_x$), hafnium lanthanum oxide (HfLaO$_x$), etc.

With respect to the low resistance metallic layer to be laminated on the control gate electrode also, W may be replaced by WSi$_x$, NiSi$_x$, MoSi$_x$, TiSi$_x$, CoSi$_x$, PtSi$_x$, etc.

Example 6

A sixth example of the present invention is directed to one example wherein reformed alumina is applied to the charge trapping layer of a MONOS type memory cell and corresponds to the aforementioned sixth aspect of the present invention.

Figure 42:
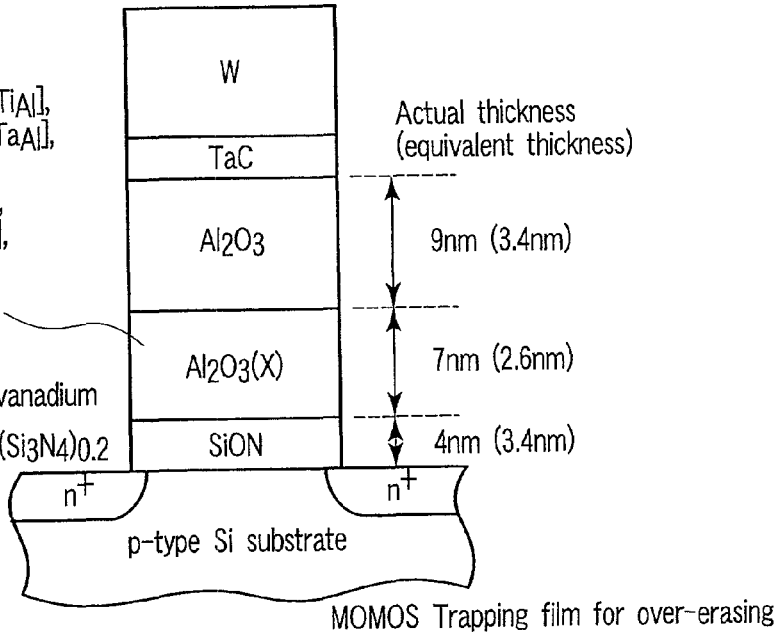
FIG. 42 shows a cross-sectional view illustrating the cell structure according to Example 6.

FIG. 42 illustrates a main portion of the cross-sectional structure of the memory cell according to this example.

A silicon oxynitride film (SiON) is formed, as a tunnel insulating film, in a channel region of a p-type silicon substrate. Further, an alumina film (Al$_2$O$_3$) is deposited on the tunnel insulating film. Then, an alumina film (Al$_2$O$_3$) is deposited thereon as a blocking insulating layer. On this alumina film is deposited tantalum carbide as a control gate electrode. Further, tungsten is deposited, as a conductive film of low resistant metal, on the resultant structure.

Herein, for the purpose of securing not only the writing/erasing characteristics but also the data retention characteristics, the thickness of the tunnel insulating film (SiON) was set to about 4 nm, especially when the composition of the tunnel insulating film was (SiO$_2$)$_{0.8}$·(Si$_3$N$_4$)$_{0.2}$. On the other hand, the thickness of the charge trapping layer (Al$_2$O$_3$) was set to about 7 nm. The thickness of the blocking insulating film (Al$_2$O$_3$) was set to about 9 nm. In the case of applying alumina (Al$_2$O$_3$) to the trapping layer of the MONOS type memory cell, electron occupied levels were created in the band gap of alumina of the charge trapping layer at about $3 \times 10^{13}$ cm$^{-2}$ in area density of defects by making use of an Al site-substituting tetravalent or pentavalent cation ($M_{Al}$: M=Si, Zr, Hf, Ti, V, Nb, Ta), interstitial trivalent, tetravalent or pentavalent cation ($M_i$: M=Al, Si, Zr, Hf, Ti, V, Nb, Ta) or oxygen vacancy ($V_O$). Since this defect-controlled alumina (Al$_2$O$_3$(X)) layer having the defects created therein is enabled to have electron occupied levels in a charge neutral condition in the band gap, it is made possible to draw out the electrons toward the substrate through the first insulating film (tunnel insulating film) under the erasing condition, thereby realizing the "over-erasing" which provides a sufficiently large negative threshold voltage at the time of erasing.

The alumina film to be used as the charge trapping layer can be formed by means of successive CVD or ALD (Atomic Layer Deposition) wherein trimethyl aluminum (Al(CH$_3$)$_3$), ammonia (NH$_3$) and oxygen (O$_2$) are employed or trimethyl aluminum (Al(CH$_3$)$_3$) and water (H$_2$O) are employed as source gases. With respect to the process of introducing defects into this alumina film, two examples thereof will be described as follows.

First of all, with respect to the oxygen vacancy ($V_O$), the conditions for oxidation/reduction are adjusted in the formation of the alumina film. Specifically, the partial pressure ratio or the flow rate ratio between oxygen (O$_2$) and ammonia (NH$_3$) or the partial pressure ratio or the flow rate ratio between H$_2$O and H$_2$ is adjusted, thereby making it possible, in terms of the conditions for oxidation/reduction, to set a H$_2$/H$_2$O ratio as a function of process temperature. Typically, when oxygen and ammonia are employed, the content of oxygen is set to 5-40% in the aforementioned ratio. When H$_2$O and inert carrier gas are employed, the content of H$_2$ is preferably set to 1-20% in the aforementioned ratio. With respect to the Al site-substituting tetravalent or pentavalent cation ($M_{Al}$: M=Si, Zr, Hf, Ti, V, Nb, Ta) and the interstitial trivalent, tetravalent or pentavalent cation ($M_i$: M=Al, Si, Zr, Hf, Ti, V, Nb, Ta), they are concurrently introduced into the alumina in practice. As the source gases to be employed in the step of CVD of alumina, it may be selected from materials suited for the vapor pressure, specific examples thereof including at least one material of tetravalent cations such as SiH$_4$, SiH$_2$(C$_2$H$_5$)$_2$, Hf(OC(CH$_3$)$_3$)$_4$, Zr(OC(CH$_3$)$_3$)$_4$, Ti(OC(CH$_3$)$_3$)$_4$ and Ti(DPM)$_3$ and at least one material of pentavalent cations such as the HFA complex, FOD complex, PPM complex, DPM complex, AcAc complex and β-diketone complex of V, Nb and Ta. With respect to the Nb complex, it is possible to employ, for the purpose of improving the sublimating property and stability of source gas, Nb(DPM)$_2$(DPM)(Add)$_2$ (Add=DPM, THF, Phen) which is consisted of dipyvaloylmethane (DPM) complex, Nb(DPM)$_4$ and an adduct selected from DPM, tetrahydrofuran (THF) and phenanthroline (Phen). Gases containing desired cation(s) selected from the above-described materials are fed at a flow rate ratio or a partial pressure ratio of 0.1-15% in relation to trimethyl aluminum gas. In this case, the generation of interstitial oxygen (O$_i$) is required to suppress in contrast to the third embodiment. This is because an oxygen vacancy may be caused to be compensated (buried) by the interstitial oxygen. Therefore, the addition of an oxidizing agent with high oxidizing potential, such as ozone (O$_3$) or N$_2$O, is not preferable. Since it may become more difficult to introduce interstitial oxygen into alumina as the density of alumina becomes higher (i.e. the quantity of defect becomes smaller), the deposition temperature of the alumina film is preferably higher, as long as a continuous film can be formed. More specifically, the substrate temperature is preferably confined to 600° C.-800° C. In the case where Hf or Zr is employed as a tetravalent cation, if Hf-based oxide or Zr-based oxide (including silicate and aluminate) is caused to generate, oxygen atoms are enabled to catalytically dissociate from these oxides, silicates or aluminates generating atomic oxygen, thereby promoting the compensation of the oxygen vacancy. In order to prevent such a phenomenon, it is imperative to adjust the conditions of oxidation/reduction. Therefore, FIG. 11 shows the temperature range as a Gibbs free energy of formation of typical oxide in this invention. Incidentally, including the case where the formation of film is performed by a method other than the CVD method, the aforementioned Al, tetravalent cation or pentavalent cation may be introduced by means of ion implantation after the alumina film has been partially or completely deposited in terms of film thickness.

Further, the alumina film employed as the charge trapping layer may be replaced by a film of a laminate structure including an alumina film and a film of other materials which are capable of promoting the generation of interstitial oxygen atoms as described above. For example, it is possible to employ various materials, such as lanthanum aluminate (LaAlO$_x$), hafnium oxide (HfO$_2$), hafnium aluminate (HfAlO$_x$), hafnium nitride aluminate (HfAlON), aluminium oxynitride (AlON), hafnium silicate (HfSiO$_x$), hafnium nitride silicate (HfSiON), lanthanum-doped hafnium silicate (La-doped HfSiO$_x$), hafnium lanthanum oxide (HfLaO$_x$), and zirconium-based materials, which can be derived by substituting Zr for Hf in the above-described hafnium-based materials, etc. With respect to the source gases to be employed in the CVD method, it is possible to employ amine-based gas such as Zr[N(C$_2$H$_5$)$_2$]$_4$, Zr[N(CH$_3$)$_2$]$_4$, Zr[N(C$_2$H$_5$)CH$_3$]$_4$, Hf[N(C$_2$H$_5$)$_2$]$_4$, Hf[N(CH$_3$)$_2$]$_4$, Hf[N(C$_2$H$_5$)CH$_3$]$_4$, etc. It is also possible to employ other kinds of source gases, such as Ti(DPM)$_3$, etc. in place of the above-described gases.

With respect to the metallic material for the control gate electrode, it may be selected by taking account of the work function and the reactivity thereof with the blocking insulating film. Therefore, TaNx may be replaced by various kinds of metallic materials, such as TaN$_x$, WN$_x$, TiN$_x$, HfN$_x$, TaSi$_x$N$_y$, TaC$_x$, WC$_x$, TaSi$_x$C$_y$N$_z$, Ru, W, WSi$_x$, NiSi$_x$, CoSi$_x$, PtSi$_x$, NiPt$_x$Si$_y$, etc. With respect to the low resistance metallic layer to be laminated on the control gate electrode also, W may be replaced by WSi$_x$, NiSi$_x$, MoSi$_x$, TiSi$_x$, CoSi$_x$, PtSi$_x$, etc.

The examples explained above can be applied to a non-volatile semiconductor memory device provided with a memory cell where the charge trapping layer thereof is created from an insulating film, especially to a flash memory having a NAND type element structure.

Further, the above-described examples can be applied to a NOR type, an AND type or a DINOR type non-volatile semiconductor memory device, to a NANO type flash memory combined advantages of both NOR type and NAND type devices, and also to a 3 Tr-NAND type device wherein one memory cell is sandwiched by a pair of selecting transistors.

The present invention is not limited to the aforementioned examples, and each of constituent components may be modified without departing from the gist of the present invention. For example, the charge trapping layer and the blocking layer may be respectively constituted by a plurality of layers. Further, these layers may be continuously changed in composition around the boundary interfaces thereof. Further, the stack gate structure of the present invention is not necessarily created on a Si substrate. For example, the stack gate structure of the present invention may be created in a well formed in the Si substrate.

The stack gate structure of the present invention may be created on a SiGe substrate, a Ge substrate, a SiGeC substrate, a well formed in any of these substrates other than the Si substrate. Alternatively, the stack gate structure of the present invention may be created on an SOI (Silicon On Insulator) substrate where a thin-film semiconductor is formed on an insulating film, an SGOI (Silicon-Germanium On Insulator) substrate, a GOI (Germanium On Insulator) substrate or a well formed in any of these substrates.

Further, a plurality of constituent elements disclosed in the above-described embodiments may be optionally combined to create various inventions. For example, some of constituent elements may be omitted from the entire constituent elements disclosed in these embodiments. Furthermore, the constituent elements described in different embodiments may be optionally combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MONOS non-volatile semiconductor memory device, comprising:
   source/drain regions formed in a semiconductor substrate;
   a first gate insulating layer formed on a channel region located between the source/drain regions;
   a first charge trapping layer formed on the first gate insulating layer;
   a second gate insulating layer formed on the first charge trapping layer, having a larger film thickness than that of the first gate insulating layer, and comprising an insulating film comprising Al and O as major elements, wherein the insulating film comprises, in a region of the second gate insulating layer which is located near the first charge trapping layer, an Al vacancy, an interstitial O atom, an N atom substituting for O atom, or a divalent cationic atom substituting for Al atom, and the insulating film has electron unoccupied levels within a range of 2 eV from the valence band maximum of $Al_2O_3$; and
   a controlling electrode formed on the second gate insulating layer.

2. The memory device of claim 1, wherein the electron unoccupied levels have an area density of less than $8 \times 10^{13}/cm^2$ and more than $8 \times 10^{11}/cm^2$.

3. The memory device of claim 1, wherein the divalent cationic atom is comprised in the insulating film to form a uniform solid solution.

4. The memory device of claim 1, wherein the divalent cationic atom is present and is an atom selected from the group consisting of Mg, Ca, Sr, and Ba.

5. The memory device of claim 1, wherein the divalent cationic atom is present and is Mg.

6. The memory device of claim 1, wherein the divalent cationic atom is present and is Ca.

7. The memory device of claim 1, wherein the divalent cationic atom is present and is Sr.

8. The memory device of claim 1, wherein the divalent cationic atom is present and is Ba.

9. The memory device of claim 1, wherein the divalent cationic atom is dispersed in the insulating film as an oxide or oxynitride.

10. The memory device of claim 1, wherein the divalent cationic atom is dispersed in the insulating film as an oxynitride.

11. The memory device of claim 1, wherein the divalent cationic atom is dispersed in the insulating film as an oxide.

12. The memory device of claim 1, wherein the insulating film comprises, in a region of the second gate insulating layer which is located near the first charge trapping layer, an Al vacancy.

13. The memory device of claim 1, wherein the insulating film comprises, in a region of the second gate insulating layer which is located near the first charge trapping layer, an interstitial O atom.

14. The memory device of claim 1, wherein the insulating film comprises, in a region of the second gate insulating layer which is located near the first charge trapping layer, an N atom substituting for O atom.

15. The memory device of claim 1, wherein the insulating film comprises, in a region of the second gate insulating layer which is located near the first charge trapping layer, a divalent cationic atom substituting for Al atom.

16. A MONOS non-volatile semiconductor memory device, comprising:
   source/drain regions formed in a semiconductor layer;
   a first gate insulating layer formed on a channel region located between the source/drain regions;
   a first charge trapping layer formed on the first gate insulating layer;
   a second gate insulating layer formed on the first charge trapping layer, having a larger film thickness than that of the first gate insulating layer, and comprising an insulating film comprising Al and O as major elements, wherein the insulating film comprises, in a region of the second gate insulating layer which is located near the first charge trapping layer, an Al vacancy, an interstitial O atom, an N atom substituting for an O atom, or a divalent cationic atom substituting for Al atom, and the insulating film has electron unoccupied levels within a range of 2 eV from the valence band maximum of $Al_2O_3$; and
   a controlling electrode formed on the second gate insulating layer.

* * * * *